(12) United States Patent
Cha et al.

(10) Patent No.: US 11,659,745 B2
(45) Date of Patent: May 23, 2023

(54) DISPLAY DEVICE

(71) Applicant: Samsung Display Co., LTD., Yongin-si (KR)

(72) Inventors: Myoung Geun Cha, Seoul (KR); Sang Gun Choi, Suwon-si (KR); Hye Na Kwak, Hwaseong-si (KR); Yun Jung Oh, Anyang-si (KR); Ki Seok Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/683,848

(22) Filed: Mar. 1, 2022

(65) Prior Publication Data

US 2023/0022035 A1 Jan. 26, 2023

(30) Foreign Application Priority Data

Jul. 20, 2021 (KR) .................. 10-2021-0094813

(51) Int. Cl.
*G06F 3/044* (2006.01)
*H01L 27/12* (2006.01)
*H01L 27/32* (2006.01)
*H01L 29/786* (2006.01)

(52) U.S. Cl.
CPC ........ *H01L 27/3276* (2013.01); *G06F 3/0445* (2019.05); *H01L 27/323* (2013.01); *H01L 27/3262* (2013.01); *H01L 27/3265* (2013.01); *H01L 27/3272* (2013.01); *H01L 27/124* (2013.01); *H01L 27/1222* (2013.01); *H01L 27/1255* (2013.01); *H01L 29/78633* (2013.01); *H01L 29/78675* (2013.01)

(58) Field of Classification Search
CPC ............. G02F 1/13452; G02F 1/13458; H01L 27/323; G06F 3/0445
See application file for complete search history.

(56) References Cited

U.S. PATENT DOCUMENTS

| 9,472,507 | B2 | 10/2016 | Kwak | |
|---|---|---|---|---|
| 2011/0133308 | A1* | 6/2011 | Chan | H01L 27/0207 257/E29.325 |
| 2018/0151120 | A1* | 5/2018 | Kim | G09G 3/3258 |
| 2020/0196452 | A1* | 6/2020 | Lee | G06F 3/04164 |
| 2021/0050495 | A1* | 2/2021 | Yang | H01L 33/62 |

FOREIGN PATENT DOCUMENTS

| KR | 10-0701896 B1 | 3/2007 |
|---|---|---|
| KR | 2017-0133582 A | 12/2017 |
| KR | 2020-0076148 A | 6/2020 |

* cited by examiner

*Primary Examiner* — Kevin M Nguyen
(74) *Attorney, Agent, or Firm* — Lewis Roca Rothgerber Christie LLP

(57) ABSTRACT

A display device including: a substrate including a main area and a sub-area at a side of the main area; a thin-film transistor on the substrate and positioned in the main area; a first insulating layer on a gate electrode of the thin-film transistor; a light-emitting element on the first insulating layer, positioned in the main area, and electrically connected to the thin-film transistor; a plurality of pads on the first insulating layer and positioned in the sub-area; and a light-blocking layer overlapping the plurality of pads and located between the substrate and the first insulating layer.

20 Claims, 39 Drawing Sheets

TSL: TBF, TCL_1, TIL, TCL_2, TGL

SUB: SUB_1, BR_1, SUB_2, BR_2
BF: BF_1, BF_2
ILD1: ILD1_a, ILD1_b

PAD: PAD_1, PAD_2, PAD_3

PAD: PAD_1, PAD_2, PAD_3

SUB: CPI_1, BR_1, CPI_2, BR_2
BF: BF_1, BF_2
ILD1: ILD1_a, ILD1_b
ILD2: ILD2_a, ILD2_b

PAD: PAD_1, PAD_2, PAD_3

PAD: PAD_1, PAD_2, PAD_3

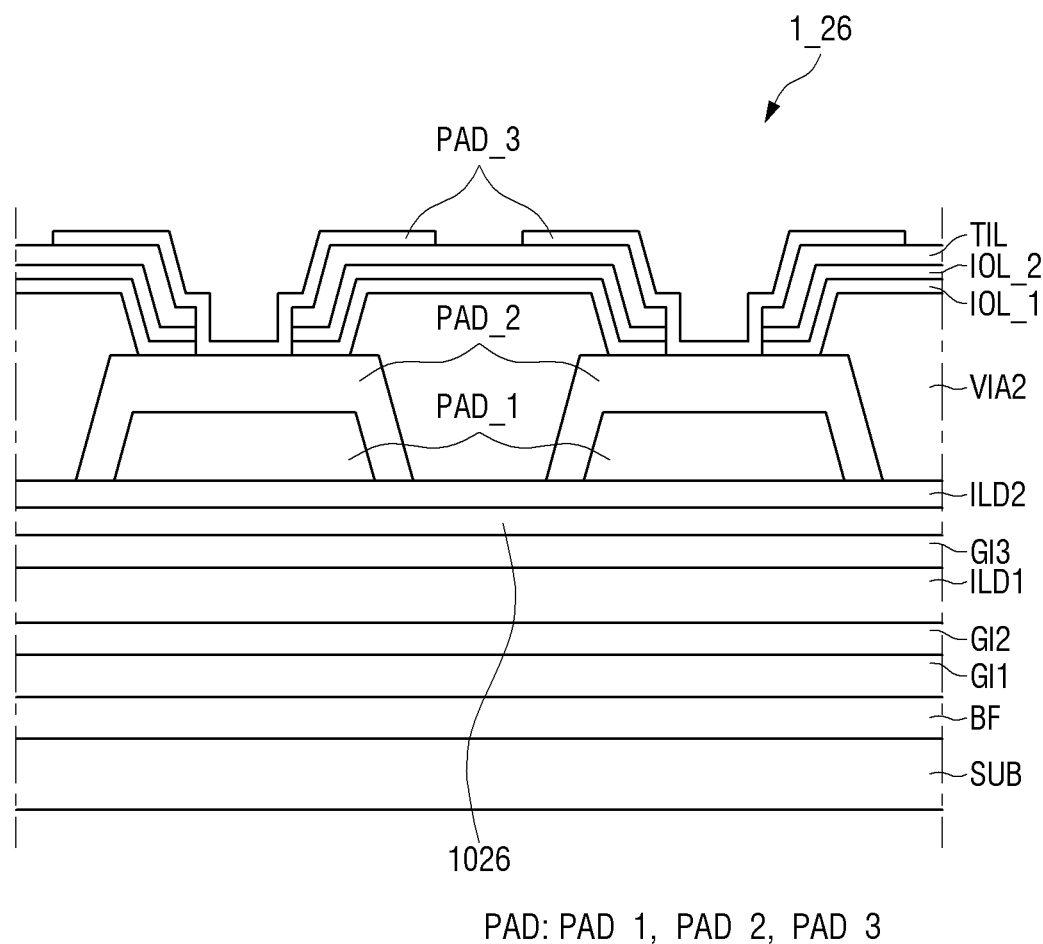
FIG. 38
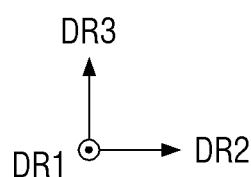

DISPLAY DEVICE

CROSS-REFERENCE TO RELATED APPLICATION

This application claims priority to and the benefit of Korean Patent Application No. 10-2021-0094813 filed on Jul. 20, 2021 in the Korean Intellectual Property Office (KIPO), the entire content of which is incorporated by reference herein.

BACKGROUND

1. Field

The present disclosure relates to a display device.

2. Description of Related Art

Importance of a display device is increasing under development of multimedia. In response to this increase, various types of the display devices such as an organic light-emitting display device (OLED), and a liquid crystal display device (LCD) are being used.

Recently, under development of the display technology, research and development on an approach in which a substrate of a display panel is made of colorless polyimide is being actively conducted.

SUMMARY

Aspects of one or more embodiments of the present disclosure are directed toward a display device in which damage that may occur during a pad cutting process when a substrate of a display panel is made of colorless polyimide is prevented or reduced.

Aspects according to one or more embodiments of the present disclosure are not limited to the above-mentioned aspects. Other aspects and effects according to the present disclosure that are not mentioned may be understood based on following descriptions, and may be more clearly understood based on embodiments according to the present disclosure. Further, it will be easily understood that the purposes and advantages according to the disclosure may be realized using means shown in the claims and combinations thereof.

According to an embodiment of the disclosure, a display device includes, a substrate including a main area and a sub-area at a side of the main area; a thin-film transistor on the substrate and positioned in the main area; a first insulating layer on a gate electrode of the thin-film transistor; a light-emitting element on the first insulating layer, positioned in the main area, and electrically connected to the thin-film transistor; a plurality of pads on the first insulating layer and positioned in the sub-area; and a light-blocking layer overlapping the plurality of pads and located between the substrate and the first insulating layer.

A display device further includes a buffer layer between the substrate and the first insulating layer. The thin-film transistor includes a first semiconductor layer overlapping the gate electrode and located between the substrate and the gate electrode. The first semiconductor layer and the light-blocking layer are between the buffer layer and the first insulating layer. The first semiconductor layer is directly on a face of the buffer layer in the main area. The light-blocking layer is directly on the face of the buffer layer in the sub-area.

Each of the first semiconductor layer and the light-blocking layer is made of polysilicon.

A display device further includes a first gate insulating layer between the substrate and the first insulating layer. A first semiconductor layer of the thin-film transistor is between the substrate and the first gate insulating layer in the main area. The gate electrode of the thin-film transistor is directly on a face of the first gate insulating layer in the main area. The light-blocking layer is directly on the face of the first gate insulating layer in the sub-area.

The gate electrode and the light-blocking layer are made of a same material.

A display device further includes a first gate insulating layer between the substrate and the first insulating layer; a second gate insulating layer between the first gate insulating layer and the first insulating layer; and a capacitor electrode between the second gate insulating layer and the first insulating layer. A first semiconductor layer of the thin-film transistor is between the substrate and the first gate insulating layer in the main area, the gate electrode of the thin-film transistor is between the first gate insulating layer and the second gate insulating layer in the main area, and the capacitor electrode is directly on a face of the second gate insulating layer in the main area. The light-blocking layer is directly on the face of the second gate insulating layer in the sub-area.

The capacitor electrode and the light-blocking layer are made of a same material.

Each of the plurality of pads includes: a first pad layer directly on a face of the first insulating layer; and a second pad layer on the first pad layer, the second pad layer being electrically connected to the first pad layer.

A display device further includes a touch layer on the light-emitting element in the main area. Each of the plurality of pads further includes a third pad layer on the second pad layer in the sub-area. The touch layer includes a first touch conductive layer, a touch insulating layer on the first touch conductive layer, and a second touch conductive layer on the touch insulating layer. The third pad layer is electrically connected to the second pad layer. The second touch conductive layer and the third pad layer are made of a same material.

According to an embodiment of the disclosure, a display device includes: a substrate including a main area and a sub-area at a side in a first direction of the main area; a pad on the substrate, positioned at an end in the first direction of the sub-area, and having a first width in the first direction and a second width in a second direction intersecting the first direction in a plan view; and a light-blocking layer overlapping the pad and located between the substrate and the pad. The first width of the pad is greater than the second width of the pad.

At least a portion of an edge of the pad is aligned with a portion of an edge of the light-blocking layer.

The pad entirely overlaps the light-blocking layer in a plan view.

The light-blocking layer has a first width and a second width in a plan view.

The pad includes a first portion overlapping the light-blocking layer and a second portion not overlapping the light-blocking layer in a plan view. The first portion of the pad is between the second portion of the pad and an edge of the substrate, the first portion extending along the first direction.

The light-blocking layer has a third width in the first direction in a plan view. The third width is smaller than the first width of the pad.

The pad includes a plurality of pads, the plurality of pads being spaced from each other along the second direction. The light-blocking layer overlaps the plurality of pads (e.g., an entirety of all of the plurality of pads) and a portion (e.g., a portion of the display device) between adjacent ones of the plurality of pads.

The light-blocking layer extends along the second direction.

The pad includes at least two pads spaced from each other along the second direction. The light-blocking layer includes at least two light-blocking layers spaced from each other along the second direction. Each of the pads entirely overlaps a corresponding one of the light-blocking layers.

The light-blocking layer has a third width in the first direction and a fourth width in the second direction in a plan view. The third width is greater than the first width of the pad. The fourth width is greater than the second width of the pad.

A display device further includes a semiconductor layer on the substrate and in the main area; a first gate conductive layer on the semiconductor layer; and a second gate conductive layer on the first gate conductive layer. A material of the light-blocking layer is same as a material of one of the semiconductor layer, the first gate conductive layer, and the second gate conductive layer.

In the display device according to an embodiment of the disclosure, damage that may occur during the pad cutting process may be prevented or reduced.

Effects of the disclosure are not limited to the above-mentioned effects, and other effects as not mentioned will be clearly understood by those skilled in the art from following descriptions.

BRIEF DESCRIPTION OF DRAWINGS

The above and other aspects and features of the disclosure will become more apparent by describing in more detail embodiments thereof with reference to the attached drawings, in which:

FIG. 38 is a structure diagram showing a structure in a sub-area of a display device according to still yet another embodiment.

DETAILED DESCRIPTION

Figure 1:
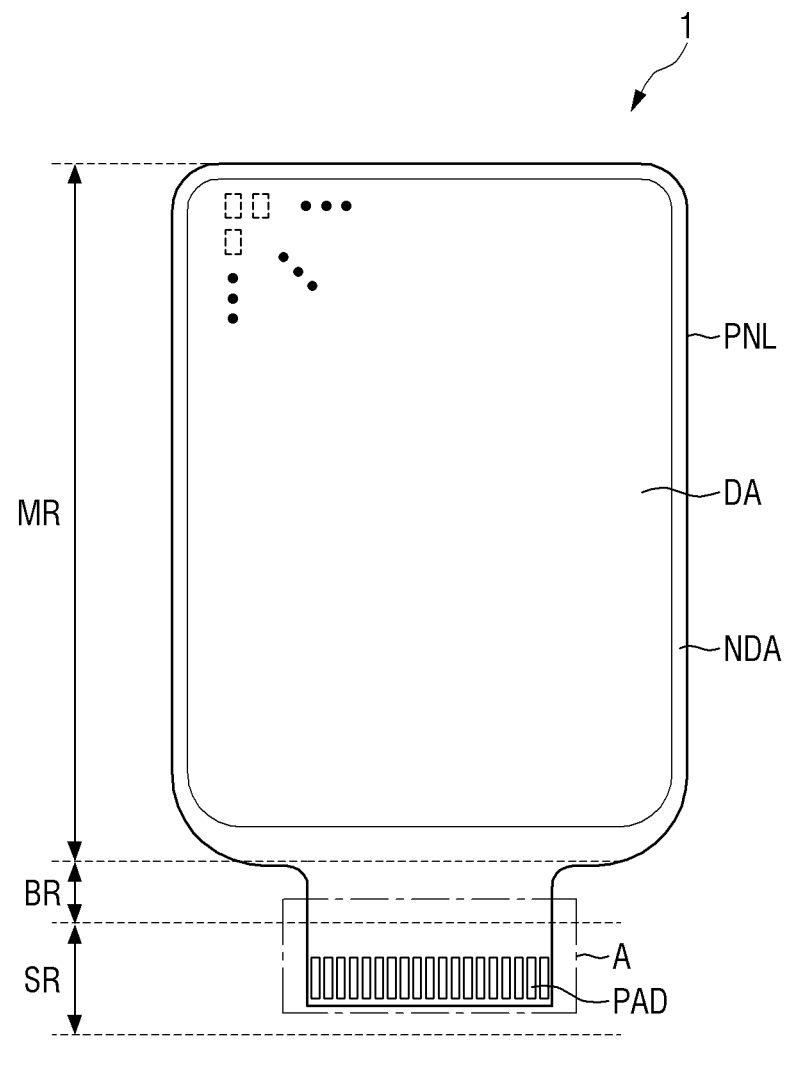
FIG. 1 is a plan view showing a display device according to an embodiment.

The present disclosure will now be described more fully hereinafter with reference to the accompanying drawings, in which embodiments of the present disclosure are shown. This disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

The terminology used herein is for the purpose of describing particular embodiments only and is not intended to limit the embodiments described herein.

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, expressions such as "at least one of," "one of," and "selected from," when preceding a list of elements, modify the entire list of elements and do not modify the individual elements of the list.

As used herein, the term "and/or" includes any and all combinations of one or more of the associated listed items.

Further, the use of "may" when describing embodiments of the present disclosure refers to "one or more embodiments of the present disclosure."

In the drawings, the relative sizes of elements, layers, and regions may be exaggerated and/or simplified for clarity. Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

It will be understood that when an element is referred to as being "on" or "connected to" another element, it may be directly on or connected to the other element or one or more intervening elements may also be present. When an element is referred to as being "directly on" or "directly connected to" another element, there are no intervening elements present.

Like reference numerals in the drawings denote like elements throughout, and duplicative descriptions thereof may not be provided.

In the drawings, the relative sizes of elements, layers, and regions may be exaggerated and/or simplified for clarity. Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element Hereinafter, specific embodiments will be described with reference to the accompanying drawings.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
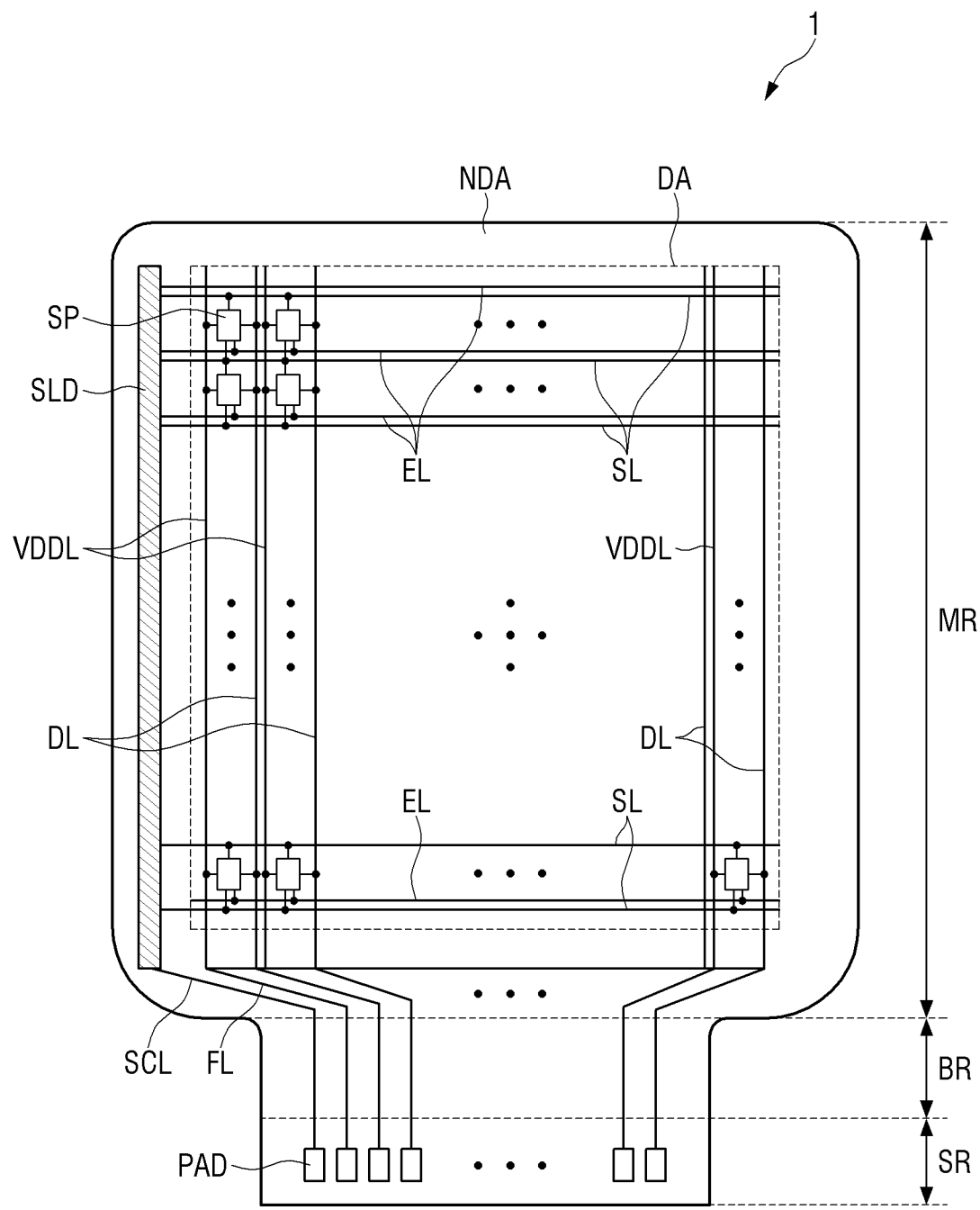
FIG. 2 is a plan view schematically showing a circuit structure of the display device according to an embodiment of FIG. 1.

FIG. 1 is a plan view showing a display device according to an embodiment. FIG. 2 is a plan view schematically showing a circuit structure of the display device according to the embodiment of FIG. 1.

Referring to FIG. 1, a display device 1 according to an embodiment may be a device that displays moving images or still images, and may be used as a display screen of each of not only portable electronic devices such as tablet PCs, smart phones, mobile communication terminals, and e-books, but also various suitable products such as televisions, laptops, and monitors.

The display device 1 has a three-dimensional shape. In the drawing, a direction parallel to a first side (e.g., a vertical side) of the display device 1 is indicated as a first direction DR1, a direction parallel to a second side (e.g., a horizontal side) of a display panel PNL is indicated as a second direction DR2, and a thickness direction of the display device 1 is indicated as a third direction DR3. In the following descriptions, a "direction" may refer to any direction along an axis (e.g., both directions respectively toward one side and the opposite side in the direction) unless otherwise specified. Further, when it is desirable to distinguish directions along the axis (e.g., both the directions respectively toward one side and the opposite side in the direction) from each other, one thereof will be referred to as a "direction toward one side" and the other thereof will be referred to as a "direction toward the opposite side". Referring to FIG. 1, a direction in which an arrow is directed is referred to as a direction toward one side, and a direction opposite thereto is referred to as a direction toward the opposite side. The first direction DR1 to the third direction DR3 may intersect each other or may be orthogonal to each other. The display device 1 may have a shape in which the vertical side is longer than the horizontal side as shown in FIG. 1. However, the present disclosure is not limited thereto.

The display device 1 according to an embodiment may include the display panel PNL.

The display panel PNL may be a panel that displays an image, and may include any kind of a display panel such as an organic light-emitting display panel including an organic light-emitting layer, a micro LED display panel using a micro LED, and a quantum dot light-emitting display panel using a quantum dot light-emitting diode, or an inorganic light-emitting display panel using an inorganic light-emitting element including an inorganic semiconductor. Referring to FIG. 1, the display panel PNL may display the image toward one side in the third direction DR3.

The display panel PNL may include a main area MR, a sub-area SR disposed at one side in the first direction DR1 around the main area MR, and a bendable area BR disposed between the main area MR and the sub-area SR.

The main area MR may have a general shape similar to a planar shape of the display device 1. The main area MR may be a flat area disposed on one plane. However, the present disclosure is not limited thereto. At least one of edges of the main area MR except for a side thereof connected to the bendable area BR may have a curved surface or may be bent in a perpendicular manner to the flat area thereof.

The bendable area BR is connected to one side in the first direction DR1 of the main area MR. For example, the bendable area BR may be connected to one short side of the main area MR. In some embodiments, a width in the second direction DR2 of the bendable area BR may be smaller than a width in the second direction DR2 of a short side of the main area MR, and a connective portion between the main area MR and the bendable area BR may have an L-shape. However, the present disclosure is not limited thereto. For example, the width in the second direction DR2 of the bendable area BR may be equal to the width of the short side of the main area MR.

In the bendable area BR, the display panel PNL may be bent toward the opposite side in the third direction DR3 and to have a curvature. Although the bendable area BR may have a certain radius of curvature, the present disclosure is not limited thereto. The bendable area BR may have different radius of curvatures based on different sections thereof. As the display panel PNL is bent in the bendable area BR, facing directions of one face and the opposite face of a portion of the display panel PNL are exchanged with each other. That is, before the bendable area BR is bent, one face of the sub-area SR may face toward one side in the third direction DR3. When the bendable area BR is bent toward the opposite side in the third direction DR3, one face of the sub-area SR may face toward the opposite side in the third direction DR3. In this case, the sub-area SR may be disposed on the opposite side in the third direction DR3 of the display panel PNL and overlap (e.g., overlap in the thickness direction) the main area MR of the display panel PNL.

The sub-area SR extends from the bendable area BR. The sub-area SR may extend from a point at which bending of the bendable area BR is terminated and extend in a direction parallel to the main area MR. In this case, the sub-area SR may overlap the main area MR in the third direction DR3. Specifically, the sub-area SR may overlap a non-display area NDA of an edge of the main area MR, and further overlap a display area DA of the main area MR.

The width in the second direction DR2 of the sub-area SR may be equal to the width in the second direction DR2 of the bendable area BR. However, the present disclosure is not limited thereto.

A plurality of pads PAD connected (e.g., electrically connected) to a circuit board CB to be described later may be disposed in the sub-area SR.

The display panel PNL may include the display area DA that displays an image and a non-display area NDA that does not display an image. The display area DA of the display panel PNL is disposed within the main area MR. Specifically, the display area DA may be positioned in an inner region excluding an edge region of the main area MR.

The edge region of the display area DA may be the non-display area NDA. That is, the rest of the display panel PNL except for the display area DA becomes the non-display area NDA of the display panel PNL. In some embodiments, the edge around the display area DA of the main area MR, the bendable area BR (e.g., an entirety of the bendable area BR), and the sub-area SR (e.g., an entirety of the sub-area SR) may constitute the non-display area NDA. However, the present disclosure is not limited thereto. The bendable area BR and/or the sub-area SR may include a portion of the display area DA.

Referring to FIG. 2, in the display area DA, a plurality of the sub-pixels SP and first drive voltage lines VDDL, data lines DL, scan lines SL, and light-emission lines EL connected to the plurality of the sub-pixels SP may be disposed.

The first drive voltage lines VDDL may serve to supply a drive voltage to a sub-pixel SP. The first drive voltages VDDL may extend parallel to the first direction DR1 and may be disposed in the display area DA. In some embodiments, the first drive voltage lines VDDL extending parallel to the first direction DR1 and disposed in the display area DA may be connected to each other in the non-display area NDA.

Alternatively, the first drive voltage lines VDDL may include a first sub-drive voltage line extending parallel to the first direction DR1 and disposed in the display area DA and a second sub-drive voltage line extending parallel to the second direction DR2 and disposed in the display area DA.

The data lines DL may serve to provide a data signal to each of the sub-pixels SP. The data lines DL may extend in the first direction DR1 and may extend parallel to the first drive voltage lines VDDL.

The scan lines SL may serve to provide a scan signal to each of the sub-pixels SP. The scan lines SL may extend in the second direction DR2 and may intersect the first drive voltage lines VDDL and the data lines DL.

The light-emission lines EL may serve to provide a voltage for light emission to each of the sub-pixels SP. The light-emission lines EL may extend in the second direction DR2 and may extend parallel to the scan lines SL.

The sub-pixel SP may receive signals from the first drive voltage VDDL, the data line DL, the scan line SL, and the light-emission line EL, may emit light, and may output an image to the display area DA. Each of the sub-pixels SP may be connected to the first drive voltage line VDDL, at least one of the scan lines SL, one of the data lines DL, and at least one of the light-emission lines EL. FIG. 2 illustrates that each of the sub-pixels SP is connected to two scan lines SL, one data line DL, one light-emission line EL, and the first drive voltage line VDDL. However, the present disclosure is not limited thereto. For example, each of the sub-pixels SP may be connected to three scan lines SL instead of two scan lines SL.

A scan driver SLD, a fan-out line FL, and a pad PAD may be disposed in the non-display area NDA.

The scan driver SLD (e.g., the scan driver SLD at a side or end of the non-display area NDA) may apply a scan signal to the scan lines SL, and apply a light-emission signal to the light-emission lines EL. In some embodiments, the scan driver SLD may be disposed at the opposite side end (e.g., the opposite side or end) in the second direction DR2 of the non-display area NDA of the main area MR. However, the present disclosure is not limited thereto. For example, the scan driver SLD may be disposed at each of both ends in the second direction DR2 of the non-display area NDA of the main area MR. In some embodiments, the scan driver SLD may include a scan signal output unit and a light-emission signal output unit. The scan signal output unit may generate scan signals, and may sequentially output the scan signals to the scan lines SL. The light-emission signal output unit may generate the light-emission signals and sequentially output the light-emission signals to the light-emission lines EL.

The scan driver SLD may receive a scan control signal and a light-emission control signal via a plurality of scan control lines SCL. In some embodiments, the scan control line SCL may be connected (e.g., electrically connected) to the display driving circuit and thus may receive the scan control signal and the light-emission control signal therefrom.

The fan-out line FL may serve to connect (e.g., electrically connect) the data line DL to the pad PAD of the sub-area SR. As described above, when the width in the second direction DR2 of the bendable area BR is smaller than the width in the second direction DR2 of the main area MR, the fan-out lines FL may be disposed between the main area MR and the bendable area BR and may converge toward a central portion in the second direction DR2 of the bendable area BR.

The pad PAD may receive a control signal from the circuit board CB which will be described later, and deliver the control signal to the display panel PNL. The plurality of pads PAD may be disposed at one side end (e.g., one side or end) in the first direction DR1 of the sub-area SR and may be arranged side by side and may be spaced from each other (e.g., spaced from each other by a predefined spacing) in the second direction DR2. A detailed description of the plurality of pads PAD will be described later.

The display device 1 may further include the circuit board CB. The circuit board CB may supply a power signal and various control signals to the display panel PNL. The circuit board CB may be disposed at one side in the first direction DR1 around the sub-area SR. Specifically, contact terminals CT on the circuit board CB and the pads PAD are connected (e.g., electrically connected) to each other via an anisotropic conductive film, and thus the circuit board CB may be connected (e.g., electrically connected) to the display panel PNL. The circuit board CB may be implemented as a flexible printed circuit board, a printed circuit board, or a chip-on film.

Figure 3:
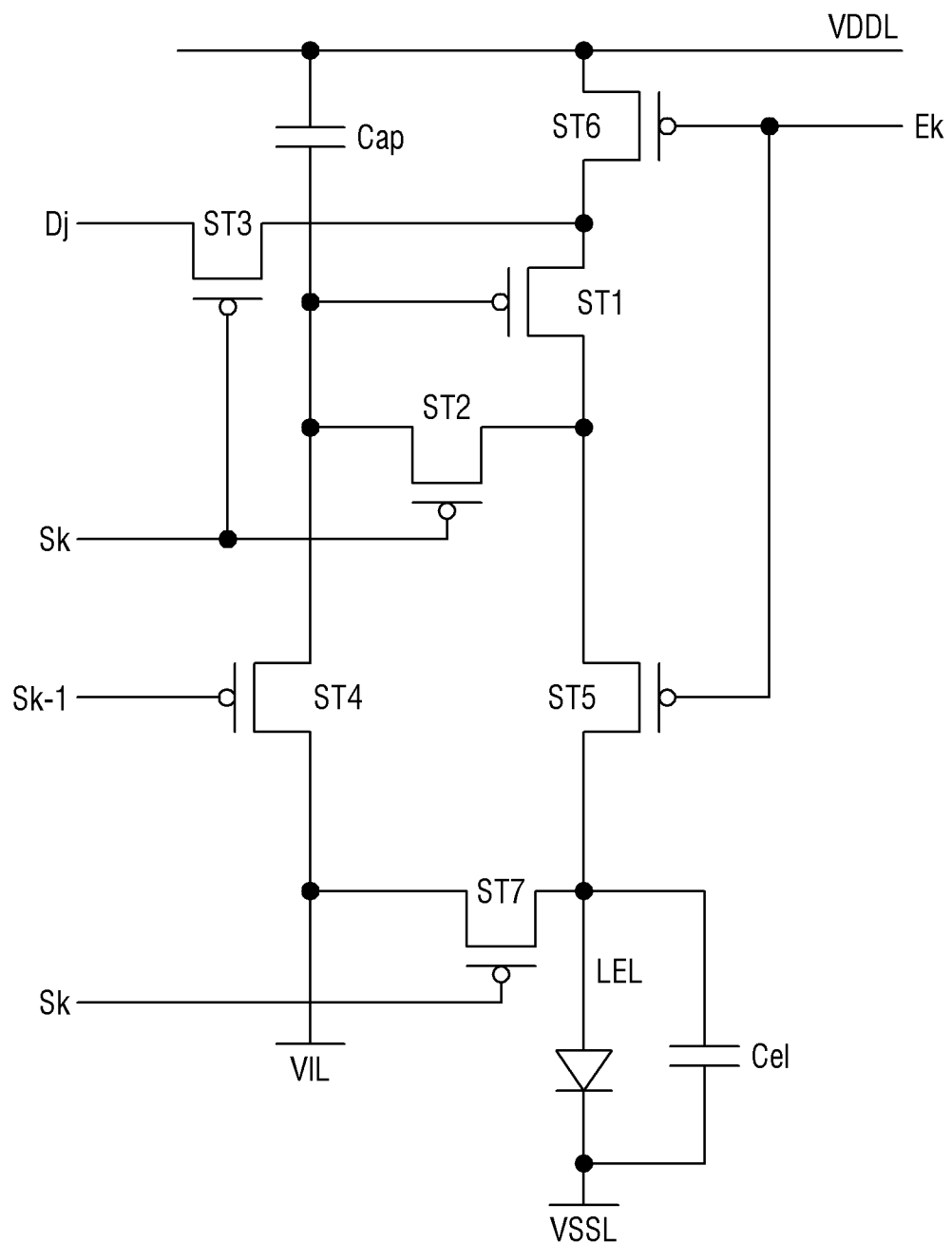
FIG. 3 is a circuit diagram showing a circuit structure of a sub-pixel of FIG. 1.
Figure 4A:
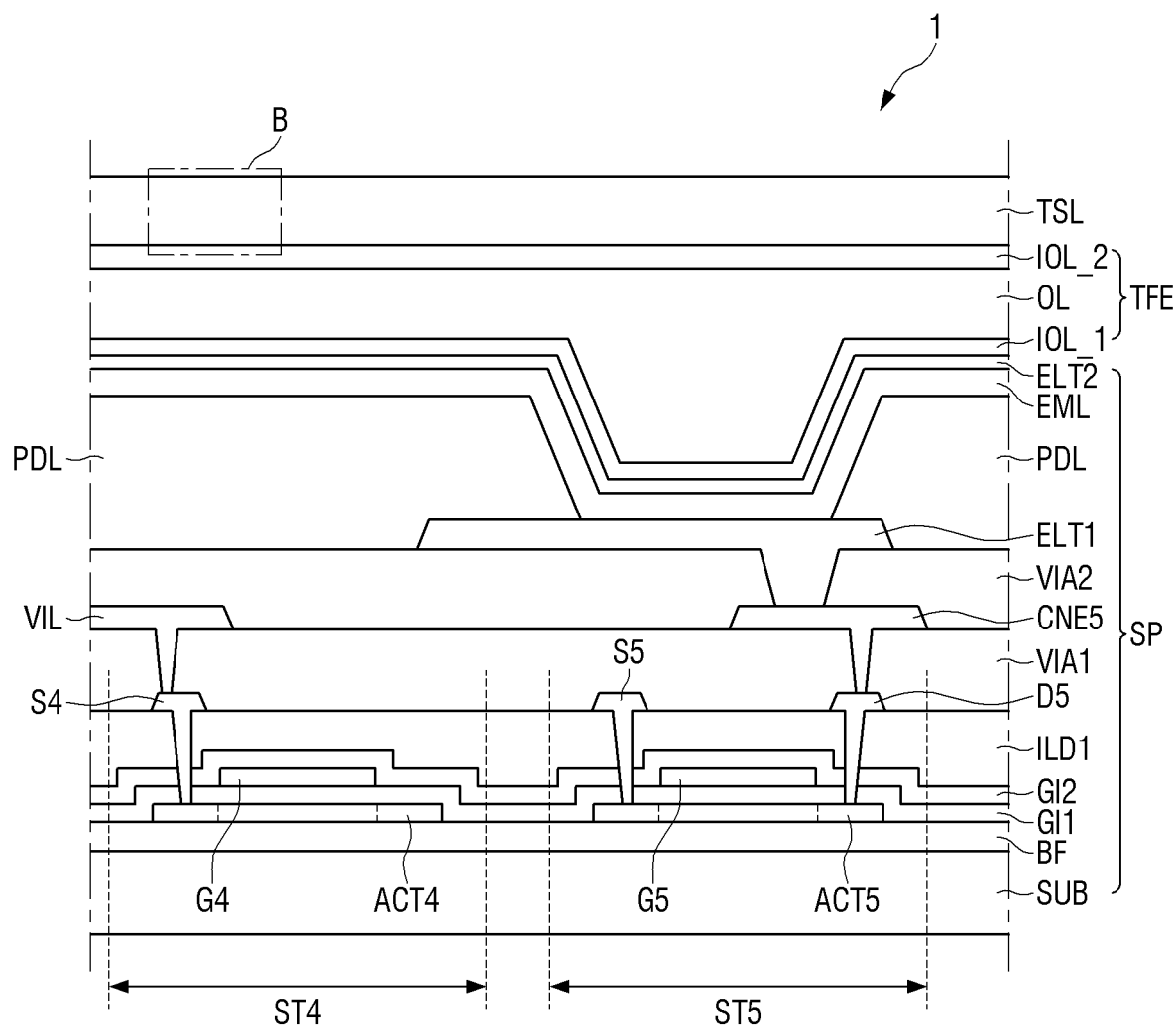
FIG. 4A and FIG. 4B are structural diagrams briefly showing a structure of the sub-pixel in FIG. 1.
Figure 4A:
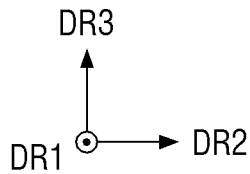
Figure 4B:
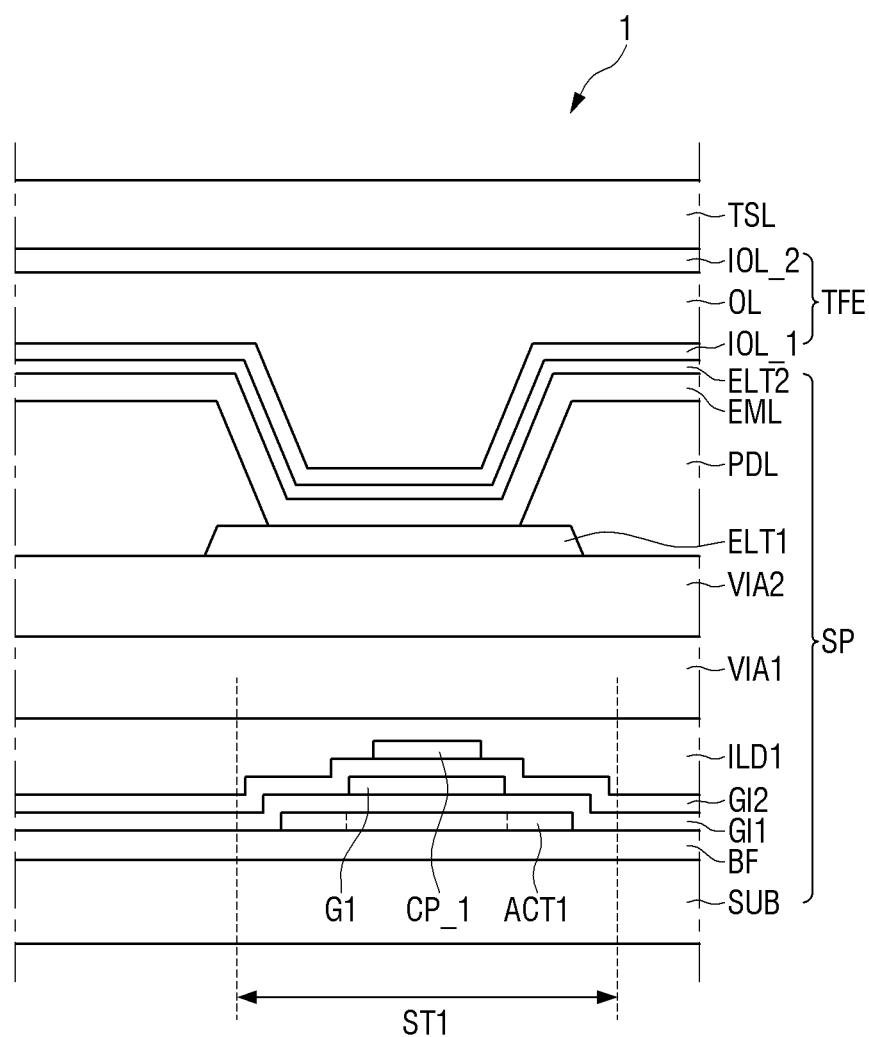
Figure 5:
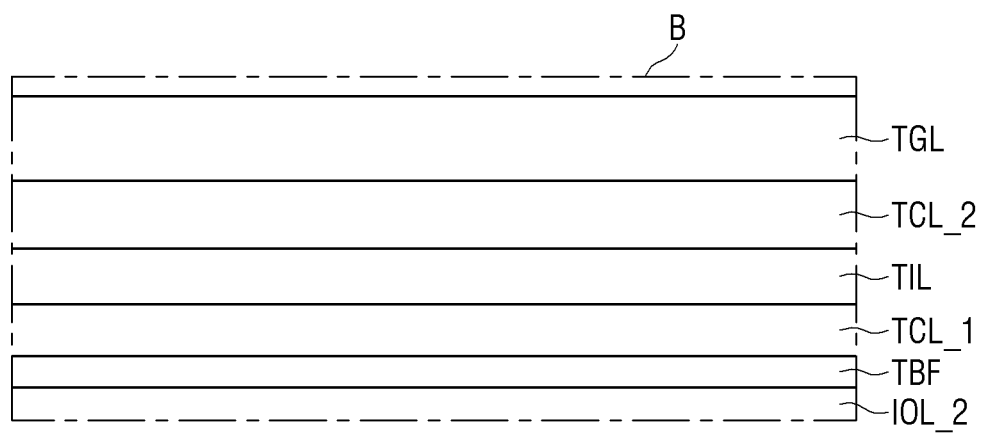
FIG. 5 is an enlarged view of an area B of FIG. 4A.
Figure 5:
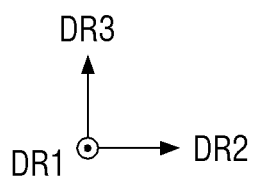

FIG. 3 is a circuit diagram showing a circuit structure of the sub-pixel according to the embodiment of FIG. 1. FIG. 4A and FIG. 4B are structural diagrams briefly showing a structure of the sub-pixel SP in FIG. 1. FIG. 5 is an enlarged view of an area B of FIG. 4A.

Referring to FIG. 3, FIG. 4A, and FIG. 4B, the sub-pixel SP may be connected to a (k−1)-th (k is a positive integer greater than or equal to 2) scan line Sk−1, a k-th scan line Sk, and a j-th (j is a positive integer) data line Dj. Further, the sub-pixel SP may be connected to the first drive voltage line VDDL to which a first drive voltage VDDL is supplied, an initialization voltage line to which an initialization voltage is supplied, and a second drive voltage line VSSL to which a second drive voltage VSSL having a voltage value lower than the first drive voltage VDDL is supplied.

Further, the sub-pixel SP includes a driving thin-film transistor, a light-emitting element LEL, switch elements, and a capacitor Cap. For example, the sub-pixel SP may include a first thin-film transistor ST1 as the driving thin-film transistor, and may include second to seventh thin-film transistors ST2, ST3, ST4, ST5, ST6, and ST7 as the switch elements, and may include a first electrode ELT1, a second electrode ELT2, and a light-emitting layer EML as the light-emitting element LEL.

The first thin-film transistor ST1 may include a first gate electrode G1, a first electrode, a second electrode, and the like. The first thin-film transistor ST1 controls a drain-source current (hereinafter, referred to as "drive current") flowing between the first electrode and the second electrode according to a data voltage applied to the first gate electrode G1. The drive current flowing through a channel of the first thin-film transistor ST1 is proportional to a square of a difference between a threshold voltage and a voltage between the first gate electrode G1 and the first electrode of the first thin-film transistor ST1 as in Equation 1.

$$Ids = k' \times (Vgs - Vth)^2 \qquad \text{Equation 1}$$

In the Equation 1, k' denotes a proportional coefficient determined based on a structure and physical characteristics of the first thin-film transistor ST1, Vgs denotes a gate-source voltage of the first thin-film transistor ST1, and Vth denotes the threshold voltage of the first thin-film transistor ST1, and Ids denotes the drive current.

The light-emitting element LEL may serve to emit light based on the drive current. An amount of light emitted from the light-emitting element LEL may be proportional to the drive current. The light-emitting element LEL may include a first electrode ELT1, a second electrode ELT2, and a light-emitting layer EML disposed between the first electrode ELT1 and the second electrode ELT2. The first electrode ELT1 may act as an anode, and the second electrode ELT2 may act as a cathode.

The first electrode ELT1 of the light-emitting element LEL may be connected to a first electrode of a seventh thin-film transistor ST7 and a second electrode of a fifth thin-film transistor ST5, while the second electrode ELT2 may be connected to the second drive voltage line VSSL. A parasitic capacitance Cel may be generated between the first electrode ELT1 and the second electrode ELT2 of the light-emitting element LEL.

The second thin-film transistor ST2 is turned on based on a scan signal of the k-th scan line Sk to connect the first gate electrode G1 of the first thin-film transistor ST1 to a second electrode thereof. That is, when the second thin-film transistor ST2 is turned on, the first gate electrode G1 and the second electrode of the first thin-film transistor ST1 are connected to each other such that the first thin-film transistor ST1 operates as a diode. The second thin-film transistor ST2 may include a second gate electrode G2, a first electrode, and a second electrode. The second gate electrode G2 may be connected to the k-th scan line Sk, the first electrode of the second thin-film transistor ST2 may be connected to a second electrode D1 of the first thin-film transistor ST1, and the second electrode of the second thin-film transistor ST2 may be connected to the first gate electrode G1 of the first thin-film transistor ST1.

The third thin-film transistor ST3 is turned on based on the scan signal of the k-th scan line Sk to connect the first electrode of the first thin-film transistor ST1 and a j-th data line Dj to each other. The third thin-film transistor ST3 may include a third gate electrode, a first electrode, and a second electrode. The third gate electrode of the third thin-film transistor ST3 may be connected to the k-th scan line Sk, the first electrode of the third thin-film transistor ST3 may be connected to the first electrode of the first thin-film transistor ST1, and the second electrode of the third thin-film transistor ST3 may be connected to the j-th data line Dj.

The fourth thin-film transistor ST4 is turned on based on a scan signal of the (k−1)-th scan line Sk−1 to connect the first gate electrode G1 of the first thin-film transistor ST1 and the initialization voltage line VIL to each other. The first gate electrode G1 of the first thin-film transistor ST1 may be discharged to an initialization voltage of the initialization voltage line VIL. The fourth thin-film transistor ST4 may include a fourth gate electrode, a first electrode, and a second electrode. The fourth gate electrode of the fourth thin-film transistor ST4 may be connected to the (k−1)-th scan line Sk−1, the first electrode of the fourth thin-film transistor ST4 may be connected to the first gate electrode G1 of the first thin-film transistor ST1, and the second electrode of the fourth thin-film transistor ST4 may be connected to the initialization voltage line VIL.

The fifth thin-film transistor ST5 is disposed between and connected to the second electrode of the first thin-film transistor ST1 and the first electrode ELT1 of the light-emitting element LEL. The fifth thin-film transistor ST5 is turned on based on the light-emission control signal of the k-th light-emission line Ek to connect the second electrode of the first thin-film transistor ST1 to the first electrode ELT1 of the light-emitting element LEL. The fifth thin-film transistor ST5 may include a fifth gate electrode, a first electrode, and a second electrode. The fifth gate electrode may be connected to the k-th light-emission line Ek, the first electrode of the fifth thin-film transistor ST5 may be connected to the second electrode of the first thin-film transistor ST1, and the second electrode of the fifth thin-film transistor ST5 may be connected to the first electrode ELT1 of the light-emitting element LEL.

The sixth thin-film transistor ST6 is turned on based on the light-emission control signal of the k-th light-emission line Ek to connect the first electrode of the first thin-film transistor ST1 to the first drive voltage line VDDL. The sixth thin-film transistor ST6 may include a sixth gate electrode, a first electrode, and a second electrode. The sixth gate electrode may be connected to the k-th light-emission line Ek, the first electrode of the sixth thin-film transistor ST6 may be connected to the first drive voltage line VDDL, and the second electrode of the sixth thin-film transistor ST6 may be connected to the first electrode of the first thin-film transistor ST1. When both the fifth thin-film transistor ST5 and the sixth thin-film transistor ST6 are turned on, the drive current Ids may be supplied to the light-emitting element LEL.

The seventh thin-film transistor ST7 is turned on based on the scan signal of the k-th scan line Sk to connect the first electrode ELT1 of the light-emitting element LEL to the initialization voltage line VIL. The first electrode ELT1 of the light-emitting element LEL may be discharged to the initialization voltage. The seventh thin-film transistor ST7 may include a seventh gate electrode, a first electrode and a second electrode. The seventh gate electrode thereof may be connected to the k-th scan line SL, the first electrode of the seventh thin-film transistor ST7 may be connected to the first electrode ELT1 of the light-emitting element LEL, and the second electrode of the seventh thin-film transistor ST7 may be connected to the initialization voltage line VIL.

A capacitor Cap is disposed between the first gate electrode G1 of the first thin-film transistor ST1 and the first drive voltage line VDDL. One electrode of the capacitor Cap may be connected to the first gate electrode G1 of the first thin-film transistor ST1, while the other electrode thereof may be connected to the first drive voltage line VDDL.

When the first electrode of each of the first to seventh thin-film transistors ST1, ST2, ST3, ST4, ST5, ST6, and ST7 acts or functions as a source electrode, the second electrode thereof may act as a drain electrode. Alternatively, when the first electrode of each of the first to seventh thin-film transistors ST1, ST2, ST3, ST4, ST5, ST6, and ST7 acts as a drain electrode, the second electrode thereof may act or function as a source electrode.

Each of the first to seventh thin-film transistors ST1, ST2, ST3, ST4, ST5, ST6, and ST7 may include a semiconductor layer. The first to seventh thin-film transistors ST1, ST2, ST3, ST4, ST5, ST6, and ST7 may include a semiconductor layer made of polysilicon. However, the present disclosure is not limited thereto.

When the semiconductor layer of each of the first to seventh transistors ST1, ST2, ST3, ST4, ST5, ST6, and ST7 is made of polycrystalline silicon, a process for forming the semiconductor layer may be a LTPS (Low Temperature Poly Silicon) process. Further, in FIG. 3, an example in which all of the first to seventh transistors ST1, ST2, ST3, ST4, ST5, ST6, and ST7 are embodied as a p-type thin-film transistors is described. However, the present disclosure is not limited thereto. For example, all or some of the first to seventh transistors ST1, ST2, ST3, ST4, ST5, ST6, and ST7 may be embodied as n-type thin film transistors.

Hereinafter, a stack structure of the display panel PNL in the display area DA will be described in more detail.

The display panel PNL may include the sub-pixel SP, a thin-film encapsulation layer TFE, and a touch layer TSL in the display area DA.

Referring to FIG. 4A and FIG. 4B, the sub-pixel SP may include a substrate SUB, a buffer layer BF, a first semiconductor pattern ACTP1, a first gate insulating layer GI1, a first gate pattern GAT1, a second gate insulating layer GI2, a second gate pattern GAT2, a first insulating layer ILD1, a first data pattern DAT1, a first via insulating layer VIA1, a second data pattern DAT2, and a light-emitting element LEL.

The substrate SUB may serve as a base of the display panel PNL. The substrate SUB may include flexible polyimide. However, the present disclosure is not limited thereto. For example, the substrate SUB may include colorless polyimide produced by replacing an aromatic element constituting polyimide with a structure such as trifluoromethyl group —$CH_3$, ether group —O—, or sulfone group —$SO_2$ or adding the structure such as trifluoromethyl group —$CH_3$, ether group —O—, or sulfone group —$SO_2$ to polyimide. However, the present disclosure is not limited thereto. The colorless polyimide may be optically transparent. For example, the colorless polyimide may have a transmittance of about 90% or greater with respect to light of a visible light wavelength band. When the substrate SUB includes colorless polyimide, an UPC (Under Panel Camera) scheme in which a camera is disposed under the display panel PNL may be introduced. Hereinafter, following descriptions will be based on a configuration in which the substrate SUB includes the colorless polyimide.

In some embodiments, the main area MR, the bendable area BR, and the sub-area SR as described above may be defined across the substrate SUB.

The buffer layer BF may serve to prevent or reduce diffusion of metal atoms or impurities from the substrate SUB to the first semiconductor pattern ACTP1. The buffer layer BF may be disposed on the substrate SUB (e.g., an entirety of the substrate SUB).

The first semiconductor pattern ACTP1 may be disposed in the display area DA and may receive signals from the scan line SL and the data line DL and deliver the signals to the source and drain electrodes of the first thin-film transistor to the seventh thin-film transistors ST1, ST2, ST3, ST4, ST5, ST6, and ST7.

The first semiconductor pattern ACTP1 may include the semiconductor layers of the first thin-film transistor to the seventh thin-film transistors ST1, ST2, ST3, ST4, ST5, ST6, and ST7. For example, as shown in FIG. 4A and FIG. 4B, the first thin-film transistor ST1 may include a first semiconductor layer ACT1, and the fourth thin-film transistor ST4 may include a fourth semiconductor layer ACT4. The fifth thin-film transistor ST5 may include a fifth semiconductor layer ACT5.

The first semiconductor layer ACT1 may include a first channel area overlapping with the first gate electrode G1 to be described later, a first drain area disposed on one side of the first channel area, and a first source area disposed on the opposite side of the first channel area. The fourth semiconductor layer ACT4 may include a fourth channel area overlapping with a fourth gate electrode G4 to be described later, a fourth drain area disposed on one side of the fourth channel area, and a fourth source area disposed on the opposite side of the fourth channel area. The fifth semiconductor layer ACT5 may include a fifth channel area overlapping with a fifth gate electrode G5 which will be described later, a fifth drain area disposed on one side of the fifth channel area, and a fifth source area disposed on the opposite side of the fifth channel area.

The first semiconductor pattern ACTP1 may be disposed directly on a face of the buffer layer. That is, the first semiconductor pattern ACTP1 may contact (i.e., directly contact) one face of the buffer layer. The first semiconductor pattern ACTP1 may be selectively disposed on the buffer layer BF. Further, the first semiconductor pattern ACTP1 may include, but is not limited to, polycrystalline silicon. For example, the first semiconductor pattern ACTP1 may include amorphous silicon.

The first gate insulating layer GI1 may insulate the first semiconductor pattern ACTP1 from the first gate pattern GAT1 to be described later. The first gate insulating layer GI1 may be disposed on the buffer layer BF on which the first semiconductor pattern ACTP1 has been disposed and thus may cover the first semiconductor pattern ACTP1. The first gate insulating layer GI1 may be disposed along a profile of the first semiconductor pattern ACTP1 and may have substantially the uniform thickness. In some embodiments, the first gate insulating layer GI1 may include silicon oxide, etc. and may be composed of a plurality of layers.

The first gate pattern GAT1 may be disposed on the first gate insulating layer GI1. The first gate pattern GAT1 may be disposed directly on one face of the first gate insulating layer GI1. That is, the first gate pattern GAT1 may contact (i.e., directly contact) one face of the first gate insulating layer GI1.

The first gate pattern GAT1 may include gate electrodes of the first to seventh thin-film transistors ST1, ST2, ST3, ST4, ST5, ST6, and ST7 disposed in the display area DA. For example, as shown in FIG. 4A and FIG. 4B, the first gate pattern GAT1 may include the first gate electrode G1 of the first thin-film transistor ST1, the fourth gate electrode G4 of the fourth thin-film transistor ST4, and the fifth gate electrode G5 of the fifth thin-film transistor ST5. As described above, the first gate electrode G1, the fourth gate electrode G4, and the fifth gate electrode G5 may overlap the first channel area of the first semiconductor layer ACT1, the fourth channel area of the fourth semiconductor layer ACT4, and the fifth channel area of the fifth semiconductor layer ACT5 in the third direction DR3, respectively.

The first gate pattern GAT1 may be embodied as a first gate conductive layer including metal. For example, the first gate pattern GAT1 may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The second gate insulating layer GI2 may insulate the first gate pattern GAT1 from the second gate pattern GAT2 to be described later. The second gate insulating layer GI2 may be disposed on the first gate insulating layer GI1 on which the first gate pattern GAT1 has been disposed and thus may cover the first gate pattern GAT1. The second gate insulating layer GI2 may be disposed along a profile of the first gate pattern GAT1 and may have a substantially uniform thickness. In some embodiments, the second gate insulating layer GI2 may include silicon oxide and the like, and may be composed of a plurality of layers.

The second gate pattern GAT2 may be disposed on the second gate insulating layer GI2. The second gate pattern GAT2 may be disposed directly on one face of the second gate insulating layer GI2. That is, the second gate pattern GAT2 may contact (i.e., directly contact) one face of the second gate insulating layer GI2.

The second gate pattern GAT2 may include a capacitor electrode disposed in the display area DA. For example, as shown in FIG. 4B, the second gate pattern GAT2 may include a first capacitor electrode CP_1 of the first thin-film transistor ST1. A voltage equal to a voltage applied to the first drive voltage line VDDL may be applied to the first capacitor electrode CP_1. The first capacitor electrode CP_1 together with the first gate electrode G1 and the second gate insulating layer GI2 may constitute the storage capacitor. The first capacitor electrode CP_1 may overlap with the first gate electrode G1 in the third direction DR3.

The second gate pattern GAT2 may be embodied as a second gate conductive layer including metal. For example, the second gate pattern GAT2 may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The first insulating layer ILD1 may serve to cover a step caused by the second gate pattern GAT2 to provide a planarized surface. The first insulating layer ILD1 may be disposed on the second gate insulating layer GI2 on which the second gate pattern GAT2 has been formed. The first insulating layer ILD1 may be composed of a plurality of layers.

The first data pattern DAT1 may be disposed on the first insulating layer ILD1. The first data pattern DAT1 may include the source and drain electrodes of the first to seventh thin-film transistors ST1, ST2, ST3, ST4, ST5, ST6, and ST7. For example, as shown in FIG. 4A, the first data pattern DAT1 may include a fifth source electrode S5 and a fifth drain electrode D5 of the fifth thin-film transistor ST5 and a fourth source electrode S4 of the fourth thin-film transistor ST4.

When the first data pattern DAT1 is disposed to form a source electrode and a drain electrode on the first insulating layer ILD1, the first to seventh thin-film transistors ST1, ST2, ST3, ST4, ST5, ST6, and ST7 may be defined. The fourth source electrode S4 and the fifth source/drain electrodes S5 and D5 may be connected (e.g., electrically connected) respectively to a fourth area and fifth source/drain areas of the fourth and fifth semiconductor patterns ACT4 and ACT5 via contact holes extending through the first insulating layer ILD1, the second gate insulating layer GI2, and the first gate insulating layer GI1.

The first data pattern DAT1 may include metal. For example, the first data pattern DAT1 may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first data pattern DAT1 may be composed of a single layer or a multi-layer stack.

In some embodiments, the first data pattern DAT1 may include a first pad layer PAD_1 to be described later. A detailed description thereof will be provided later.

The first via insulating layer VIA1 may serve to partially insulate the first data pattern DAT1 from the second data pattern DAT2 to be described later. The first via insulating layer VIA1 may be disposed in the display area DA and on the first insulating layer ILD1 on which the first data pattern DAT1 has been formed. The first via insulating layer VIA1 may be made of an organic material such as an acrylic resin, a polyimide-based resin, or a polyimide-based resin.

The second data pattern DAT2 may be disposed on the first via insulating layer VIA1. The second data pattern DAT2 may include a connection electrode connected (e.g., electrically connected) to the source electrodes or the drain electrodes of the first to seventh thin-film transistors ST1, ST2, ST3, ST4, ST5, ST6, and ST7. For example, as shown in FIG. 4A, the second data pattern DAT2 may include a fifth connection electrode CNE5 connected (e.g., electrically connected) to the fifth drain electrode D5. The fifth connection electrode CNE5 may be connected (e.g., electrically connected) to the fifth drain electrode D5 via a contact hole extending through the first via insulating layer VIA1.

The second data pattern DAT2 may include metal. For example, the second data pattern DAT2 may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The second data pattern DAT2 may be composed of a single layer or a multilayer stack.

In some embodiments, the second data pattern DAT2 may include a second pad layer PAD_2 to be described later. A detailed description thereof will be provided later.

The second via insulating layer VIA2 may be disposed in the display area DA and on the first via insulating layer VIA1 on which the second data pattern DAT2 has been formed. Like the first via insulating layer VIA1, the second via insulating layer VIA2 may be made of an organic material such as an acrylic resin, a polyimide-based resin, or a polyimide-based resin.

The light-emitting element LEL may include the first electrode ELT1, the light-emitting layer EML, and the second electrode ELT2 as described above, and may be disposed on the second via insulating layer VIA2.

The first electrode ELT1 may act as an anode and may be connected (e.g., electrically connected) to the fifth connection electrode CNE5 via a contact hole extending through the second via insulating layer VIA2 and thus may be connected (e.g., electrically connected) to the fifth drain electrode D5 of the fifth thin-film transistor ST5.

A pixel defining film PDL may be disposed on the second via insulating layer VIA2 on which the first electrode ELT1 has been disposed. The pixel defining film PDL may be made of organic materials, inorganic materials, or the like. The pixel defining film PDL may have an opening defined therein partially exposing the first electrode ELT1.

The light-emitting layer EML may be disposed on the first electrode ELT1 and the pixel defining film PDL. When the light-emitting layer EML is embodied as an organic light-emitting layer including an organic material, the light-emitting element LEL may be embodied as an organic light-emitting diode. When the light-emitting layer EML includes a quantum dot light-emitting layer, the light-emitting element LEL may be embodied as a quantum dot light-emitting element. When the light-emitting layer EML includes an inorganic semiconductor, the light-emitting element LEL may be embodied as an inorganic light-emitting element. Alternatively, the light-emitting element LEL may be embodied as a micro light-emitting diode.

The second electrode ELT2 may be disposed on the light-emitting layer EML. The second electrode ELT2 may have substantially the same profile as that of the light-emitting layer EML.

The thin-film encapsulation layer TFE may prevent or substantially prevent external moisture and oxygen from penetrating into the sub-pixel SP. The thin-film encapsulation layer TFE may be disposed on the second electrode ELT2 of the light-emitting element LEL.

The thin-film encapsulation layer TFE may include at least one organic layer OL and at least one inorganic layer and may be disposed in the display area DA. At least one organic layer OL and at least one inorganic layer may be stacked in an alternated manner with each other. For example, as shown in FIG. 4A and FIG. 4B, the thin-film encapsulation layer TFE may include a first inorganic layer IOL_1, an organic layer OL, and a second inorganic layer IOL_2. The organic layer OL may be disposed between the first inorganic layer IOL_1 and the second inorganic layer IOL_2. However, the present disclosure is not limited thereto.

In some embodiments, a portion of the thin-film encapsulation layer TFE in the non-display area NDA may be free of the organic layer OL. A detailed description thereof will be described later.

The touch layer TSL may sense a user's hand motion. The touch layer TSL may be disposed on the thin-film encapsulation layer TFE. The touch layer TSL may include a touch protective layer TGL and at least one conductive layer and at least one insulating layer. The at least one conductive layer and the at least one insulating layer may be stacked in an alternated manner with each other. For example, the touch layer TSL may have a structure in which a touch buffer layer TBF, a first touch conductive layer TCL_1, a touch insulating layer TIL, a second touch conductive layer TCL_2, and a touch protective layer TGL are stacked in this order as shown in FIG. 5.

The touch buffer layer TBF may be disposed on the second inorganic layer IOL_2 of the thin-film encapsulation layer TFE, or may be omitted.

In some embodiments, the first touch conductive layer TCL_1 and the second touch conductive layer TCL_2 may cross each other in a mesh shape when viewed in the third direction DR3. In one or more embodiments, the touch insulating layer TIL may be disposed between the first touch conductive layer TCL_1 and the second touch conductive layer TCL_2. The first touch conductive layer TCL_1 and the second touch conductive layer TCL_2 may include metal. The second touch conductive layer TCL_2 is made of the same material as that of the third pad layer PAD_3 which will be described later. A detailed description thereof will be provided later.

The touch protective layer TGL may be disposed on the second touch conductive layer TCL_2. The touch protective layer TGL may be embodied as an organic layer.

Hereinafter, a stack structure of the display panel PNL in the sub-area SR will be described in more detail.

Figure 6:
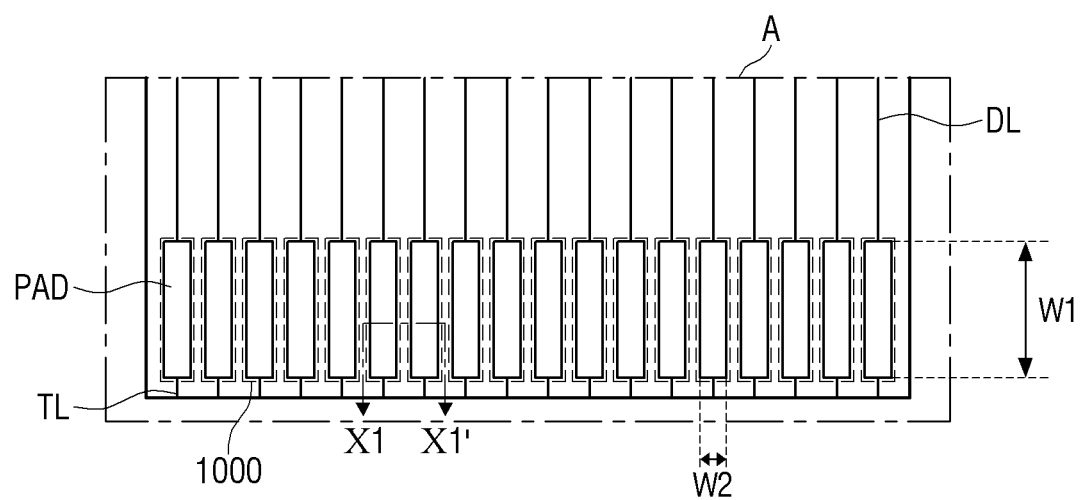
FIG. 6 is an enlarged view of an area A of FIG. 1.
Figure 6:
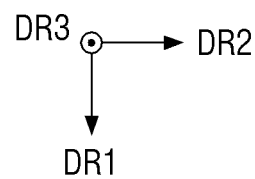
Figure 7:
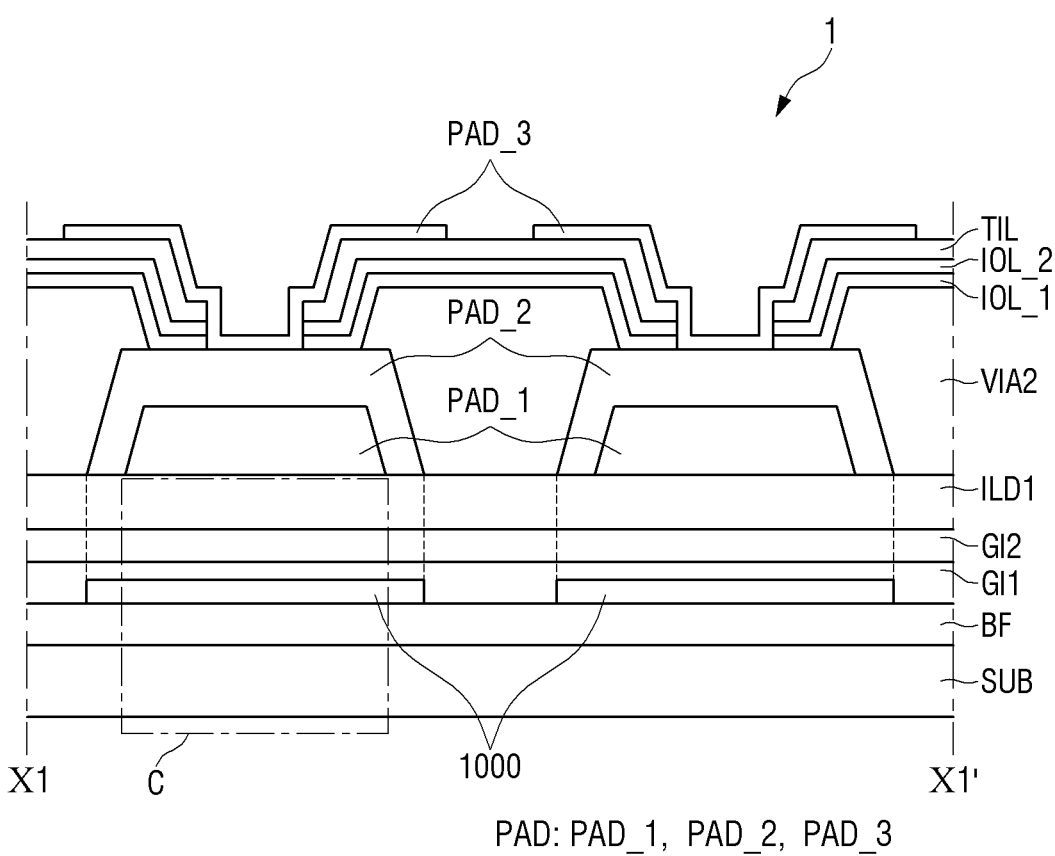
FIG. 7 is a cross-sectional view briefly showing a cross section of a pad of FIG. 6 taken along the line X1-X1'.
Figure 8:
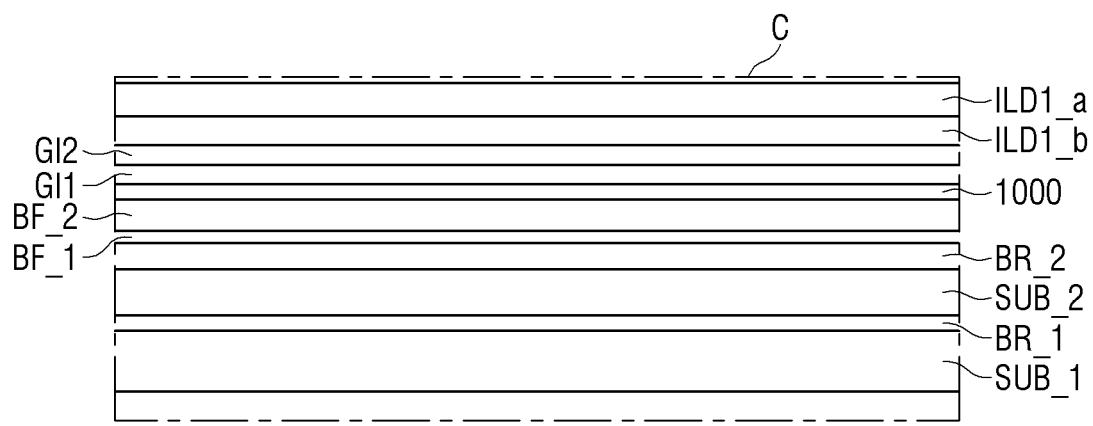
FIG. 8 is an enlarged view of an area C of FIG. 7.
Figure 8:
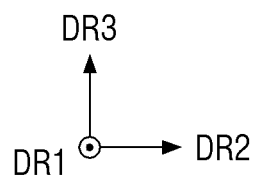

FIG. 6 is an enlarged view of an area A of FIG. 1. FIG. 7 is a cross-sectional view briefly showing a cross section of the pad of FIG. 6 taken along the line X1-X1'. FIG. 8 is an enlarged view of an area C of FIG. 7.

Referring to FIG. 1 and FIG. 6, the pad PAD may serve to transmit a driving signal of the circuit board CB to the display panel PNL. The plurality of pads PAD may be arranged at one side end (e.g., one side or end) in the first direction DR1 of the sub-area SR of the display panel PNL, and may be spaced from each other (e.g., spaced from each other by a suitable or predetermined spacing) in the second direction DR2. However, the present disclosure is not limited thereto. The pad PAD disposed in the sub-area SR may act as a data pad that supplies a data signal to the display panel PNL. Accordingly, the data line fanned out from the main area MR to the sub-area SR may be connected to the opposite side end (e.g., the opposite side or end) in the first direction DR1 of the pad PAD.

A test line TL may be connected to one side end (e.g., one side or end) in first direction DR1 of the pad PAD. The test line TL serves to connect (e.g., electrically connect) the pad PAD to a test device that inspects whether the pad PAD operates normally. After whether the pad PAD works normally has been inspected, one side end (e.g., one side or end) of the sub-area SR of the display panel PNL may be cut to cut off the electrical connection between the pad PAD and the test device. Accordingly, one side end (e.g., one side or end) in the first direction DR1 of the sub-area SR of the display panel PNL may be a cutting face. The test line TL may be aligned with one side end (e.g., one side or end) in the first direction DR1 of the sub-area SR. One side end (e.g., one side or end) in the first direction DR1 of the pad PAD may be spaced from one side end (e.g., one side or end) in the first direction DR1 of the sub-area SR while the test line TL may be disposed therebetween.

A process of cutting one side end (e.g., one side or end) of the sub-area SR of the display panel PNL may be performed using a laser. Specifically, the laser used in the process of cutting one side end (e.g., one side or end) of the sub-area SR may have a wavelength band of 510 nm to 520 nm, and may be irradiated to one side end (e.g., one side or end) in the first direction DR1 of the sub-area SR in a direction toward the opposite side in the third direction DR3. In this case, a cutting device may be used, and the display panel PNL may be disposed on a lower stage of the cutting device.

Referring to FIG. 7, in the sub-area SR, the display panel PNL may include the substrate SUB, the buffer layer BF, a light-blocking layer 1000, the first gate insulating layer GI1, the second gate insulating layer GI2, the first insulating layer ILD1, the pad PAD, the second via insulating layer VIA2, the first inorganic layer IOL_1, the second inorganic layer IOL_2, and the touch insulating layer TIL.

The substrate SUB, the buffer layer BF, the first gate insulating layer GI1, the second gate insulating layer GI2, the first insulating layer ILD1, the second via insulating layer VIA2, the first inorganic layer IOL_1, the second inorganic layer IOL_2, and the touch insulating layer TIL in the sub-area SR of the display panel PNL may be respectively identical with the substrate SUB, the buffer layer BF, the first gate insulating layer GI1, the second gate insulating layer GI2, the first insulating layer ILD1, the second via insulating layer VIA2, the first inorganic layer IOL_1, the second inorganic layer IOL_2, and the touch insulating layer TIL in the display area DA thereof as described above. Hereinafter, the components will be described in more detail.

The substrate SUB may act as a base of the display panel PNL. Referring to FIG. 8, the substrate SUB may include a first layer SUB_1, a first barrier layer BR_1, a second layer SUB_2, and a second barrier layer BR_2.

In some embodiments, the first layer SUB_1 may include colorless polyimide. A dimension in the third direction DR3 (hereinafter, referred to as 'thickness') thereof may be 10 μm. However, the present disclosure is not limited thereto.

The first barrier layer BR_1 may be disposed on the first layer SUB_1. In some embodiments, the first barrier layer BR_1 may include silicon oxide $SiO_x$, and a dimension in the third direction DR3 (hereinafter, referred to as 'thickness') thereof may be 6000 Å. However, the present disclosure is not limited thereto.

The second layer SUB_2 may be disposed on the first barrier layer BR_1. In some embodiments, the second layer SUB_2 may include colorless polyimide. A dimension in the third direction DR3 (hereinafter, referred to as 'thickness') thereof may be 5.8 μm. However, the present disclosure is not limited thereto.

The second barrier layer BR_2 may be disposed on the second layer SUB_2. In some embodiments, the second barrier layer BR_2 may include silicon oxide $SiO_x$, and a dimension in the third direction DR3 (hereinafter, referred to as 'thickness') thereof may be 5000 Å. However, the present disclosure is not limited thereto.

The buffer layer BF may be disposed on the substrate SUB. As shown in FIG. 8, the buffer layer BF may include a first buffer inorganic layer BF_1 and a second buffer inorganic layer BF_2. In some embodiments, the first buffer inorganic layer BF_1 may include silicon nitride $SiN_x$, and a dimension in the third direction DR3 (hereinafter, referred to as 'thickness') thereof may be 350 Å. However, the present disclosure is not limited thereto. The second buffer inorganic layer BF_2 may be disposed on the first buffer inorganic layer BF_1. In some embodiments, the second buffer inorganic layer BF_2 may include silicon oxide $SiO_x$, and a dimension in the third direction DR3 (hereinafter, referred to as 'thickness') thereof may be 3500 Å. However, the present disclosure is not limited thereto.

In some embodiments, when the substrate SUB includes the above-mentioned colorless polyimide, during the process of cutting one side end (e.g., one side or end) of the sub-area SR of the display panel PNL, lift-off of the insulating layer may occur. Specifically, the laser used in the cutting process may be reflected from or scattered at the lower stage of the cutting device and thus may travel toward one side in the third direction DR3 and then pass through the substrate SUB and the buffer layer BF. Transmittance at which the laser in the 510 nm to 520 nm wavelength band used for the process transmits through the colorless polyimide is higher than transmittance at which the laser in the 510 nm to 520 nm wavelength band used for the process transmits through general polyimide. Thus, the laser transmits through the colorless polyimide without energy loss, thereby causing damage to an interface between the first insulating layer ILD1 and the pad PAD to be described later, and thus causing the lift-off of the insulating layer. Therefore, it may be desirable to prevent the laser from being reflected toward a bottom of the pad PAD.

The light-blocking layer 1000 may prevent or reduce the lift-off of the insulating layer caused by the laser used in the process of cutting one side end (e.g., one side or end) of the sub-area SR. The light-blocking layer 1000 may block the laser reflected or scattered from or at the lower stage of the cutting device.

The light-blocking layer 1000 may be disposed on the buffer layer BF, specifically on the second buffer inorganic layer BF_2, and may have substantially the same shape (e.g., the same planar shape) as a planar shape of the pad PAD which will be described later. However, the present disclosure is not limited thereto. The number of light-blocking layers 1000 may be equal to the number of pads PAD. However, the present disclosure is not limited thereto.

In some embodiments, the light-blocking layer 1000 may include polycrystalline silicon, and a dimension in the third direction DR3 (hereinafter, referred to as 'thickness') thereof may be 470 Å. However, the present disclosure is not limited thereto. Hereinafter, an example in which the light-blocking layer 1000 includes polycrystalline silicon will be described. However, the present disclosure is not limited thereto. The light-blocking layer 1000 may include the same material as that of each of the first semiconductor layer ACT1, the fourth semiconductor layer ACT4, and the fifth semiconductor layer ACT5 of the display area DA, and may be formed concurrently (e.g., simultaneously) therewith. That is, the first semiconductor pattern ACTP1 may include the semiconductor layers of the first to seventh thin-film transistors ST1, ST2, ST3, ST4, ST5, ST6, and ST7 as described above and the light-blocking layer 1000.

The light-blocking layer 1000 may include, but is not limited to, polycrystalline silicon. For example, the light-blocking layer 1000 may include amorphous silicon and the like. When the light-blocking layer 1000 includes polycrystalline silicon, the light-blocking layer 1000 may absorb the laser reflected or scattered from or at the lower stage of the cutting device and thus may prevent or substantially prevent the laser from reaching the bottom of the pad PAD, thereby preventing or reducing the lift-off of the insulating layer as otherwise caused by the laser.

The first gate insulating layer GI1 may be disposed on the buffer layer BF where the light-blocking layer 1000 has been disposed and thus may cover the light-blocking layer 1000. In some embodiments, the first gate insulating layer GI1 may include silicon oxide $SiO_x$, and a dimension in the third direction DR3 (hereinafter, referred to as 'thickness') thereof may be 1200 Å. However, the present disclosure is not limited thereto.

The second gate insulating layer GI2 may be disposed on the first gate insulating layer GI1. In the sub-area SR, the first gate pattern GAT1 may not be disposed between the first gate insulating layer GI1 and the second gate insulating layer GI2. In some embodiments, the second gate insulating layer GI2 may include silicon nitride $SiN_x$, and a dimension in the third direction DR3 (hereinafter, referred to as 'thickness') thereof may be 1350 Å. However, the present disclosure is not limited thereto.

The first insulating layer ILD1 may be disposed on the second gate insulating layer GI2. The first insulating layer ILD1 may include a first insulating inorganic layer ILD1_a and a second insulating inorganic layer ILD1_b as shown in FIG. 8. In some embodiments, the first insulating inorganic layer ILD1_a may include silicon oxide $SiO_x$, and a dimension in the third direction DR3 (hereinafter, referred to as 'thickness') thereof may be 3000 Å. However, the present disclosure is not limited thereto. In some embodiments, the second insulating inorganic layer ILD1_b may include silicon nitride $SiN_x$, and a dimension in the third direction DR3 (hereinafter, referred to as 'thickness') thereof may be 2000 Å. However, the present disclosure is not limited thereto. The dimension in the third direction DR3 (hereinafter, referred to as 'thickness') of the first insulating layer ILD1 may be equal to a sum of the thickness of the first insulating inorganic layer ILD1_a and the thickness of the second insulating inorganic layer ILD1_b. That is, the thickness of the first insulating layer ILD1 may be 5000 Å. However, the present disclosure is not limited thereto.

The pad PAD may be disposed on the first insulating layer ILD1. The pad PAD may include a first pad layer PAD_1, a second pad layer PAD_2, and a third pad layer PAD_3 as shown in FIG. 7.

The first pad layer PAD_1 may be disposed on the first insulating layer ILD1, and may have a trapezoidal cross section whose width becomes smaller as the first pad layer PAD_1 extends toward one side in the third direction DR3. However, the present disclosure is not limited thereto.

The first pad layer PAD_1 may include the same material as that of each of the first source electrode S1 and the first drain electrode D1 of the display area DA, and may be formed concurrently (e.g., simultaneously) therewith. That is, the first data pattern DAT1 may include the source and drain electrodes of the first to seventh thin-film transistors ST1, ST2, ST3, ST4, ST5, ST6, and ST7, and the first pad layer PAD_1.

The first pad layer PAD_1 may include metal. For example, the first pad layer PAD_1 may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The second pad layer PAD_2 may be disposed on the first insulating layer ILD1 on which the first pad layer PAD_1 has been formed. The second pad layer PAD_2 of each of the plurality of pads PAD may be arranged side by side and spaced from each other in the second direction DR2 and may expose the first insulating layer ILD1. The second pad layer PAD_2 may be formed to be around (e.g., surround) the first pad layer PAD_1 and may be connected (e.g., electrically connected) to the first pad layer PAD_1. A width of the second pad layer PAD_2 may become smaller as the second pad layer PAD_2 extends toward one side in the third direction DR3. However, the present disclosure is not limited thereto.

The second pad layer PAD_2 may include the same material as that of the first connection electrode CNE1 of the display area DA, and may be formed concurrently (e.g., simultaneously) therewith. That is, the second gate pattern GAT2 may include the connection electrode connected (e.g., electrically connected) to the source electrode or the drain electrode of the first to seventh thin-film transistors ST1 to ST7, and the second pad layer PAD_2.

The second pad layer PAD_2 may include metal. For example, the second pad layer PAD_2 may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The second via insulating layer VIA2 may be disposed in the sub-area SR and on the first insulating layer ILD1 on which the first pad layer PAD_1 and the second pad layer PAD_2 have been disposed. In the sub-area SR, the first via insulating layer VIA1 may be omitted. The second via insulating layer VIA2 may be disposed to partially expose a face (or a top face) of one side in the third direction DR3 of the second pad layer PAD_2. That is, the second via insulating layer VIA2 may partially cover a face (or a top face) of one side in the third direction DR3 of the second pad layer PAD_2.

The first inorganic layer IOL_1 of the thin-film encapsulation layer TFE may be disposed on the second via insulating layer VIA2. That is, in the sub-area SR, the light-emitting element LEL and the pixel defining film PDL of the display area DA may be omitted. A dimension in the third direction DR3 (hereinafter, referred to as 'thickness') of the first inorganic layer IOL_1 may be 2000 Å. However, the present disclosure is not limited thereto.

The second inorganic layer IOL_2 of the thin-film encapsulation layer TFE may be disposed on the first inorganic layer IOL_1. That is, in the sub-area SR, the organic layer of the thin-film encapsulation layer TFE may be omitted. A dimension in the third direction DR3 (hereinafter, referred to as 'thickness') of the second inorganic layer IOL_2 may be 2000 Å. However, the present disclosure is not limited thereto.

The touch insulating layer TIL of the touch layer TSL may be disposed on the second inorganic layer IOL_2. That is, in the sub-area SR, the touch buffer layer TBF, the first touch conductive layer TCL_1, and the touch protective layer TGL of the touch layer STL may be omitted. A dimension in the third direction DR3 (hereinafter, referred to as 'thickness') of the touch insulating layer TIL may be 3300 Å. However, the present disclosure is not limited thereto.

The third pad layer PAD_3 may be disposed on the touch insulating layer TIL. The third pad layers PAD_3 of the plurality of pads PAD may be spaced from each other in the second direction DR2. The third pad layer PAD_3 may be connected (e.g., electrically connected) to the second pad layer PAD_2 via a contact hole extending through the first inorganic layer IOL_1, the second inorganic layer IOL_2, and the touch insulating layer TIL.

The third pad layer PAD_3 may include the same material as that of the second touch conductive layer TCL_2 of the touch layer TSL, and may be formed concurrently (e.g., simultaneously) therewith. The third pad layer PAD_3 may include metal.

A dimension in the third direction DR3 (hereinafter, referred to as 'thickness') of the third pad layer PAD_3 may be 3100 Å. However, the present disclosure is not limited thereto. In some embodiments, the third pad layer PAD_3 may be connected (e.g., electrically connected) to the contact terminal CT of the circuit board CB via an anisotropic conductive film.

Referring to FIG. 6 and FIG. 7, the pad PAD may have a width in the first direction DR1 (hereinafter, referred to as 'first width W1') and a width in the second direction DR2 (hereinafter, referred to as 'second width W2').

The light-blocking layer 1000 may have a width in the first direction DR1 and a width in the second direction DR2 respectively equal to the first width W1 and the second width W2 of the pad PAD. Specifically, the light-blocking layer 1000 may have a width in the first direction DR1 and a width in the second direction DR2 by which each of the first pad layer PAD_1 and the second pad layer PAD_2 contacts the first insulating layer ILD1. That is, the light-blocking layer may have a first width W1 and a second width W2 in a plan view. However, the present disclosure is not limited thereto.

At least a portion of an edge of the pad PAD may be aligned with a portion of an edge of the light-blocking layer. When the light-blocking layer 1000 has the first width W1 and the second width W2 in a plan view, the number of the light-blocking layers 1000 may be equal to the number of the pads PAD disposed in the sub-area SR. Further, both opposing edges in the first direction DR1 and both opposing edges in the second direction DR2 of the light-blocking layer 1000 may be aligned with both opposing edges in the first direction DR1 and both opposing edges in the second direction DR2 of the pad PAD, respectively. Thus, the light-blocking layer 1000 may overlap (e.g., entirely overlap) the pad PAD in the third direction DR3.

Under this configuration, in the display device 1 according to the embodiment of FIG. 1, when forming the first semiconductor pattern ACTP1, the light-blocking layer 1000 in the sub-area SR may be formed concurrently (e.g., simultaneously) therewith, thereby simplifying a manufacturing process thereof. Further, the lift-off of the insulating layer caused by the laser used in the process of cutting one side end (e.g., one side or end) of the sub-area SR may be prevented or reduced.

Hereinafter, other embodiments of the display device 1 will be described. In following embodiments, the same reference numerals refer to the same component in the previously described embodiment, and the redundant description thereof may be omitted or simplified. Differences therebetween will be mainly described.

Figure 9:
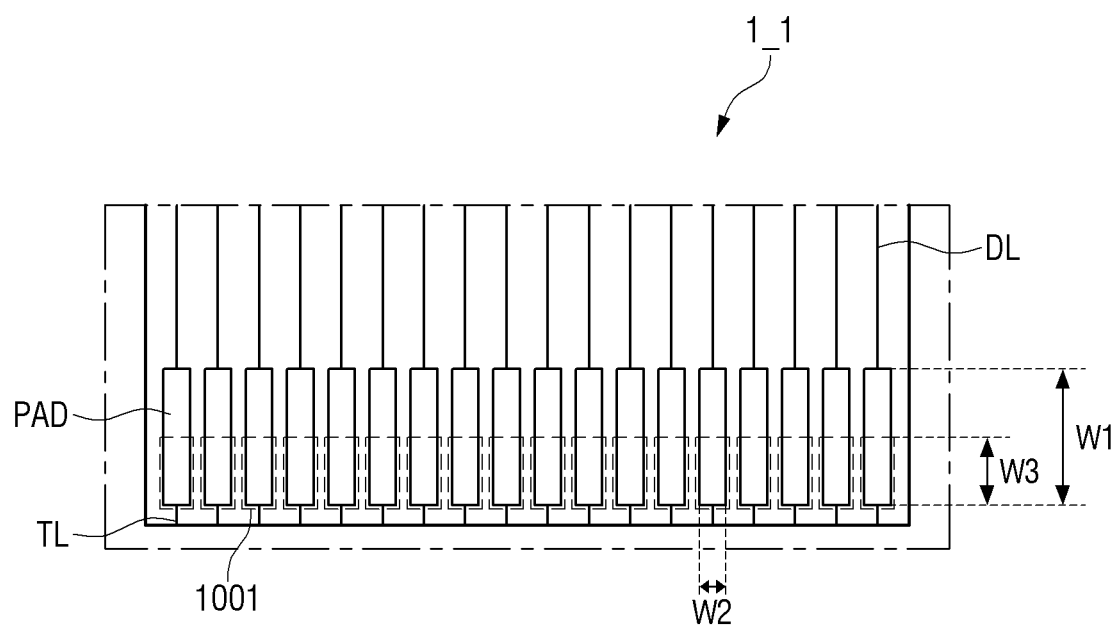
FIG. 9 is a plan view showing a pad and a light-blocking layer of a display device according to another embodiment.
Figure 9:
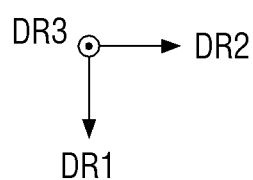

FIG. 9 is a plan view showing a pad and a light-blocking layer of a display device according to another embodiment.

Referring to FIG. 9, in a display device 1_1 according to this embodiment, a width in the first direction DR1 of the light-blocking layer 1001 (hereinafter, referred to as 'third width W3') may be smaller than a first width W1 of the pad PAD. Specifically, the third width W3 of the light-blocking layer 1001 may be equal to at least ½ of the first width W1 of the pad PAD. That is, the light-blocking layer 1001 may extend from one side end (e.g., one side or end) in the first direction DR1 of the pad PAD toward the opposite side in the first direction DR1 thereof by at least ½ of the first width W1 of the pad PAD, and may overlap the pad PAD in the third direction DR3 by at least ½ of the first width W1 of the pad PAD. In some embodiments, the light-blocking layer 1001 may cover or overlap at least ½ of the planar area of the pad PAD in the third direction DR3.

Accordingly, the pad PAD may include a portion that overlaps with the light-blocking layer 1001 and a portion that does not overlap with the light-blocking layer 1001. In this case, the portion of the pad PAD overlapping with the light-blocking layer 1001 may be disposed between the non-overlapping portion of the pad PAD with the light-blocking layer 1001 and an edge of the substrate SUB the sub-area SR and may extend along the first direction DR1.

The lift-off phenomenon of the insulating layer as caused by the laser used in the process of cutting one side end (e.g., one side or end) of the sub-area SR may occur across an area extending from one side end (e.g., one side or end) in the first direction DR1 of the sub-area SR toward the opposite side end (e.g., one side or end) in the first direction DR1 thereof by at least ½ of the first width W1 of the pad PAD. Therefore, the third width W3 of the light-blocking layer 1001 may be equal to at least ½ of the first width W1 of the pad PAD. That is, the light-blocking layer 1001 may extend from one side end (e.g., one side or end) in the first direction DR1 of the pad PAD toward the opposite side in the first direction DR1 thereof by at least ½ of the first width W1 of the pad PAD, and may overlap the pad PAD in the third direction DR3 by at least ½ of the first width W1 of the pad PAD. This may reduce a material amount to form the light-blocking layer 1001.

Figure 10:
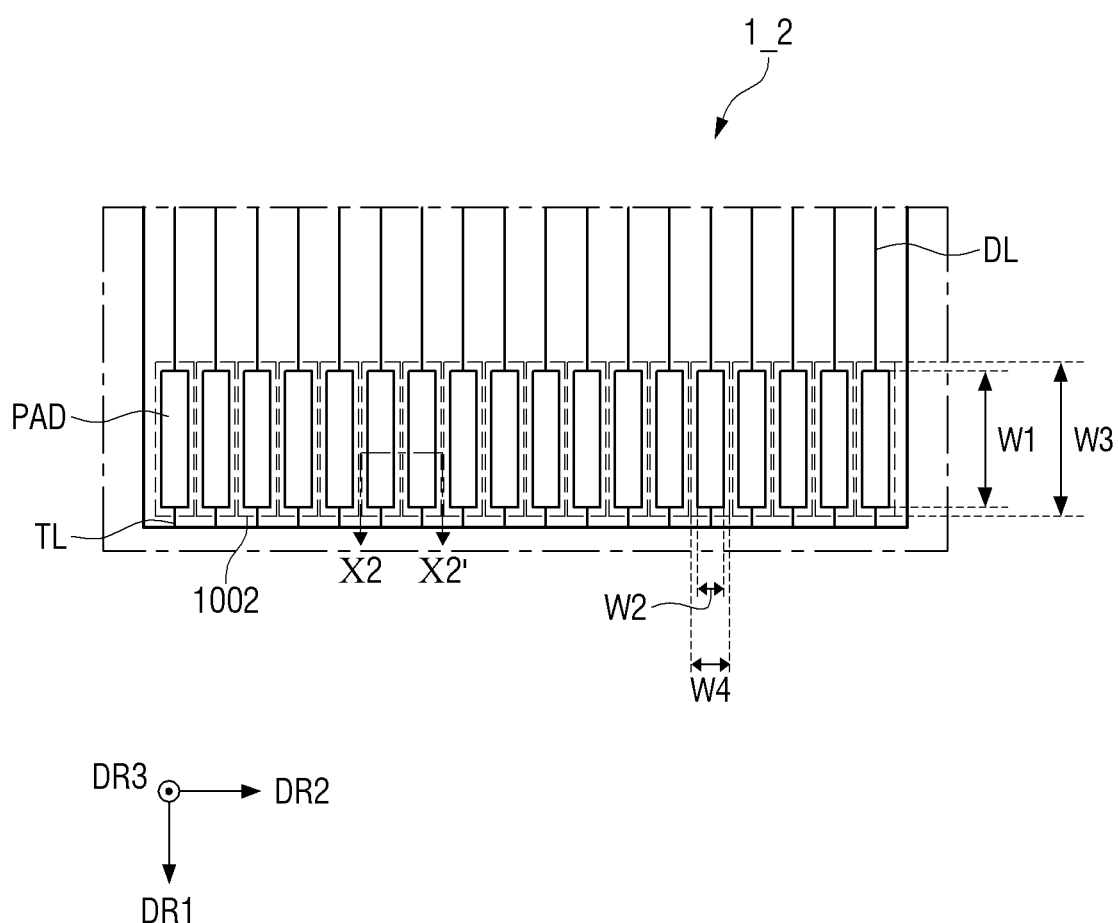
FIG. 10 is a plan view showing a pad and a light-blocking layer of a display device according to still another embodiment.
Figure 11:
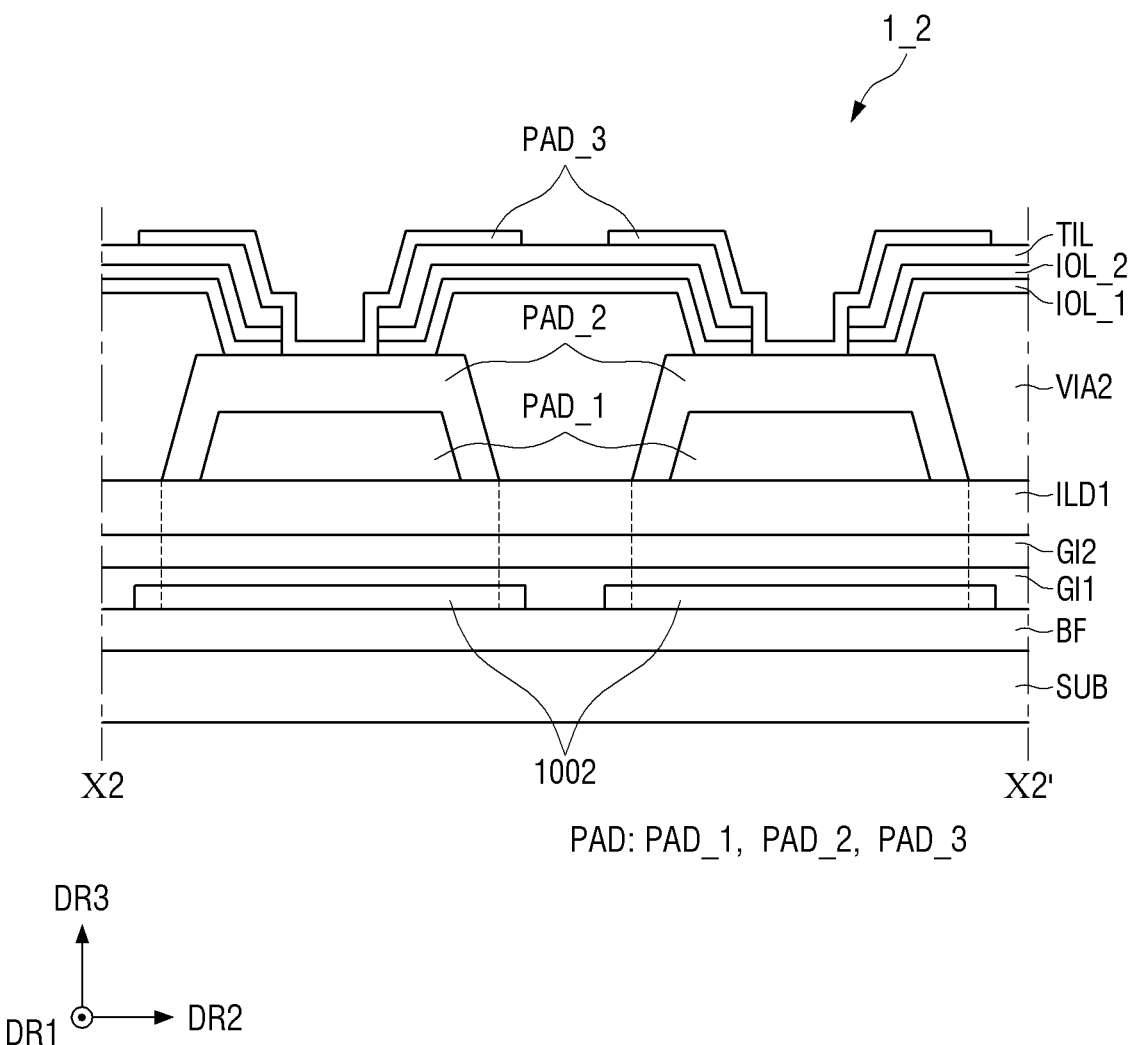
FIG. 11 is a cross-sectional view showing a cross section of a pad of FIG. 10 taken along the line X2-X2'.

FIG. 10 is a plan view showing a pad and a light-blocking layer of a display device according to still yet another embodiment. FIG. 11 is a cross-sectional view showing a cross section of a pad of FIG. 10 taken along the line X2-X2'.

Referring to FIG. 10 and FIG. 11, in a display device 1_2 according to this embodiment, a width in the first direction DR1 (hereinafter, referred to as 'third width W3') and a width in the second direction DR2 (hereinafter, referred to as 'fourth width W4') of the light-blocking layer 1002) may be respectively larger than the first width W1 in the first direction DR1 and the second width W2 in the second direction DR2 of the pad PAD. Specifically, the third width W3 and the fourth width W4 of the light-blocking layer 1002 may be respectively larger than the width in the first direction DR1 and the width in the second direction DR2 of the pad PAD by which each of the first pad layer PAD_1 and the second pad layer PAD_2 contacts the first insulating layer ILD1. A plurality of light-blocking layers 1002 may be disposed between the buffer layer BF and the first gate insulating layer GI1 and may be spaced from each other in the second direction DR2.

Accordingly, the light-blocking layer 1002 may include an overlapping portion and a non-overlapping portion with the pad PAD in the third direction DR3.

The third width W3 and fourth width W4 of the light-blocking layer 1002 may be respectively larger than the width in the first direction DR1 and the width in the second direction DR2 of the pad PAD by which each of the first pad layer PAD_1 and the second pad layer PAD_2 is in contact with the first insulating layer ILD1, thereby more effectively preventing or reducing the lift-off of the insulating layer as caused by the laser used in the process of cutting one side end (e.g., one side or end) of the sub-area SR.

Figure 12:
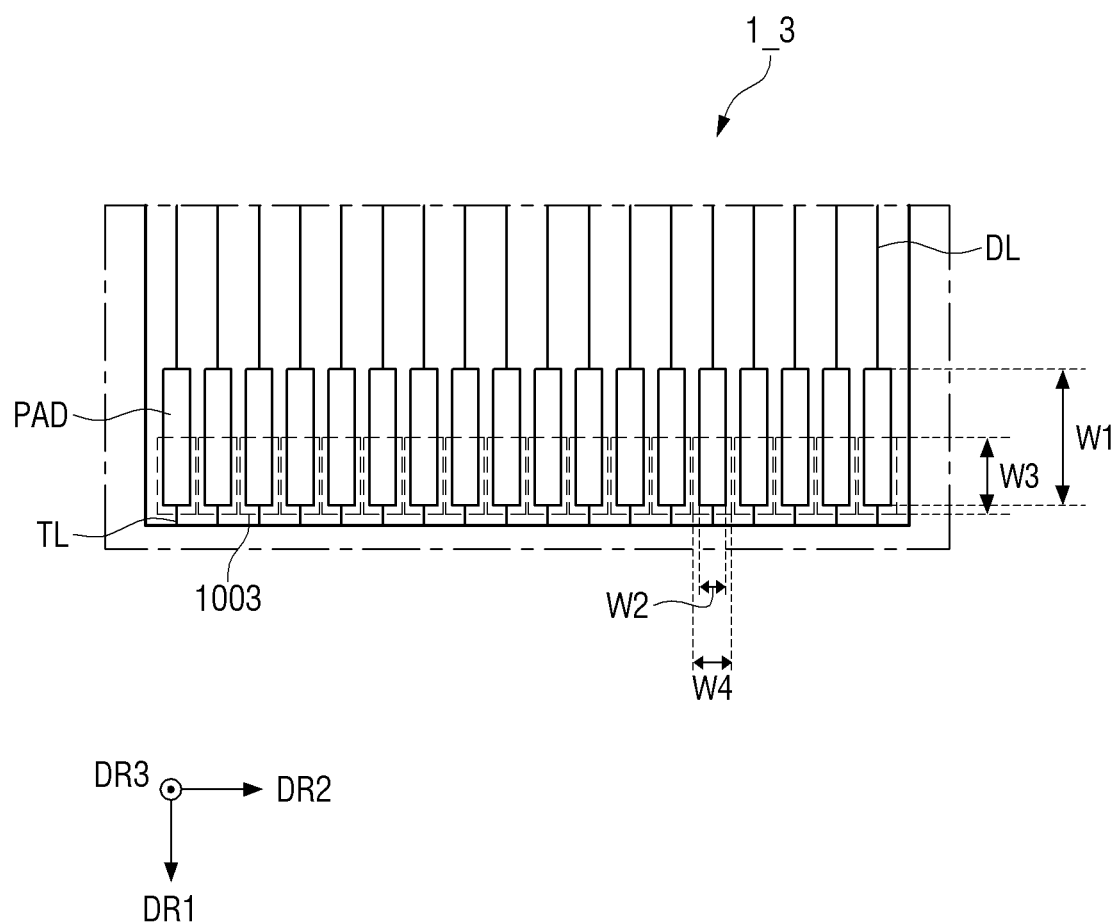
FIG. 12 is a plan view showing a pad and a light-blocking layer of a display device according to still yet another embodiment.

FIG. 12 is a plan view showing a pad and a light-blocking layer of a display device according to still yet another embodiment.

Referring to FIG. 12, a display device 1_3 according to this embodiment is different from that of the embodiment according to FIG. 10 only in that a third width W3 of a light-blocking layer 1003 is equal to at least ½ of the first width W1 of the pad PAD, that is, the light-blocking layer 1003 extends from one side end (e.g., one side or end) in the first direction DR1 of the pad PAD toward the opposite side in the first direction DR1 thereof by at least ½ of the first width W1 of the pad PAD, and overlaps at least ½ of the first width W1 of the pad PAD in the third direction DR3. In some embodiments, the light-blocking layer 1003 may cover or overlap at least ½ of the planar area of the pad PAD in the third direction DR3.

Figure 13:
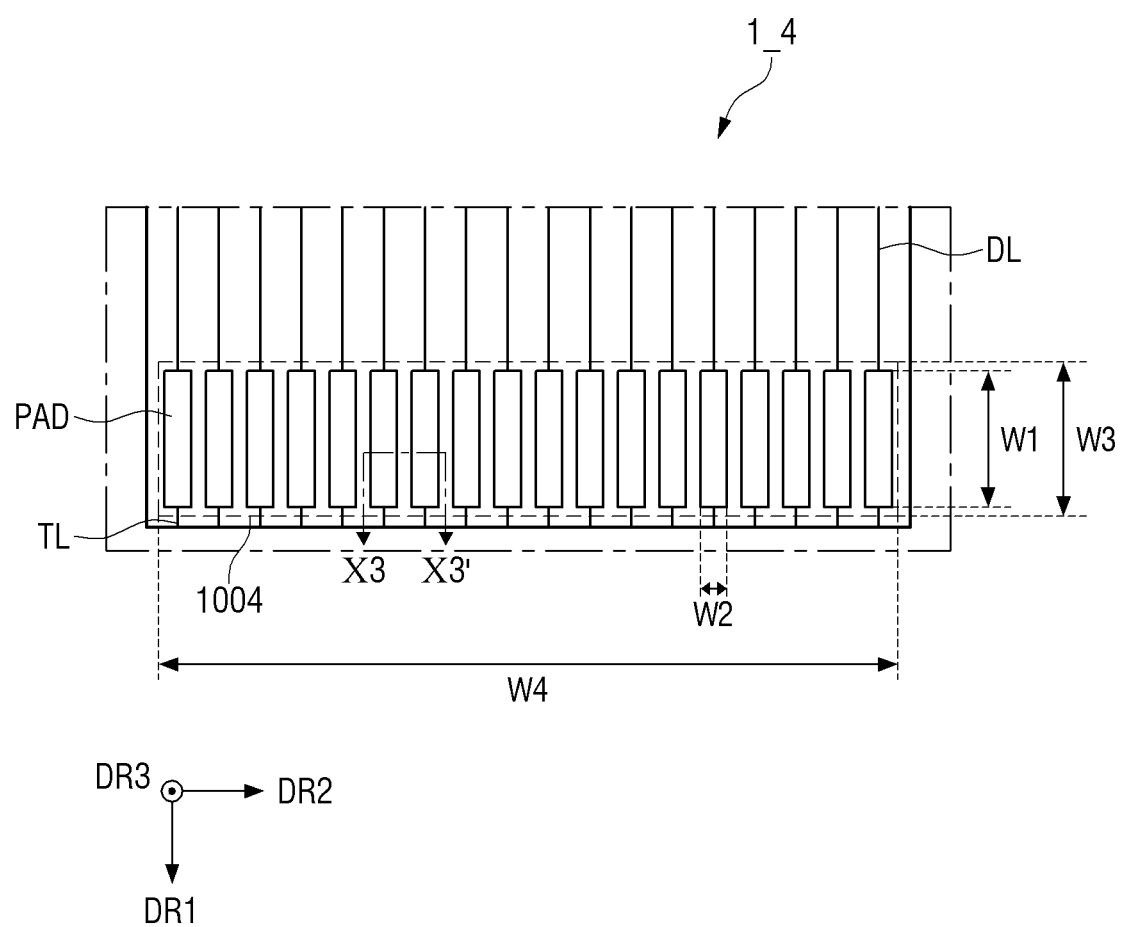
FIG. 13 is a plan view showing a pad and a light-blocking layer of a display device according to still yet another embodiment.
Figure 14:
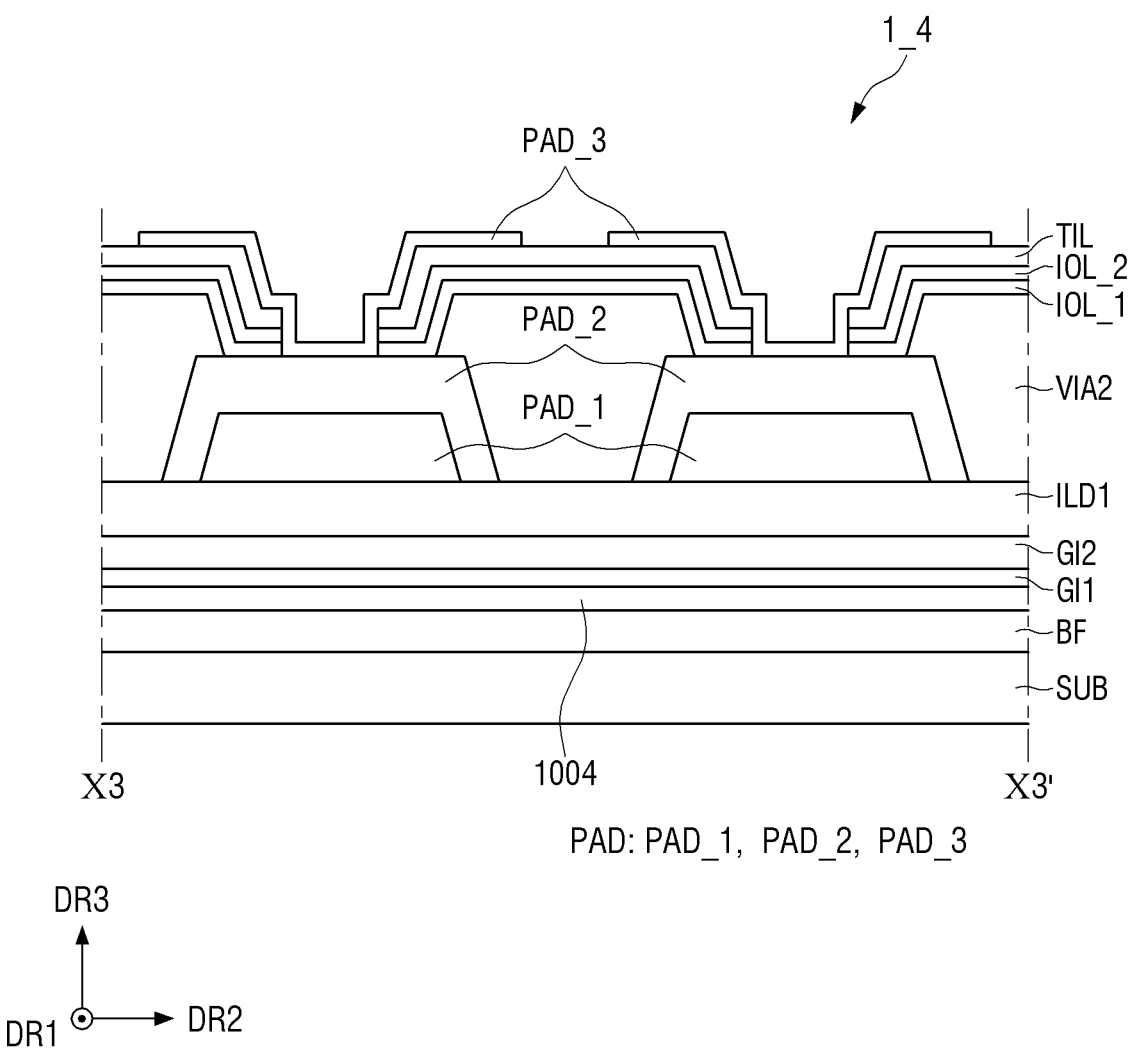
FIG. 14 is a cross-sectional view showing a cross section of a pad of FIG. 13 taken along the line X3-X3'.

FIG. 13 is a plan view showing a pad and a light-blocking layer of a display device according to still yet another embodiment. FIG. 14 is a cross-sectional view showing a cross section of a pad of FIG. 13 taken along the line X3-X3'.

Referring to FIG. 13 and FIG. 14, a light-blocking layer 1004 of a display device 1_4 according to this embodiment may be integrally formed into a single body and may overlap the plurality of pads PAD (e.g., an entirety of all of the plurality of pads PAD) disposed in the sub-area SR. Specifically, the light-blocking layer 1004 may be disposed between the buffer layer BF and the first gate insulating layer GI1 and may continuously extend in the second direction DR2. In this case, the light-blocking layer 1004 may overlap (e.g., overlap in a third direction DR3) not only the plurality of pads PAD but also a portion (e.g., a portion of the display device 1_4) between adjacent ones of the plurality of pads PAD.

The light-blocking layer 1004 may have a rectangular planar shape when viewed in the third direction DR3. However, the present disclosure is not limited thereto. When the light-blocking layer 1004 has the rectangular planar shape, a width in the first direction DR1 (hereinafter, referred to as 'third width W3') and a width in the second direction DR2 (hereinafter, referred to as 'fourth width W4') of the light-blocking layer 1004 may be sized such that the light-blocking layer 1004 may overlap the plurality of pads PAD (e.g., an entirety of all of the plurality of pads PAD). That is, the third width W3 may be larger than the first width W1 of the pad PAD, while the fourth width W4 may be equal to a width in the second direction DR2 of the sub-area SR. However, the present disclosure is not limited thereto.

The light-blocking layer 1004 may be integrally formed into a single body and may overlap (e.g., overlap in a third direction DR3) the plurality of pads PAD (e.g., the entirety of all of the plurality of pads PAD) disposed in the sub-area SR and the portion (e.g., the portion of the display device 1_4) between adjacent ones of the plurality of pads PAD, thereby more effectively preventing or reducing the lift-off of the insulating layer caused by the laser used in the process of cutting one side end (e.g., one side or end) of the sub-area SR.

Figure 15:
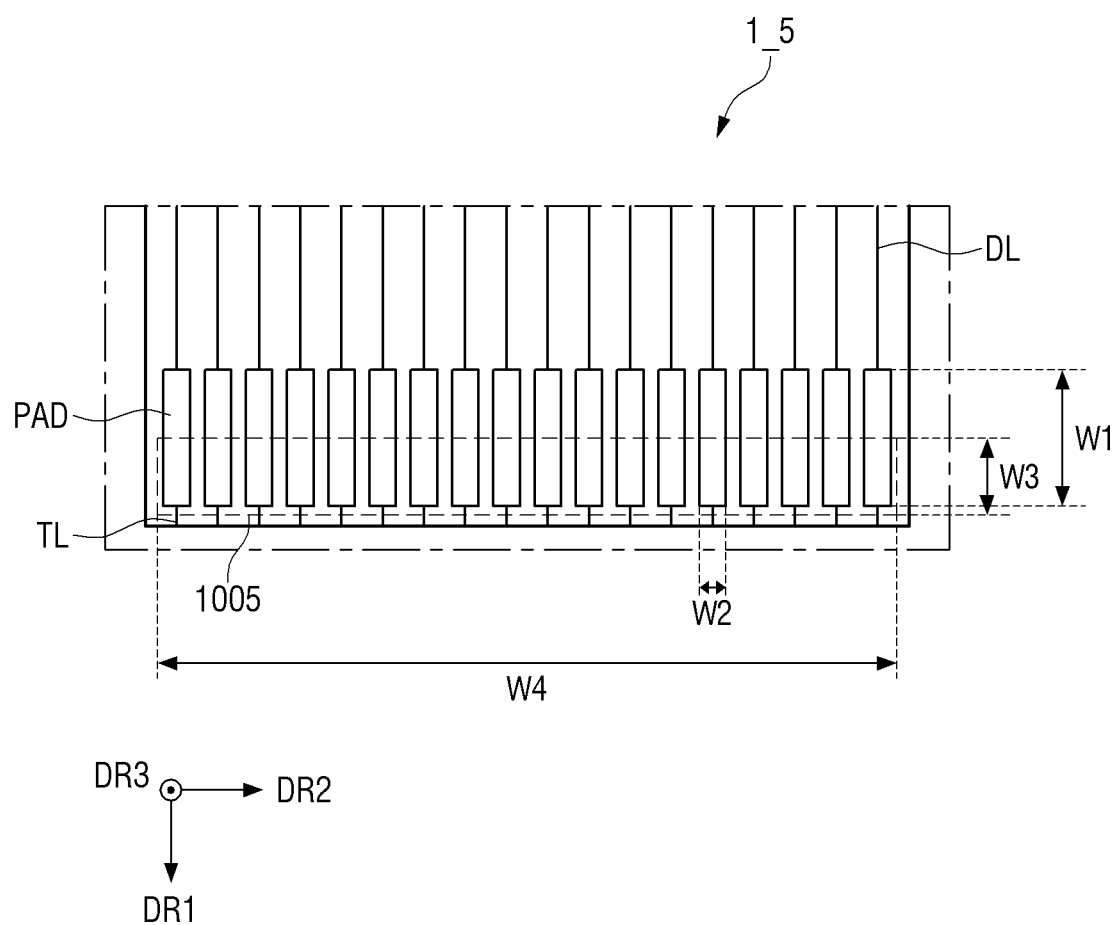
FIG. 15 is a plan view showing a pad and a light-blocking layer of a display device according to still yet another embodiment.

FIG. 15 is a plan view showing a pad and a light-blocking layer of a display device according to still yet another embodiment.

Referring to FIG. 15, a display device 1_5 according to this embodiment is different from the display device 1_4 according to the embodiment of FIG. 13 in that a third width W3 of a light-blocking layer 1005 is equal to at least ½ of the first width W1 of the pad PAD and is less than the first width W1 of the pad PAD. For example, the light-blocking layer 1005 extends from one side end (e.g., one side or end) in the first direction DR1 of the pad PAD toward the opposite side in the first direction DR1 thereof by at least ½ of the first width W1 of the pad PAD, and overlaps at least ½ of the first width W1 of the pad PAD in the third direction DR3. In some embodiments, the light-blocking layer 1005 may cover or overlap at least ½ of the planar area of the pad PAD in the third direction DR3.

Figure 16:
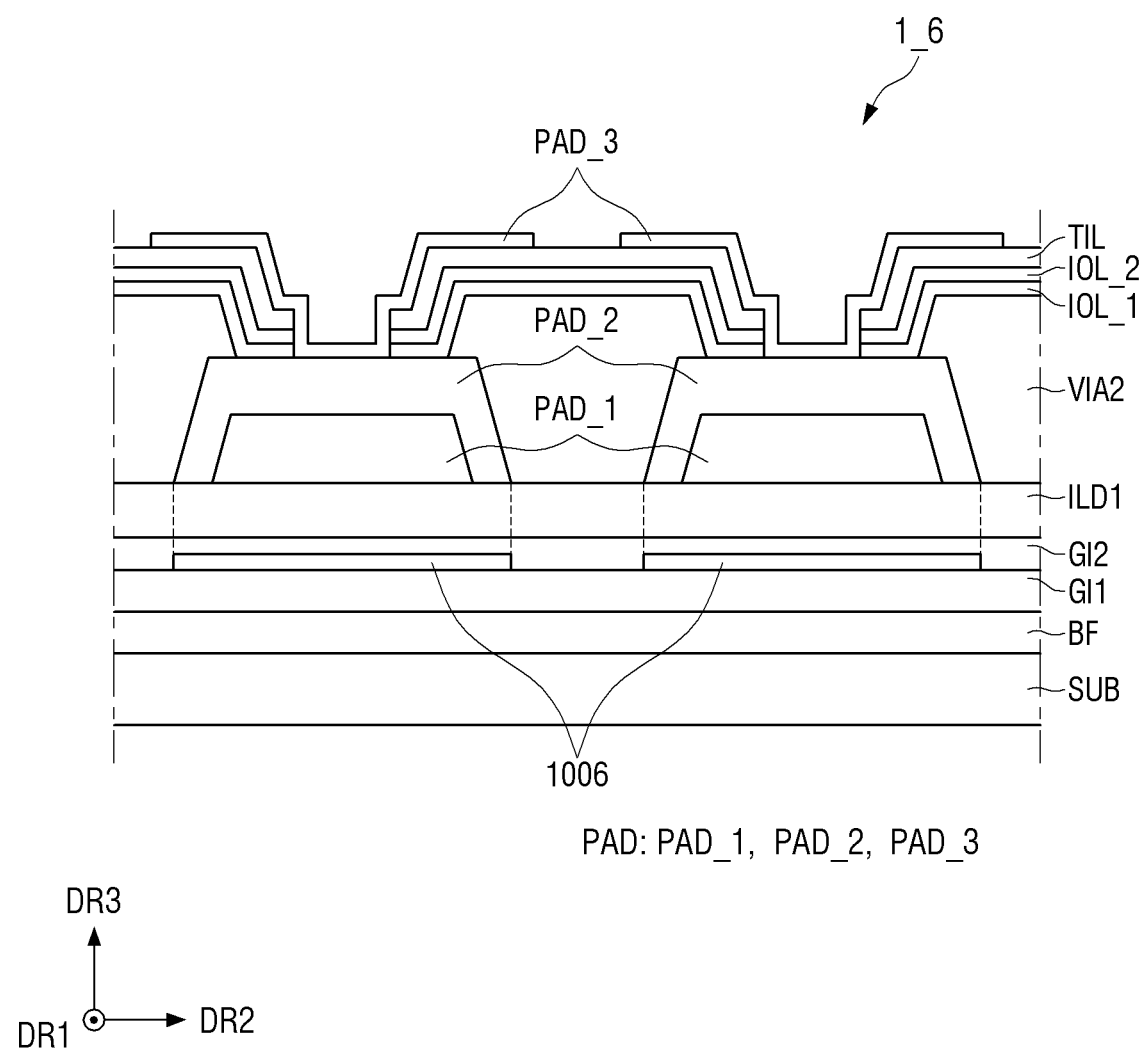
FIG. 16 is a structure diagram showing a structure in a sub-area of a display device according to still yet another embodiment.

FIG. 16 is a structure diagram showing a structure in a sub-area of a display device according to still yet another embodiment.

Referring to FIG. 16, a light-blocking layer 1006 of a display device 1_6 according to this embodiment may be received in the first gate pattern GAT1. Specifically, the light-blocking layer 1006 may include the same material as that of each of the first gate electrode G1 and the second gate electrode G2 of the display area DA, and may be formed concurrently (e.g., simultaneously) therewith.

The light-blocking layer 1006 according to this embodiment may be disposed between the first gate insulating layer GI1 and the second gate insulating layer GI2. The light-blocking layer 1006 may include metal. For example, the light-blocking layer 1006 may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). Accordingly, the laser used in the process of cutting one side end (e.g., one side or end) of the sub-area SR may be reflected from the light-blocking layer 1006 and thus may not reach the pad PAD, such that the lift-off phenomenon of the insulating layer may be prevented or reduced.

In some embodiments, a width in the first direction DR1 of the light-blocking layer 1006 is equal to at least ½ of a width in the first direction DR1 of the pad PAD, that is, the light-blocking layer 1006 extends from one side end (e.g., one side or end) in the first direction DR1 of the pad PAD toward the opposite side in the first direction DR1 thereof by at least ½ of the width in the first direction DR1 of the pad PAD, and overlaps at least ½ of the width in the first direction DR1 of the pad PAD in the third direction DR3. In some embodiments, the light-blocking layer 1006 may cover or overlap at least ½ of the planar area of the pad PAD in the third direction DR3.

Figure 17:
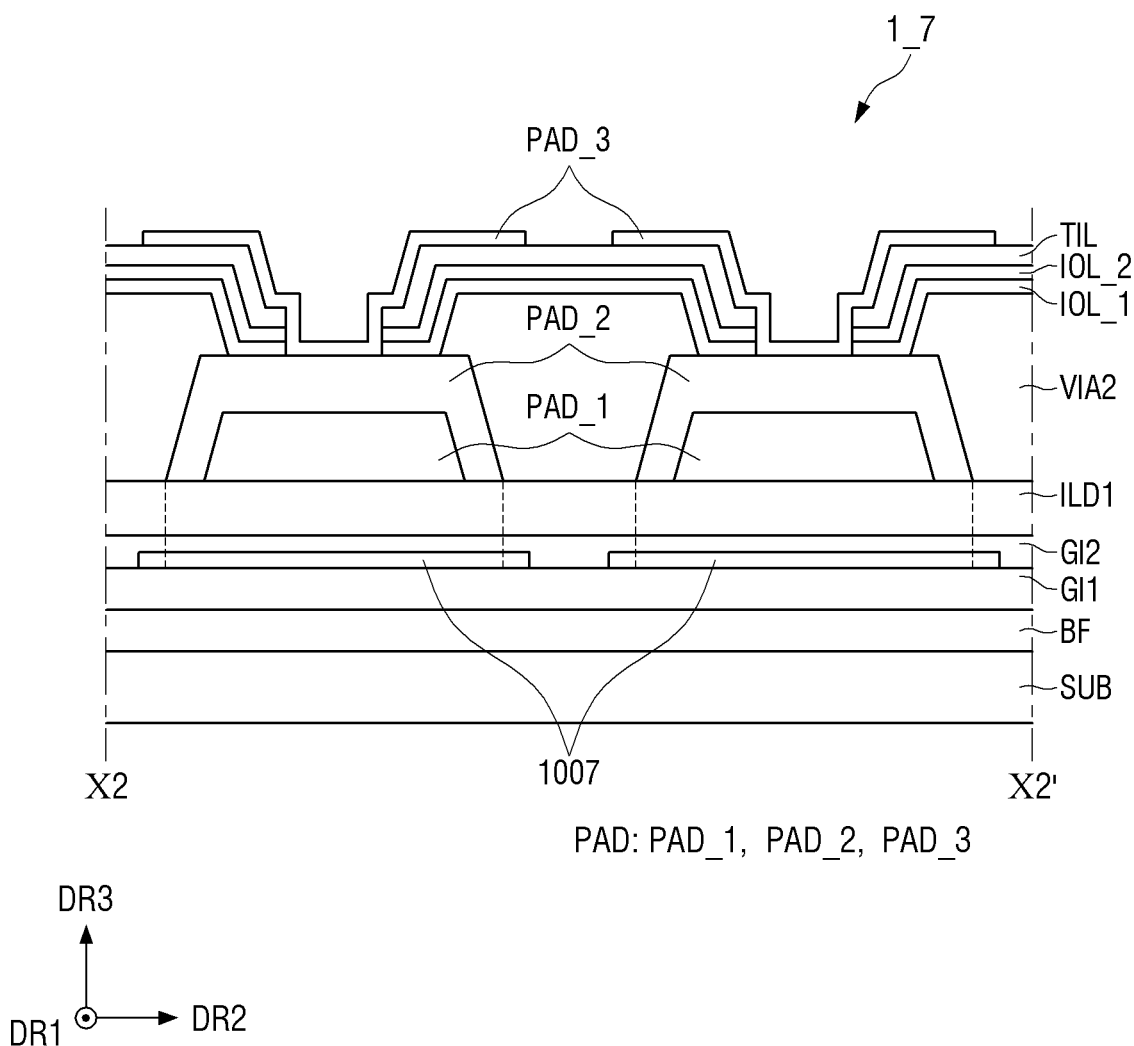
FIG. 17 is a structure diagram showing a structure in a sub-area of a display device according to still yet another embodiment.

FIG. 17 is a structure diagram showing a structure in a sub-area of a display device according to still yet another embodiment.

Referring to FIG. 17, a display device 1_7 according to this embodiment is different from the display device 1_6 according to the embodiment in FIG. 16 in that a width in the first direction DR1 and a width in the second direction DR2 of the light-blocking layer 1007 may be respectively larger than the width in the first direction DR1 and the width in the second direction DR2 of the pad PAD. Specifically, the width in the first direction DR1 and the width in the second direction DR2 of the light-blocking layer 1007 may be respectively greater than the width in the first direction DR1 and the width in the second direction DR2 by which each of the first pad layer PAD_1 and the second pad layer PAD_2 contacts the first insulating layer ILD1.

In some embodiments, a width in the first direction DR1 of the light-blocking layer 1007 is equal to at least ½ of a width in the first direction DR1 of the pad PAD, that is, the light-blocking layer 1007 extends from one side end (e.g., one side or end) in the first direction DR1 of the pad PAD toward the opposite side in the first direction DR1 thereof by at least ½ of the width in the first direction DR1 of the pad PAD, and overlaps the pad PAD in the third direction DR3 by at least ½ of the width in the first direction DR1 of the pad PAD. In some embodiments, the light-blocking layer 1007 may cover or overlap at least ½ of the planar area of the pad PAD in the third direction DR3.

Figure 18:
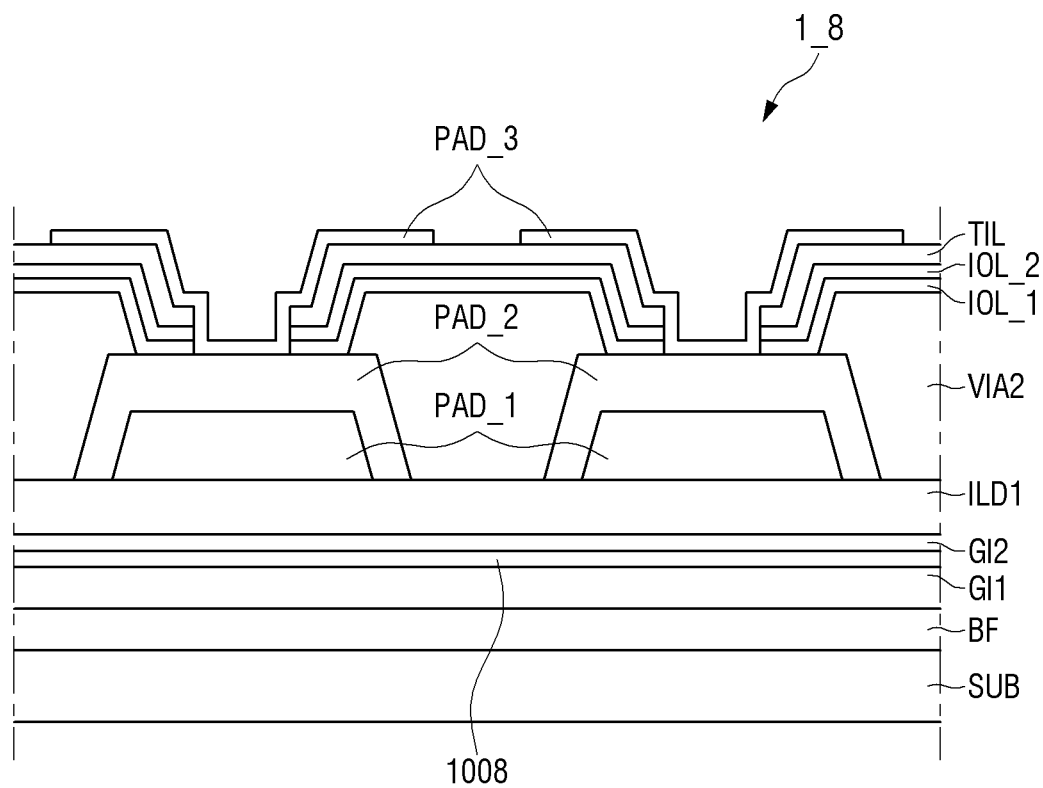
FIG. 18 is a structure diagram showing a structure in a sub-area of a display device according to still yet another embodiment.
Figure 18:
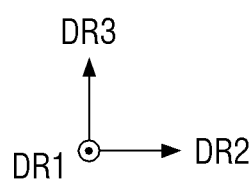

FIG. 18 is a structure diagram showing a structure in a sub-area of a display device according to still yet another embodiment.

Referring to FIG. 18, a display device 1_8 according to this embodiment is different from the display device 1_6 according to the embodiment in FIG. 16 in that a light-blocking layer 1008 may be integrally formed into a single body and thus may overlap (e.g., overlap in the third direction DR3) the plurality of pads PAD (e.g., an entirety of all of the plurality of pads PAD) arranged in the sub-area SR. Specifically, the light-blocking layer 1008 may continuously extend in the second direction DR2 and may be disposed between the first gate insulating layer GI1 and the second gate insulating layer GI2. The light-blocking layer 1008 may have a rectangular planar shape when viewed in the third direction DR3. However, the present disclosure is not limited thereto.

In some embodiments, a width in the first direction DR1 of the light-blocking layer 1008 is equal to at least ½ of a width in the first direction DR1 of the pad PAD, that is, the light-blocking layer 1008 extends from one side end (e.g., one side or end) in the first direction DR1 of the pad PAD toward the opposite side in the first direction DR1 thereof by at least ½ of the width in the first direction DR1 of the pad PAD, and overlaps the pad PAD in the third direction DR3 by at least ½ of the width in the first direction DR1 of the pad PAD. In some embodiments, the light-blocking layer 1008 may cover or overlap at least ½ of the planar area of the pad PAD in the third direction DR3.

Figure 19:
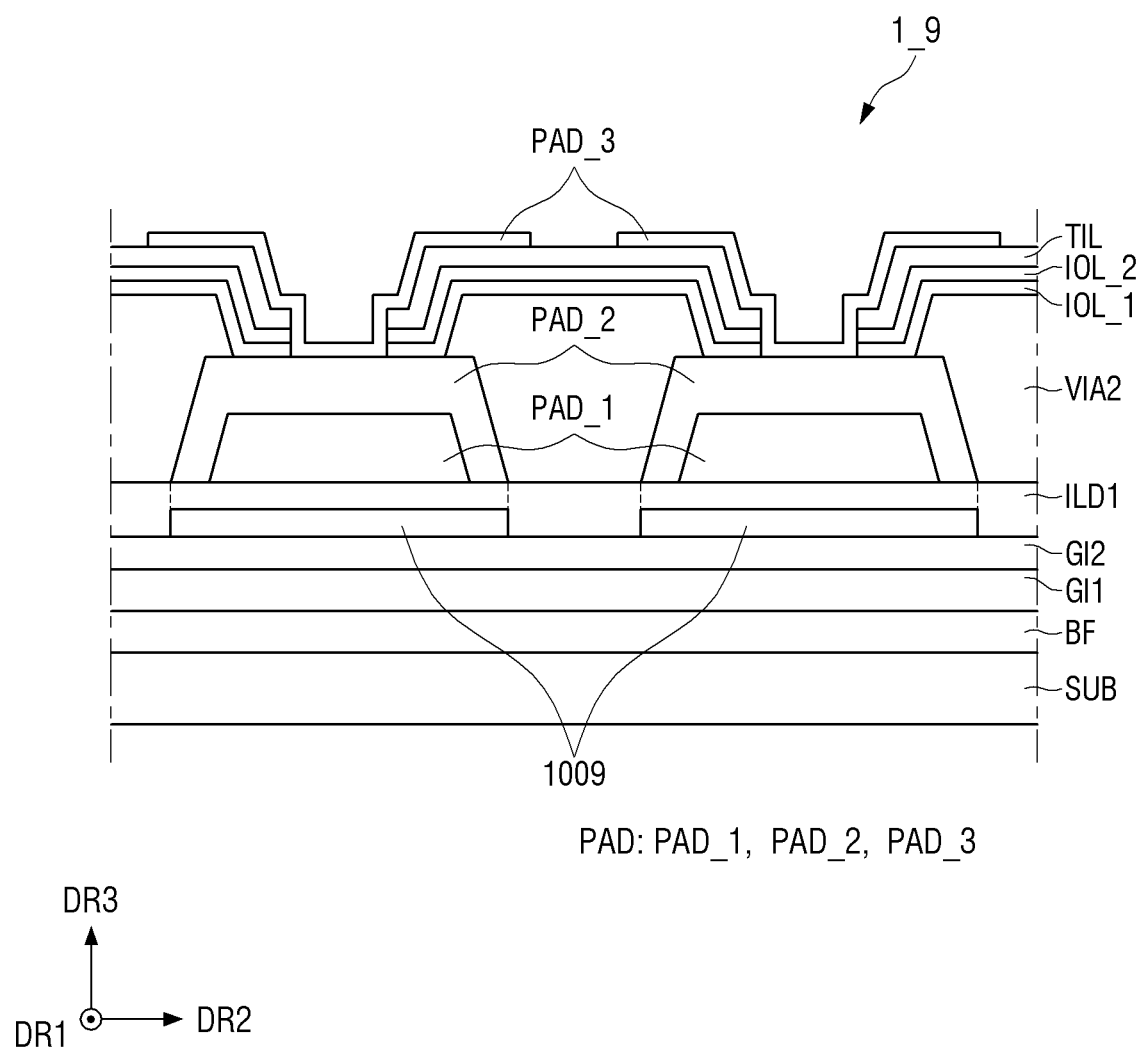
FIG. 19 is a structure diagram showing a structure in a sub-area of a display device according to still yet another embodiment.

FIG. 19 is a structure diagram showing a structure in a sub-area of a display device according to still yet another embodiment.

Referring to FIG. 19, a light-blocking layer 1009 of a display device 1_9 according to this embodiment may be received in the second gate pattern GAT2. Specifically, the light-blocking layer 1009 may include the same material as that of each of the first capacitor electrode CP_1 and the second capacitor electrode CP_2 of the display area DA, and may be formed concurrently (e.g., simultaneously) therewith.

The light-blocking layer 1009 according to this embodiment may be disposed on the second gate insulating layer GI2 and the first insulating layer ILD1. The light-blocking layer 1009 may include metal. For example, the light-blocking layer 1009 may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). Accordingly, the laser used in the process of cutting one side end (e.g., one side or end) of the sub-area SR may be reflected from the light-blocking layer 1009 and thus may not reach the pad PAD, such that the lift-off phenomenon of the insulating layer may be prevented or reduced.

In some embodiments, a width in the first direction DR1 of the light-blocking layer 1009 is equal to at least ½ of a width in the first direction DR1 of the pad PAD, that is, the light-blocking layer 1009 extends from one side end (e.g., one side or end) in the first direction DR1 of the pad PAD toward the opposite side in the first direction DR1 thereof by at least ½ of the width in the first direction DR1 of the pad PAD, and overlaps the pad PAD in the third direction DR3 by at least ½ of the width in the first direction DR1 of the pad PAD. In some embodiments, the light-blocking layer 1009 may cover or overlap at least ½ of the planar area of the pad PAD in the third direction DR3.

Figure 20:
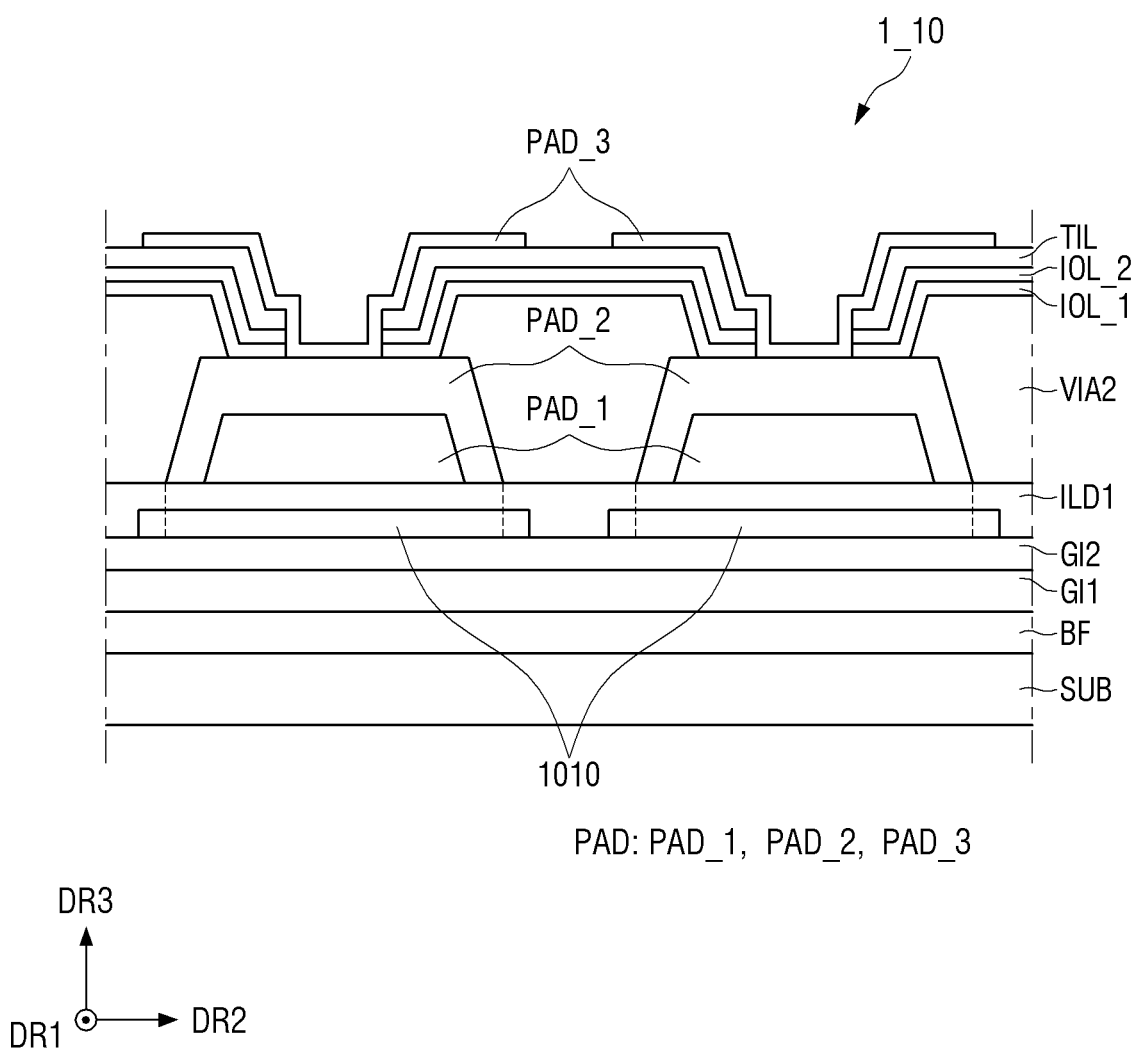
FIG. 20 is a structure diagram showing a structure in a sub-area of a display device according to still yet another embodiment.

FIG. 20 is a structure diagram showing a structure in a sub-area of a display device according to still yet another embodiment.

Referring to FIG. 20, a display device 1_10 according to this embodiment is different from the display device 1_9 according to the embodiment in FIG. 19 in that a width in the first direction DR1 and a width in the second direction DR2 of a light-blocking layer 1010 may be respectively larger than the width in the first direction DR1 and the width in the second direction DR2 of the pad PAD. Specifically, the width in the first direction DR1 and the width in the second direction DR2 of the light-blocking layer 1010 may be respectively greater than the width in the first direction DR1 and the width in the second direction DR2 by which each of the first pad layer PAD_1 and the second pad layer PAD_2 contacts the first insulating layer ILD1. As shown in FIG. 20, the light-blocking layer 1010 may be disposed between the buffer layer BF and the first insulating layer ILD1 and may be spaced from each other in the second direction DR2. In other embodiments, the light-blocking layer 1010 may be disposed between the buffer layer BF and the first gate insulating layer GI1 and may be spaced from each other in the second direction DR2.

In some embodiments, the width in the first direction DR1 of the light-blocking layer 1010 is equal to at least ½ of the width in the first direction DR1 of the pad PAD, that is, the light-blocking layer 1010 extends from one side end (e.g., one side or end) in the first direction DR1 of the pad PAD toward the opposite side in the first direction DR1 thereof by at least ½ of the width in the first direction DR1 of the pad PAD, and overlaps the pad PAD in the third direction DR3 by at least ½ of the width in the first direction DR1 of the pad PAD. In some embodiments, the light-blocking layer 1010 may cover or overlap at least ½ of the planar area of the pad PAD in the third direction DR3.

Figure 21:
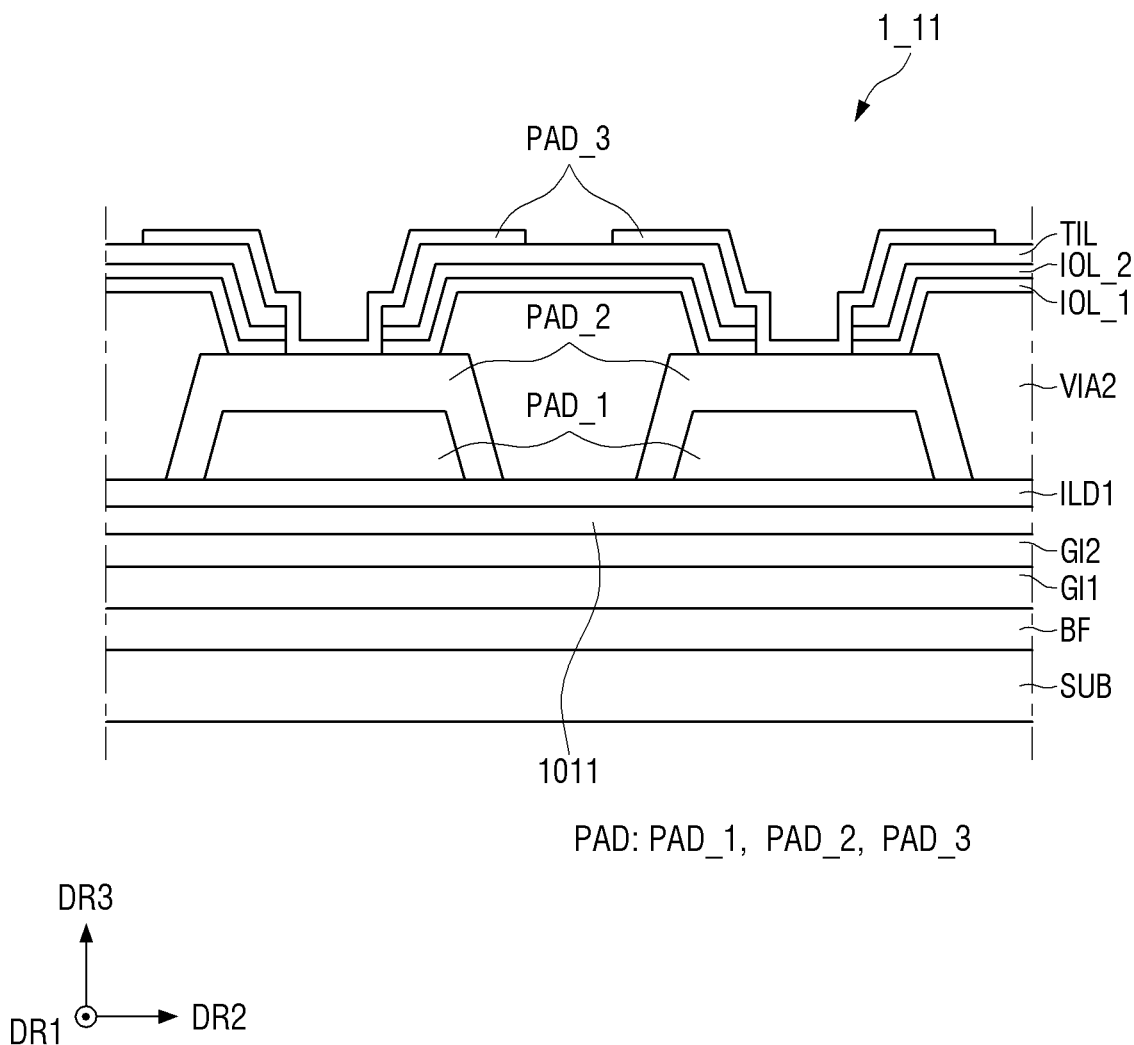
FIG. 21 is a structure diagram showing a structure in a sub-area of a display device according to still yet another embodiment.

FIG. 21 is a structure diagram showing a structure in a sub-area of a display device according to still yet another embodiment.

Referring to FIG. 21, a display device 1_11 according to this embodiment is different from the display device 1_9 according to the embodiment in FIG. 19 in that a light-blocking layer 1011 may be integrally formed into a single body and thus may overlap (e.g., overlap in the third direction DR3) the plurality of pads PAD (e.g., an entirety of all of the plurality of pads PAD) arranged in the sub-area SR. As shown in FIG. 21, the light-blocking layer 1011 may continuously extend in the second direction DR2 and may be disposed between the first gate insulating layer GI1 and the first insulating layer ILD1. In other embodiments, the light-blocking layer 1011 may continuously extend in the second direction DR2 and may be disposed between the first gate insulating layer GI1 and the second gate insulating layer GI2. The light-blocking layer 1011 may have a rectangular planar shape when viewed in the third direction DR3. However, the present disclosure is not limited thereto.

In some embodiments, a width in the first direction DR1 of the light-blocking layer 1011 is equal to at least ½ of a width in the first direction DR1 of the pad PAD, that is, the light-blocking layer 1011 extends from one side end (e.g., one side or end) in the first direction DR1 of the pad PAD toward the opposite side in the first direction DR1 thereof by at least ½ of the width in the first direction DR1 of the pad PAD, and overlaps the pad PAD in the third direction DR3 by at least ½ of the width in the first direction DR1 of the pad PAD. In some embodiments, the light-blocking layer 1011 may cover or overlap at least ½ of the planar area of the pad PAD in the third direction DR3.

In some embodiments, the light-blocking layers 1000 to 1011 according to the above-described embodiments may overlap each other and may be disposed in the sub-area SR. For example, the light-blocking layer 1000 according to the embodiment in FIG. 1 and the light-blocking layer 1006 according to the embodiment in FIG. 16 may overlap each other. Alternatively, the light-blocking layer 1000 according to the embodiment in FIG. 1, the light-blocking layer 1006 according to the embodiment in FIG. 16, and the light-blocking layer 1009 according to the embodiment of FIG. 19 may overlap each other. However, the present disclosure is not limited thereto.

Figure 22:
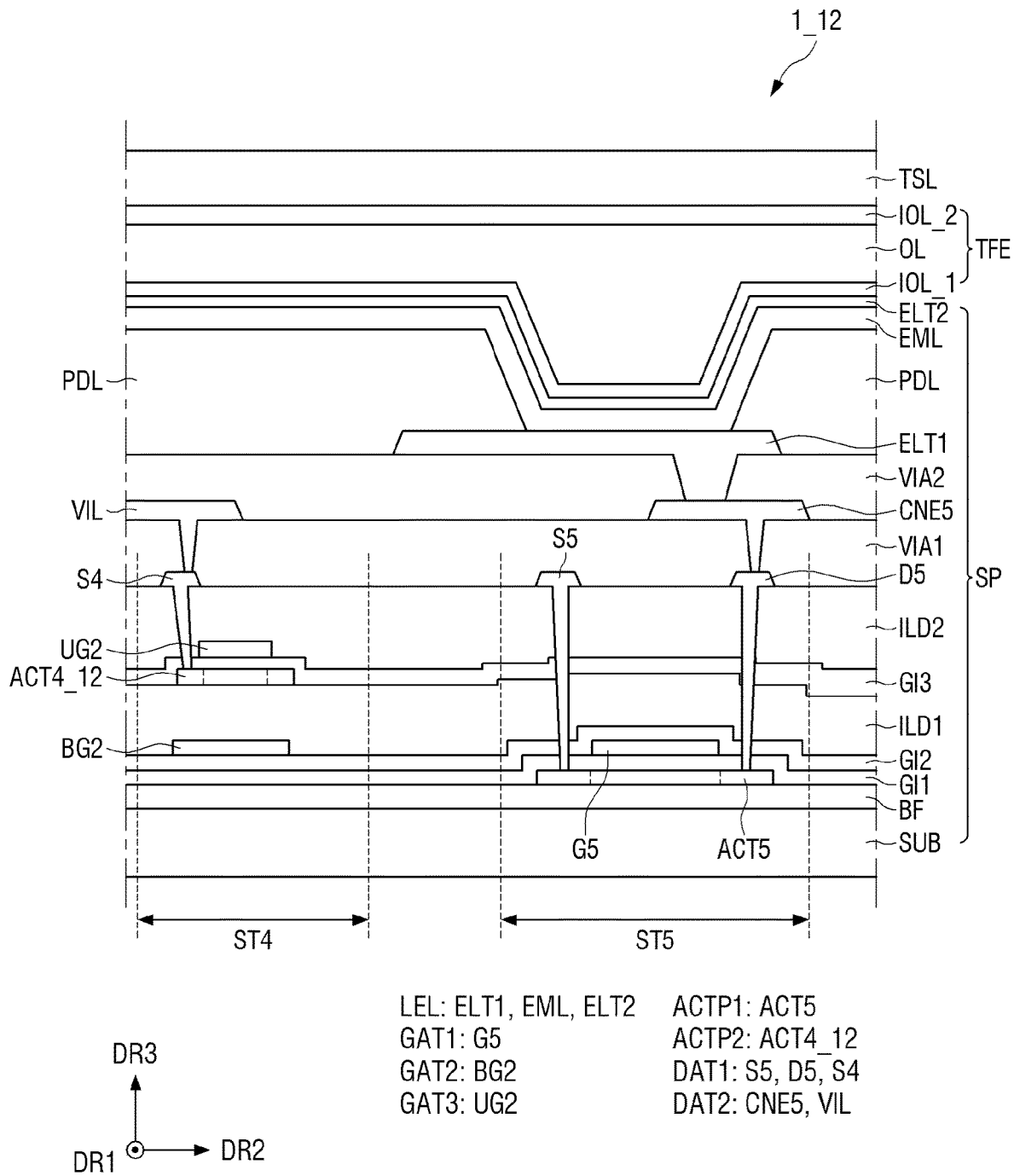
FIG. 22 is a structure diagram showing a structure in a display area of a display device according to still yet another embodiment.
Figure 23:
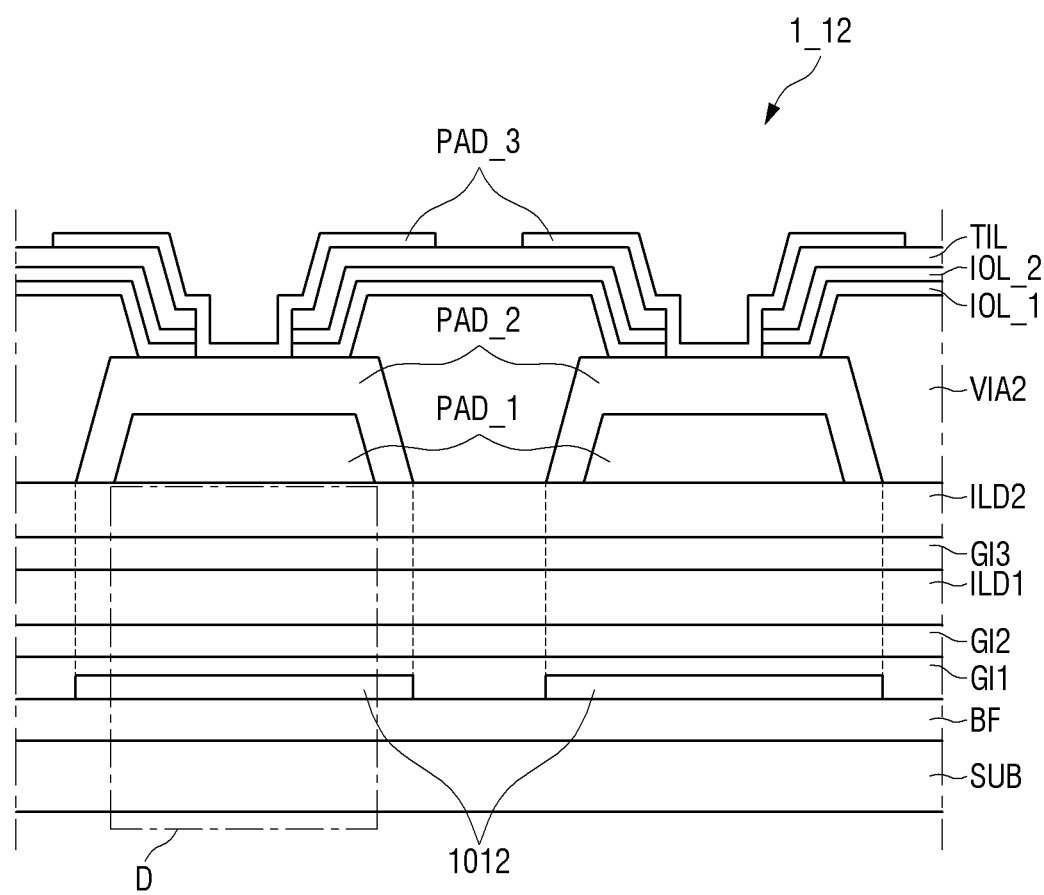
FIG. 23 is a structure diagram showing a structure in a sub-area of a display device according to the embodiment of FIG. 22.
Figure 24:
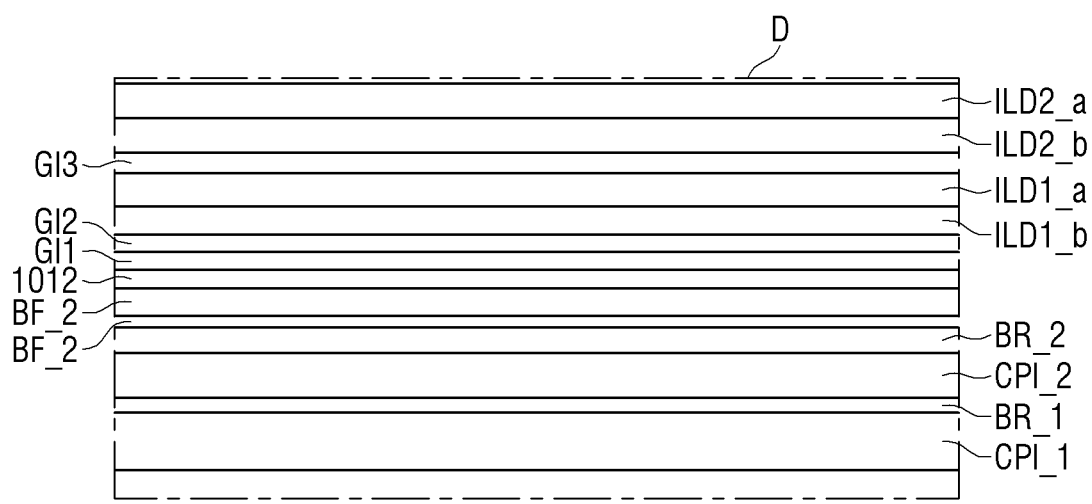
FIG. 24 is an enlarged view of an area D of FIG. 23.
Figure 24:
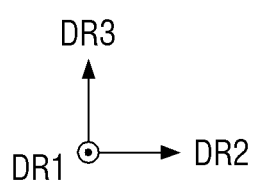

FIG. 22 is a structure diagram showing a structure in a display area of a display device according to still yet another embodiment. FIG. 23 is a structure diagram showing a structure in a sub-area of the display device according to an embodiment of FIG. 22. FIG. 24 is an enlarged view of an area D of FIG. 23.

Referring to FIG. 22 to FIG. 24, a display device 1_12 according to this embodiment is different from the display device 1 according to the embodiment of FIG. 1 in that each of the semiconductor layers of some of the switch elements may be made of oxide. Specifically, in the display device 1_12 according to this embodiment, the semiconductor layer of each of the second thin-film transistor ST2 and the fourth thin-film transistor ST4 may be made of oxide. However, the present disclosure is not limited thereto. Hereinafter, an example in which the semiconductor layer of each of the second thin-film transistor ST2 and the fourth thin-film transistor ST4 is made of oxide will be described.

Referring to FIG. 22, the sub-pixel SP may include a substrate SUB, a buffer layer BF, a first semiconductor pattern ACTP1, a first gate insulating layer GI1, a first gate pattern GAT1, a second gate insulating layer GI2, a second gate pattern GAT2, a first insulating layer ILD1, a second semiconductor pattern ACTP2, a third gate insulating layer GI3, a third gate pattern GAT3, a second insulating layer ILD2, a first data pattern DAT1, a first via insulating layer VIA1, a second data pattern DAT2, and a light-emitting element LEL. That is, the sub-pixel SP according to this embodiment is different from that of the sub-pixel SP according to an embodiment of FIG. 1 in that the second semiconductor pattern ACTP2, the third gate insulating layer GI3, the third gate pattern GAT3, and the second insulating layer ILD2 may be further included in the sub-pixel SP according to this embodiment.

The substrate SUB may act as a base of the display panel PNL, and the buffer layer BF may be disposed on the substrate SUB.

The first semiconductor pattern ACTP1 may be disposed on the buffer layer BF. The first semiconductor pattern ACTP1 may include the semiconductor layers of the first thin-film transistor ST1, the third thin-film transistor ST3, and the fifth thin-film transistor to the seventh thin-film transistors ST5, ST6, and ST7.

The first gate insulating layer GI1 may be disposed on the buffer layer BF on which the first semiconductor pattern ACTP1 has been disposed, and thus may cover the first semiconductor pattern ACTP1.

The first gate pattern GAT1 may be disposed on the first gate insulating layer GI1. The first gate pattern GAT1 may include the gate electrodes of the first thin-film transistor ST1, the third thin-film transistor ST3, and the fifth thin-film transistor to the seventh thin-film transistors ST5, ST6, and ST7. For example, the first gate pattern GAT1 may include the fifth gate electrode G5 of the fifth thin-film transistor ST5.

The second gate insulating layer GI2 may be disposed on the first insulating layer on which the first gate pattern GAT1 has been disposed and thus may cover the first gate pattern GAT1.

The second gate pattern GAT2 may be disposed on the second gate insulating layer GI2. The second gate pattern GAT2 may include the capacitor electrodes of the first thin-film transistor ST1, the third thin-film transistor ST3, the fifth thin-film transistor to the seventh thin-film transistor ST5, ST6, and ST7, and the lower gate electrodes of the second thin-film transistor ST2 and the fourth thin-film transistor ST4. For example, the second gate pattern GAT2 may include a second lower gate electrode BG2 of the fourth thin-film transistor ST4. The second lower gate electrode BG2 may overlap with the fourth semiconductor layer ACT4_12 to be described later in the third direction DR3.

The first insulating layer ILD1 may be disposed on the second gate insulating layer GI2 on which the second gate pattern GAT2 has been formed.

The second semiconductor pattern ACTP2 may be disposed on the first insulating layer ILD1. The second semiconductor pattern ACTP2 may include the semiconductor layers of the second thin-film transistor ST2 and the fourth thin-film transistor ST4. For example, the second semiconductor pattern ACTP2 may include the fourth semiconductor layer ACT4_12 of the fourth thin-film transistor ST4. The fourth semiconductor layer ACT4_12 may include a fourth channel area overlapping with a second upper gate electrode UG2 to be described later in the third direction DR3, a fourth drain area disposed on one side of the fourth channel area, and a fourth source area disposed on the opposite side of the fourth channel area.

The second semiconductor pattern ACTP2 may be made of oxide. The oxide may include one or more oxides selected from G-I-Z-O, zinc (Zn), indium (In), gallium (Ga), tin (Sn), cadmium (Cd), germanium (Ge), hafnium (Hf), or a combination thereof. In some embodiments, the oxide may include at least one of indium-gallium-zinc oxide (IGZO), zinc-tin oxide (ZTO), indium-tin oxide (IZO), and the like.

The third gate insulating layer GI3 may insulate the second semiconductor pattern ACTP2 from the third gate pattern GAT3 to be described later. The third gate insulating layer GI3 may be disposed on the first insulating layer ILD1 on which the second semiconductor pattern ACTP2 has been disposed.

The third gate pattern GAT3 may be disposed on the third gate insulating layer GI3. The third gate pattern GAT3 may include an upper gate electrode of each of the second thin-film transistor ST2 and the fourth thin-film transistor ST4. For example, the third gate pattern GAT3 may include the second upper gate electrode UG2 of the fourth thin-film transistor ST4. In this embodiment, the gate electrode of the fourth thin-film transistor ST4 may be embodied as a double gate electrode structure including the second upper gate electrode UG2 and the second lower gate electrode BG2. The second upper gate electrode UG2 and the second lower gate electrode BG2 may be connected (e.g., electrically connected) to each other.

The third gate pattern GAT3 may be embodied as a third gate conductive layer including metal. For example, the third gate pattern GAT3 may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The second insulating layer ILD2 may planarize the step caused by the third gate pattern GAT3. The second insulating layer ILD2 may be disposed on the third gate insulating layer GI3 on which the third gate pattern GAT3 has been disposed. The second insulating layer ILD2 may include the first insulating inorganic layer ILD2_a and the second insulating inorganic layer ILD2_b as shown in FIG. 24. The first insulating inorganic layer ILD2_a may include silicon oxide $SiO_x$, and a dimension in the third direction DR3 (hereinafter, referred to as 'thickness') thereof may be 3000 Å. However, the present disclosure is not limited thereto. The second insulating inorganic layer ILD2_b may include silicon nitride $SiN_x$, and a dimension in the third direction DR3 (hereinafter, referred to as 'thickness') thereof may be 2000 Å. However, the present disclosure is not limited thereto. A dimension in the third direction DR3 (hereinafter, referred to as 'thickness') of the second insulating layer ILD2 may be equal to a sum of the thickness of the first insulating inorganic layer ILD2_a and the thickness of the second insulating inorganic layer ILD2_b. That is, the thickness of the second insulating layer ILD2 may be 5000 Å. However, the present disclosure is not limited thereto.

The first data pattern DAT1 may be disposed on the second insulating layer ILD2. The first data pattern DAT1 may include the source/drain electrodes of each of the first to seventh thin-film transistors ST1, ST2, ST3, ST4, ST5, ST6, and ST7.

The first via insulating layer VIA1 may be disposed on the second insulating layer ILD2 on which the first data pattern DAT1 has been formed.

The second data pattern DAT2 may be disposed on the first via insulating layer VIA1. The second data pattern DAT2 may include the connection electrode connected (e.g., electrically connected) to the source electrode or drain electrode of each of the first to seventh thin-film transistors ST1, ST2, ST3, ST4, ST5, ST6, and ST7.

An arrangement relationship of each of the second via insulating layer VIA2, the light-emitting element LEL, the thin-film encapsulation layer TFE, and the touch layer is as described in the embodiment of FIG. 1.

Referring to FIG. 23, the display device 1_12 according to this embodiment is different from the display device 1 according to the embodiment of FIG. 1 in that the display device 1_12 may further include the third gate insulating layer GI3 and the second insulating layer ILD2 in the sub-area SR. In some embodiments, in the sub-area SR, the display device 1_12 may include the substrate SUB, the buffer layer BF disposed on the substrate SUB, the light-blocking layer 1012 disposed on the buffer layer BF, the first gate insulating layer GI1 disposed on the buffer layer BF on which the light-blocking layer 1012 has been disposed, the second gate insulating layer GI2 disposed on the first gate insulating layer GI1, the first insulating layer ILD1 disposed on the second gate insulating layer GI2, the third gate insulating layer GI3 disposed on the first insulating layer ILD1, the second insulating layer ILD2 disposed on the third gate insulating layer GI3, and the pad PAD and the second via insulating layer VIA2 disposed on the second insulating layer ILD2.

The light-blocking layer 1012 may be disposed between the buffer layer BF and the first gate insulating layer GI1 and may have substantially the same shape as the planar shape of the pad PAD. The light-blocking layer 1012 may include polycrystalline silicon, and a dimension in the third direction DR3 (hereinafter, referred to as 'thickness') thereof may be 470 Å. However, the present disclosure is not limited thereto. The light-blocking layer 1012 may include the same material as that of the first semiconductor layer ACT1, and may be formed concurrently (e.g., simultaneously) therewith. That is, the first semiconductor pattern ACTP1 may include the semiconductor layers of the first thin-film transistor ST1, the third thin-film transistor ST3, and the fifth thin-film transistor to the seventh thin-film transistor ST5, ST6, and ST7, and the light-blocking layer 1012.

In some embodiments, a width in the first direction DR1 of the light-blocking layer 1012 is equal to at least ½ of a width in the first direction DR1 of the pad PAD, that is, the light-blocking layer 1012 extends from one side end (e.g., one side or end) in the first direction DR1 of the pad PAD toward the opposite side in the first direction DR1 thereof by at least ½ of the width in the first direction DR1 of the pad PAD, and overlaps the pad PAD in the third direction DR3 by at least ½ of the width in the first direction DR1 of the pad PAD. In some embodiments, the light-blocking layer 1012 may cover or overlap at least ½ of the planar area of the pad PAD in the third direction DR3.

Figure 25:
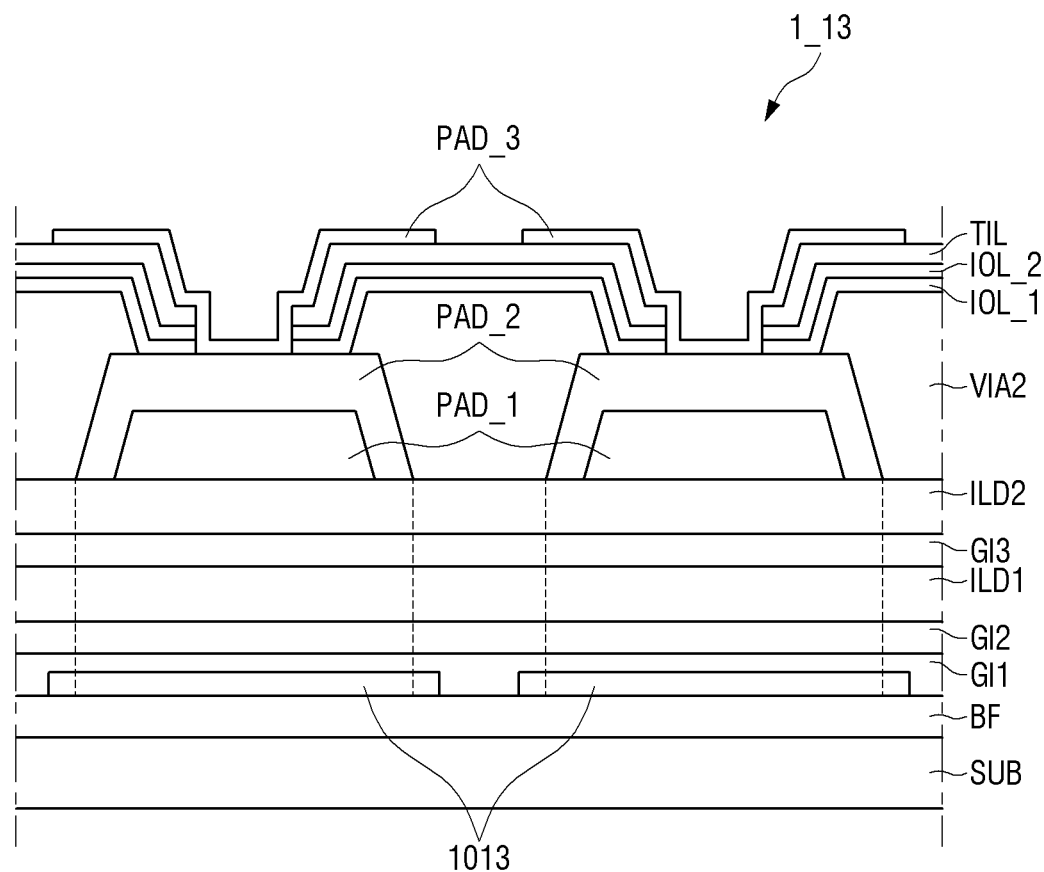
FIG. 25 is a structure diagram showing a structure in a sub-area of a display device according to still yet another embodiment.
Figure 25:
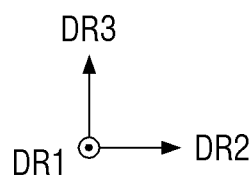

FIG. 25 is a structure diagram showing a structure in a sub-area of a display device according to still yet another embodiment.

Referring to FIG. 25, a display device 1_13 according to this embodiment is different from the display device 1_12 according to the embodiment in FIG. 22 in that a width in the first direction DR1 and a width in the second direction DR2 of a light-blocking layer 1013 may be respectively larger than the width in the first direction DR1 and the width in the second direction DR2 of the pad PAD. Specifically, the width in the first direction DR1 and the width in the second direction DR2 of the light-blocking layer 1013 may be respectively larger than the width in the first direction DR1 and the width in the second direction DR2 by which each of the first pad layer PAD_1 and the second pad layer PAD_2 contacts the second insulating layer ILD2. The light-blocking layer 1013 may be disposed between the buffer layer BF and the first gate insulating layer GI1 and may be spaced from each other in the second direction DR2.

In some embodiments, a width in the first direction DR1 of the light-blocking layer 1013 is equal to at least ½ of a width in the first direction DR1 of the pad PAD, that is, the light-blocking layer 1013 extends from one side end (e.g., one side or end) in the first direction DR1 of the pad PAD toward the opposite side in the first direction DR1 thereof by at least ½ of the width in the first direction DR1 of the pad PAD, and overlaps the pad PAD in the third direction DR3 by at least ½ of the width in the first direction DR1 of the pad PAD. In some embodiments, the light-blocking layer 1013 may cover or overlap at least ½ of the planar area of the pad PAD in the third direction DR3.

Figure 26:
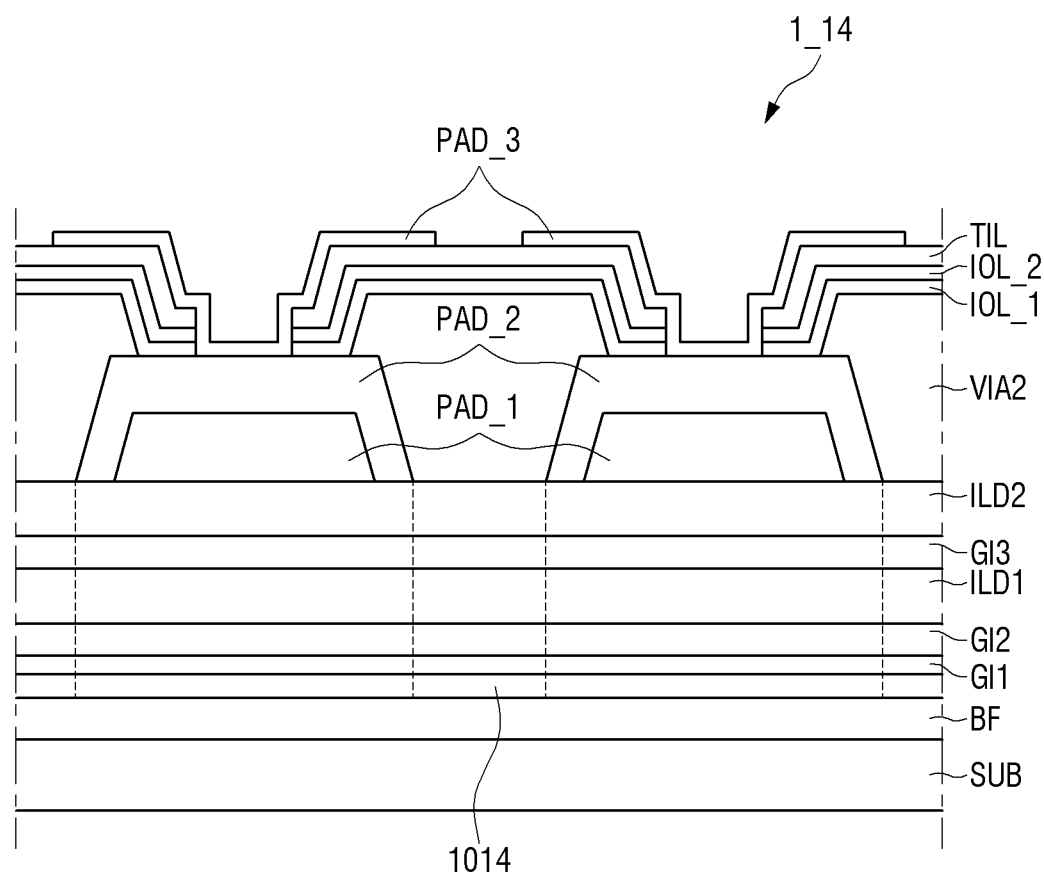
FIG. 26 is a structure diagram showing a structure in a sub-area of a display device according to still yet another embodiment.
Figure 26:
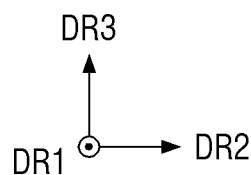

FIG. 26 is a structure diagram showing a structure in a sub-area of a display device according to still yet another embodiment.

Referring to FIG. 26, a display device 1_14 according to this embodiment is different from the display device 1_12 according to the embodiment in FIG. 22 in that the light-blocking layer 1014 may be integrally formed into a single body and thus may overlap (e.g., overlap in the third direction DR3) the plurality of pads PAD (e.g., an entirety of all of the plurality of pads PAD) arranged in the sub-area SR. As shown in FIG. 26, the light-blocking layer 1014 may continuously extend in the second direction DR2 and may be disposed between the buffer layer BF and the first gate insulating layer GI1. In other embodiments, the light-blocking layer 1014 may continuously extend in the second direction DR2 and may be disposed between the first gate insulating layer GI1 and the second gate insulating layer GI2. The light-blocking layer 1014 may have a rectangular planar shape when viewed in the third direction DR3. However, the present disclosure is not limited thereto.

In some embodiments, a width in the first direction DR1 of the light-blocking layer 1014 is equal to at least ½ of a width in the first direction DR1 of the pad PAD, that is, the light-blocking layer 1014 extends from one side end (e.g., one side or end) in the first direction DR1 of the pad PAD toward the opposite side in the first direction DR1 thereof by at least ½ of the width in the first direction DR1 of the pad PAD, and overlaps the pad PAD in the third direction DR3 by at least ½ of the width in the first direction DR1 of the pad PAD. In some embodiments, the light-blocking layer 1014 may cover or overlap at least ½ of the planar area of the pad PAD in the third direction DR3.

Figure 27:
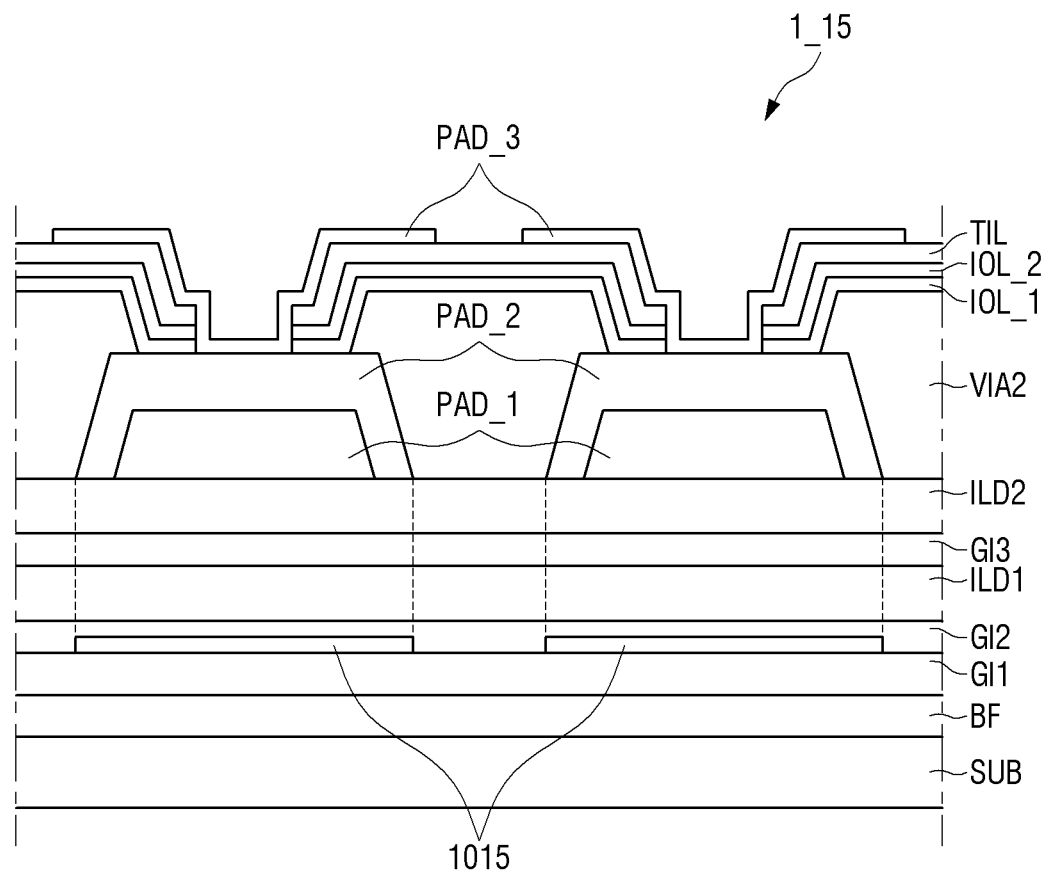
FIG. 27 is a structure diagram showing a structure in a sub-area of a display device according to still yet another embodiment.

FIG. 27 is a structure diagram showing a structure in a sub-area of a display device according to still yet another embodiment.

Referring to FIG. 27, a display device 1_15 according to this embodiment is different from the display device 1_12 according to the embodiment in FIG. 22 in that a light-blocking layer 1015 is received in the first gate pattern GAT1. Specifically, the light-blocking layer 1015 may include the same material as that of the first gate electrode G1 of the display area DA, and may be formed concurrently (e.g., simultaneously) therewith.

The light-blocking layer 1015 according to this embodiment may be disposed between the first gate insulating layer GI1 and the second gate insulating layer GI2. The light-blocking layer 1015 may include metal. For example, the light-blocking layer 1015 may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). Accordingly, the laser used in the process of cutting one side end (e.g., one side or end) of the sub-area SR may be reflected from the light-blocking layer 1015 and thus may not reach the pad PAD, such that the lift-off phenomenon of the insulating layer may be prevented or reduced.

In some embodiments, a width in the first direction DR1 of the light-blocking layer 1015 is equal to at least ½ of a width in the first direction DR1 of the pad PAD, that is, the light-blocking layer 1015 extends from one side end (e.g., one side or end) in the first direction DR1 of the pad PAD toward the opposite side in the first direction DR1 thereof by at least ½ of the width in the first direction DR1 of the pad PAD, and overlaps the pad PAD in the third direction DR3 by at least ½ of the width in the first direction DR1 of the pad PAD. In some embodiments, the light-blocking layer 1015 may cover or overlap at least ½ of the planar area of the pad PAD in the third direction DR3.

Figure 28:
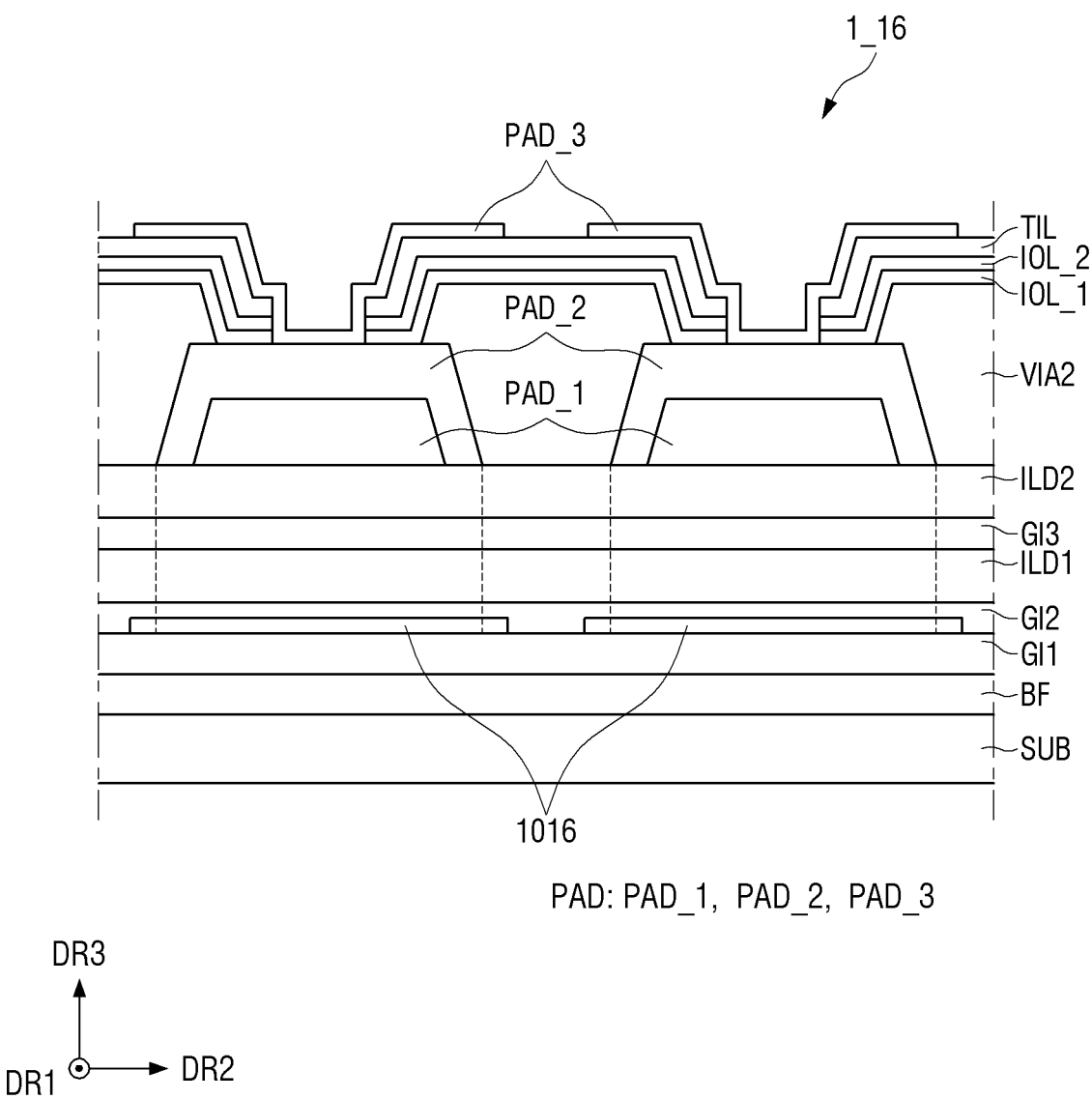
FIG. 28 is a structure diagram showing a structure in a sub-area of a display device according to still yet another embodiment.

FIG. 28 is a structure diagram showing a structure in a sub-area of a display device according to still yet another embodiment.

Referring to FIG. 28, a display device 1_16 according to this embodiment is different from the display device 1_15 according to the embodiment in FIG. 27 in that a width in the first direction DR1 and a width in the second direction DR2 of the light-blocking layer 1016 may be respectively larger than the width in the first direction DR1 and the width in the second direction DR2 of the pad PAD. Specifically, the width in the first direction DR1 and the width in the second direction DR2 of the light-blocking layer 1016 may be respectively larger than the width in the first direction DR1 and the width in the second direction DR2 by which each of the first pad layer PAD_1 and the second pad layer PAD_2 contacts the second insulating layer ILD2. As shown in FIG. 28, the light-blocking layer 1016 may be disposed between the buffer layer BF and the second gate insulating layer GI2 and may be spaced from each other in the second direction DR2. In other embodiments, the light-blocking layer 1016 may be disposed between the buffer layer BF and the first gate insulating layer GI1 and may be spaced from each other in the second direction DR2.

In some embodiments, a width in the first direction DR1 of the light-blocking layer 1016 is equal to at least ½ of a width in the first direction DR1 of the pad PAD, that is, the light-blocking layer 1016 extends from one side end (e.g., one side or end) in the first direction DR1 of the pad PAD toward the opposite side in the first direction DR1 thereof by at least ½ of the width in the first direction DR1 of the pad PAD, and overlaps the pad PAD in the third direction DR3 by at least ½ of the width in the first direction DR1 of the pad PAD. In some embodiments, the light-blocking layer 1016 may cover or overlap at least ½ of the planar area of the pad PAD in the third direction DR3.

Figure 29:
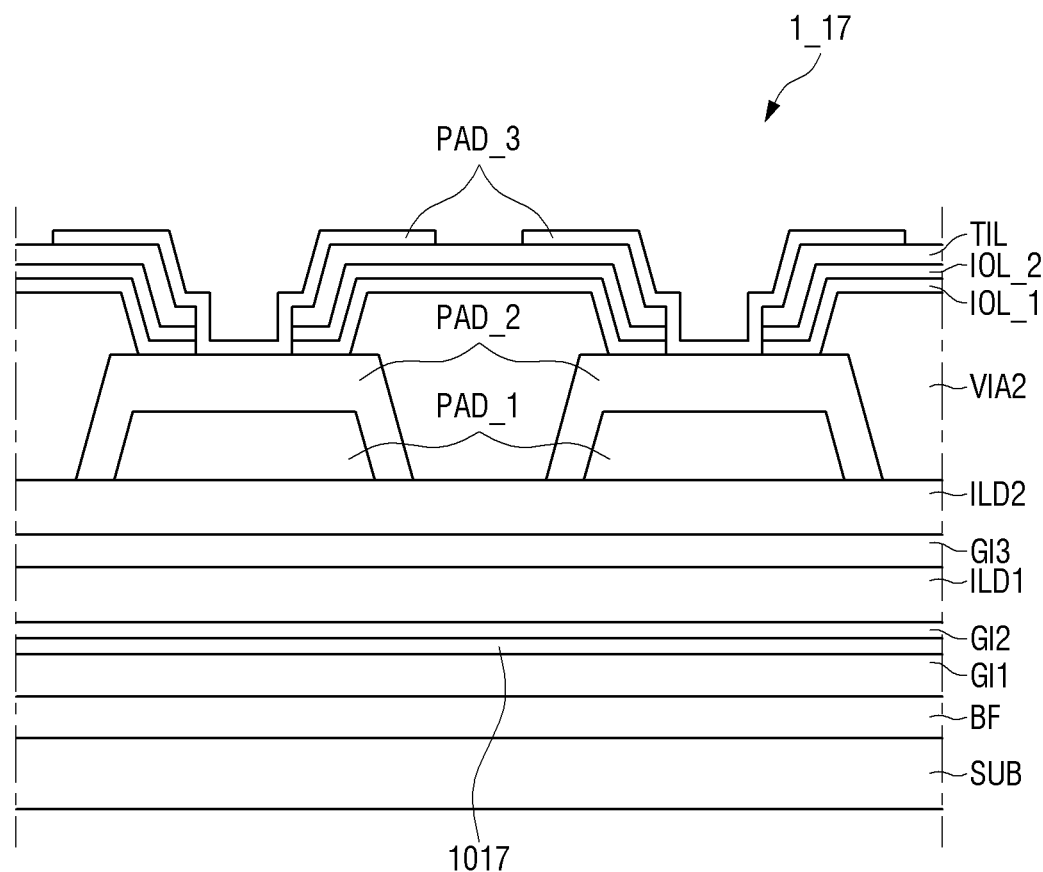
FIG. 29 is a structure diagram showing a structure in a sub-area of a display device according to still yet another embodiment.
Figure 29:
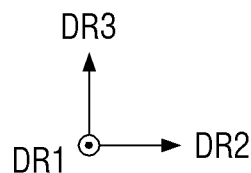

FIG. 29 is a structure diagram showing a structure in a sub-area of a display device according to still yet another embodiment.

Referring to FIG. 29, a display device 1_17 according to this embodiment is different from the display device 1_15 according to the embodiment in FIG. 27 in that the light-blocking layer 1017 may be integrally formed into a single body and thus may overlap (e.g., overlap in the third direction DR3) the plurality of pads PAD (e.g., an entirety of all of the plurality of pads PAD) arranged in the sub-area SR. Specifically, the light-blocking layer 1017 may continuously extend in the second direction DR2 and may be disposed between the first gate insulating layer GI1 and the second gate insulating layer GI2. The light-blocking layer 1017 may have a rectangular planar shape when viewed in the third direction DR3. However, the present disclosure is not limited thereto.

In some embodiments, a width in the first direction DR1 of the light-blocking layer 1017 is equal to at least ½ of a width in the first direction DR1 of the pad PAD, that is, the light-blocking layer 1017 extends from one side end (e.g., one side or end) in the first direction DR1 of the pad PAD toward the opposite side in the first direction DR1 thereof by at least ½ of the width in the first direction DR1 of the pad PAD, and overlaps the pad PAD in the third direction DR3 by at least ½ of the width in the first direction DR1 of the pad PAD. In some embodiments, the light-blocking layer 1017 may cover or overlap at least ½ of the planar area of the pad PAD in the third direction DR3.

Figure 30:
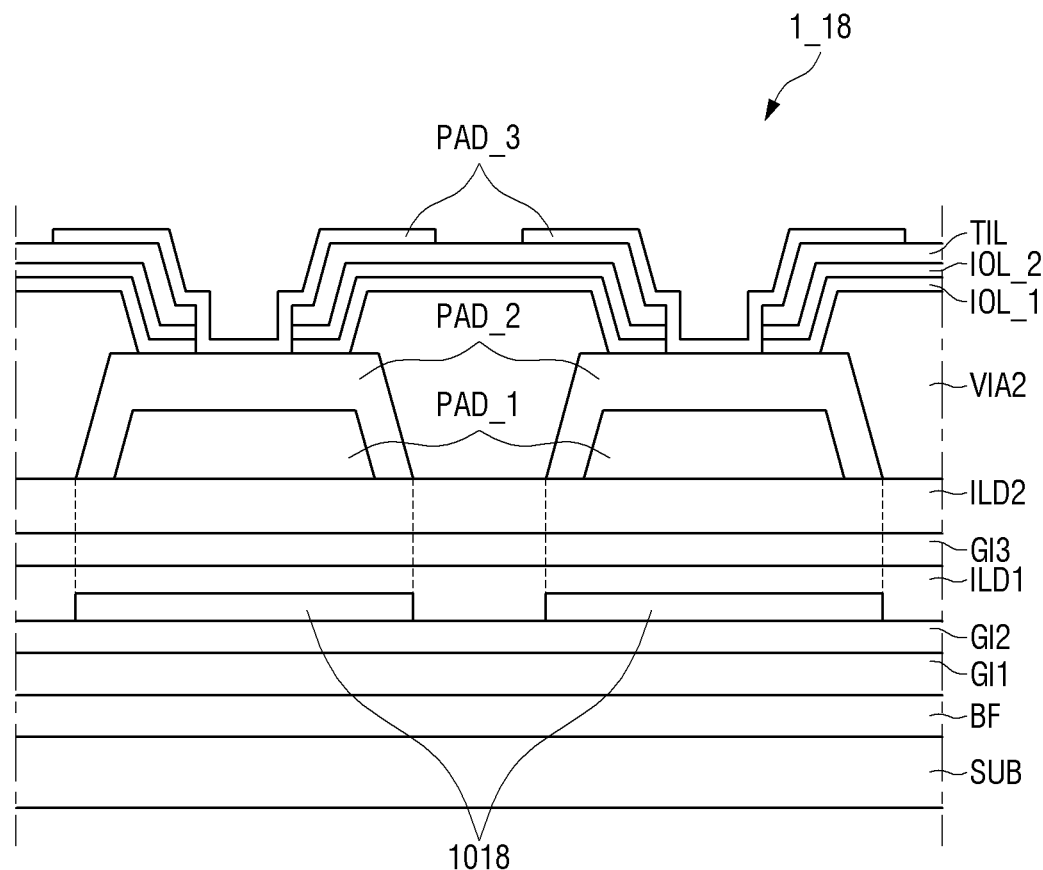
FIG. 30 is a structure diagram showing a structure in a display area of a display device according to still yet another embodiment.

FIG. 30 is a structure diagram showing a structure in a sub-area of a display device according to still yet another embodiment.

Referring to FIG. 30, a display device 1_18 according to this embodiment is different from the display device 1_12 according to the embodiment in FIG. 22 in that a light-blocking layer 1018 is received in the second gate pattern GAT2. Specifically, the light-blocking layer 1018 may include the same material as that of each of the first capacitor electrode CP_1 and the first lower gate electrode BG1 of the display area DA, and may be formed concurrently (e.g., simultaneously) therewith.

The light-blocking layer 1018 according to this embodiment may be disposed between the second gate insulating layer GI2 and the first insulating layer ILD1. The light-blocking layer 1018 may include metal. For example, the light-blocking layer 1018 may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). Accordingly, the laser used in the process of cutting one side end (e.g., one side or end) of the sub-area SR may be reflected from the light-blocking layer 1018 and thus may not reach the pad PAD, such that the lift-off phenomenon of the insulating layer may be prevented or reduced.

In some embodiments, a width in the first direction DR1 of the light-blocking layer 1018 is equal to at least ½ of a width in the first direction DR1 of the pad PAD, that is, the light-blocking layer 1018 extends from one side end (e.g., one side or end) in the first direction DR1 of the pad PAD toward the opposite side in the first direction DR1 thereof by at least ½ of the width in the first direction DR1 of the pad PAD, and overlaps the pad PAD in the third direction DR3 by at least ½ of the width in the first direction DR1 of the pad PAD. In some embodiments, the light-blocking layer 1018 may cover or overlap at least ½ of the planar area of the pad PAD in the third direction DR3.

Figure 31:
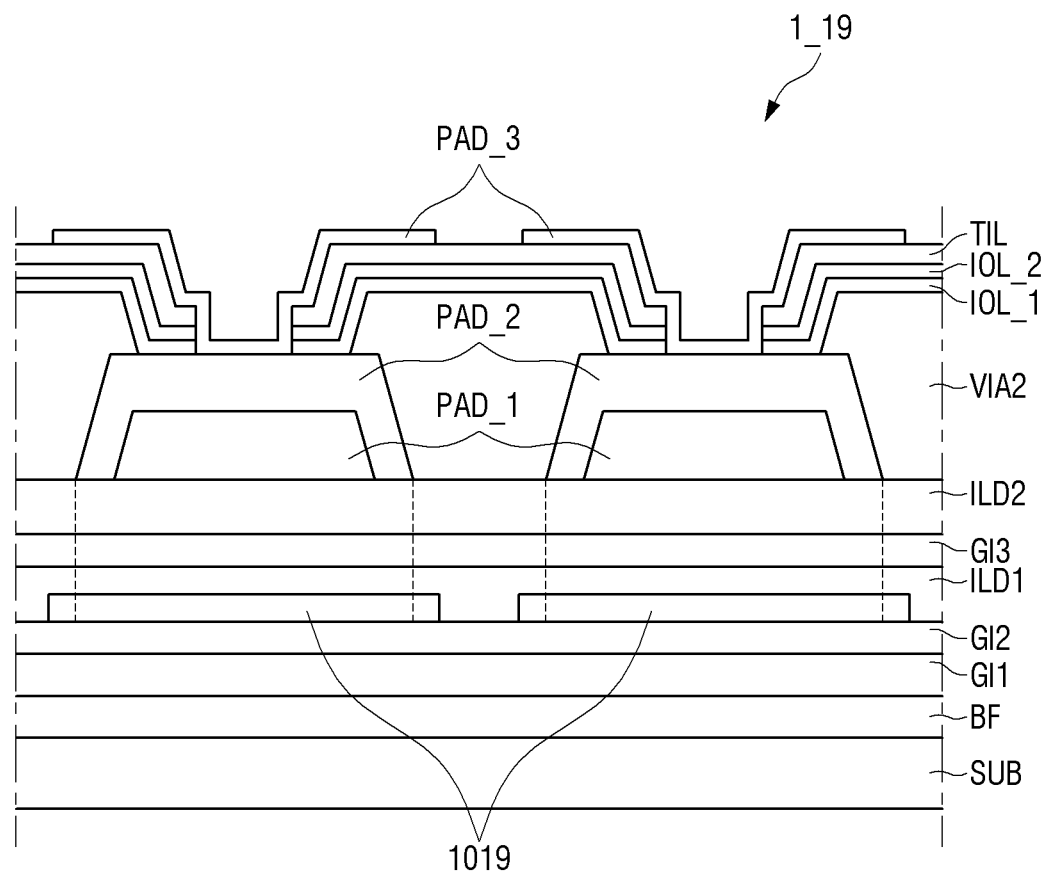
FIG. 31 is a structure diagram showing a structure in a sub-area of a display device according to still yet another embodiment.

FIG. 31 is a structure diagram showing a structure in a sub-area of a display device according to still yet another embodiment.

Referring to FIG. 31, a display device 1_19 according to this embodiment is different from the display device 1_18 according to the embodiment in FIG. 30 in that a width in the first direction DR1 and a width in the second direction DR2 of a light-blocking layer 1019 may be respectively larger than the width in the first direction DR1 and the width in the second direction DR2 of the pad PAD. Specifically, the width in the first direction DR1 and the width in the second direction DR2 of the light-blocking layer 1019 may be respectively larger than the width in the first direction DR1 and the width in the second direction DR2 by which each of the first pad layer PAD_1 and the second pad layer PAD_2 contacts the second insulating layer ILD2. As shown in FIG. 31, the light-blocking layer 1019 may be disposed between the buffer layer BF and the first insulating layer ILD1 and may be spaced apart from each other in the second direction DR2. In other embodiments, the light-blocking layer 1019 may be disposed between the buffer layer BF and the first gate insulating layer GI1 and may be spaced from each other in the second direction DR2.

In some embodiments, a width in the first direction DR1 of the light-blocking layer 1019 is equal to at least ½ of a width in the first direction DR1 of the pad PAD, that is, the light-blocking layer 1019 extends from one side end (e.g., one side or end) in the first direction DR1 of the pad PAD toward the opposite side in the first direction DR1 thereof by at least ½ of the width in the first direction DR1 of the pad PAD, and overlaps the pad PAD in the third direction DR3 by at least ½ of the width in the first direction DR1 of the pad PAD. In some embodiments, the light-blocking layer 1019 may cover or overlap at least ½ of the planar area of the pad PAD in the third direction DR3.

Figure 32:
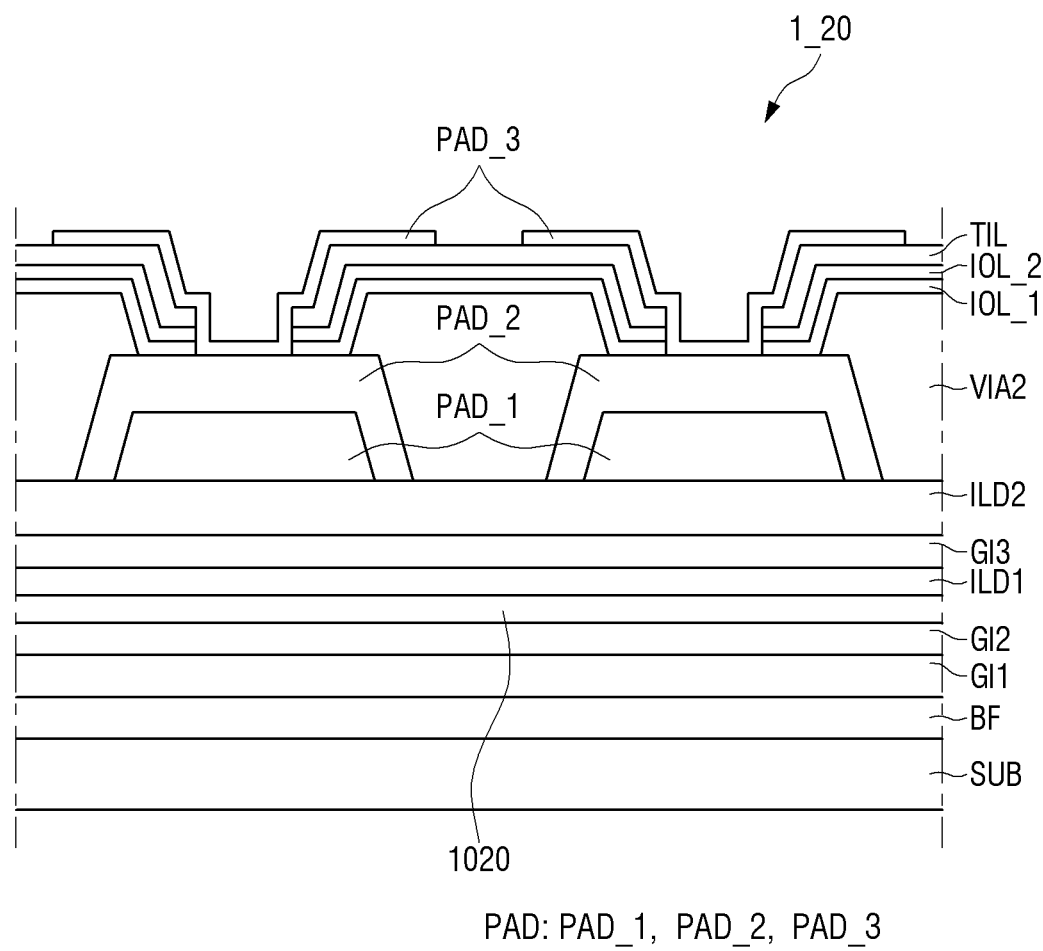
FIG. 32 is a structure diagram showing a structure in a sub-area of a display device according to still yet another embodiment.
Figure 32:
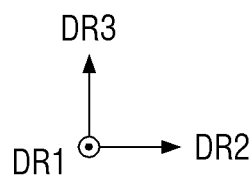

FIG. 32 is a structure diagram showing a structure in a sub-area of a display device according to still yet another embodiment.

Referring to FIG. 32, the display device 1_20 according to this embodiment is different from that of the display device 1_18 according to the embodiment of FIG. 30 in that a light-blocking layer 1020 may be integrally formed into a single body and thus may overlap (e.g., overlap in the third direction DR3) the plurality of pads PAD (e.g., an entirety of all of the plurality of pads PAD) arranged in the sub-area SR.

As shown in FIG. 32, light-blocking layer 1020 may continuously extend in the second direction DR2 and may be disposed between the first gate insulating layer GI1 and the first insulating layer ILD1. In other embodiments, the light-blocking layer 1020 may continuously extend in the second direction DR2 and may be disposed between the first gate insulating layer GI1 and the second gate insulating layer GI2. The light-blocking layer 1020 may have a rectangular planar shape when viewed in the third direction DR3. However, the present disclosure is not limited thereto.

In some embodiments, a width in the first direction DR1 of the light-blocking layer 1020 is equal to at least ½ of a width in the first direction DR1 of the pad PAD, that is, the light-blocking layer 1020 extends from one side end (e.g., one side or end) in the first direction DR1 of the pad PAD toward the opposite side in the first direction DR1 thereof by at least ½ of the width in the first direction DR1 of the pad PAD, and overlaps the pad PAD in the third direction DR3 by at least ½ of the width in the first direction DR1 of the pad PAD. In some embodiments, the light-blocking layer 1020 may cover or overlap at least ½ of the planar area of the pad PAD in the third direction DR3.

Figure 33:
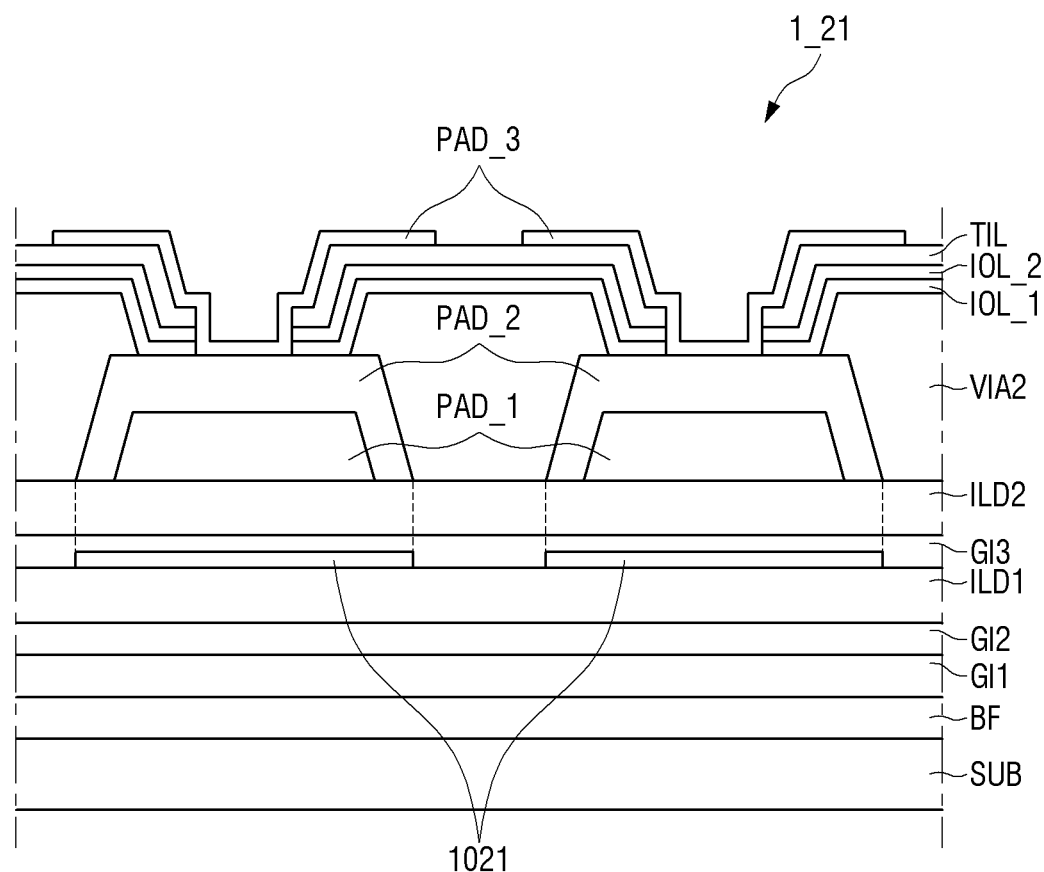
FIG. 33 is a structure diagram showing a structure in a sub-area of a display device according to still yet another embodiment.
Figure 33:
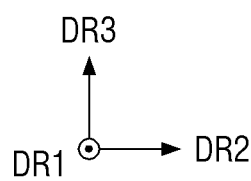

FIG. 33 is a structure diagram showing a structure in a sub-area of a display device according to still yet another embodiment.

Referring to FIG. 33, a display device 1_21 according to this embodiment is different from the display device 1_12 according to the embodiment in FIG. 22 in that a light-blocking layer 1021 is received in the second semiconductor pattern ACTP2. Specifically, the light-blocking layer 1021 may include the same material as that of the second semiconductor layer ACT2 of the display area DA, and may be formed concurrently (e.g., simultaneously) therewith.

The light-blocking layer 1021 according to this embodiment may be disposed between the first insulating layer ILD1 and the third gate insulating layer GI3. The light-blocking layer 1021 may be made of oxide. The oxide may include one or more oxides selected from G-I-Z-O, zinc (Zn), indium (In), gallium (Ga), tin (Sn), cadmium (Cd), germanium (Ge), hafnium (Hf), or a combination thereof. The oxide may include at least one of indium-gallium-zinc oxide (IGZO), zinc-tin oxide (ZTO), indium-tin oxide (IZO), and the like. Accordingly, the laser used in the process of cutting one side end (e.g., one side or end) of the sub-area SR may be absorbed by the light-blocking layer 1021 and thus may not reach the pad PAD, such that the lift-off phenomenon of the insulating layer may be prevented or reduced.

In some embodiments, a width in the first direction DR1 of the light-blocking layer 1021 is equal to at least ½ of a width in the first direction DR1 of the pad PAD, that is, the light-blocking layer 1021 extends from one side end (e.g., one side or end) in the first direction DR1 of the pad PAD toward the opposite side in the first direction DR1 thereof by at least ½ of the width in the first direction DR1 of the pad PAD, and overlaps the pad PAD in the third direction DR3 by at least ½ of the width in the first direction DR1 of the pad PAD. In some embodiments, the light-blocking layer 1021 may cover or overlap at least ½ of the planar area of the pad PAD in the third direction DR3.

Figure 34:
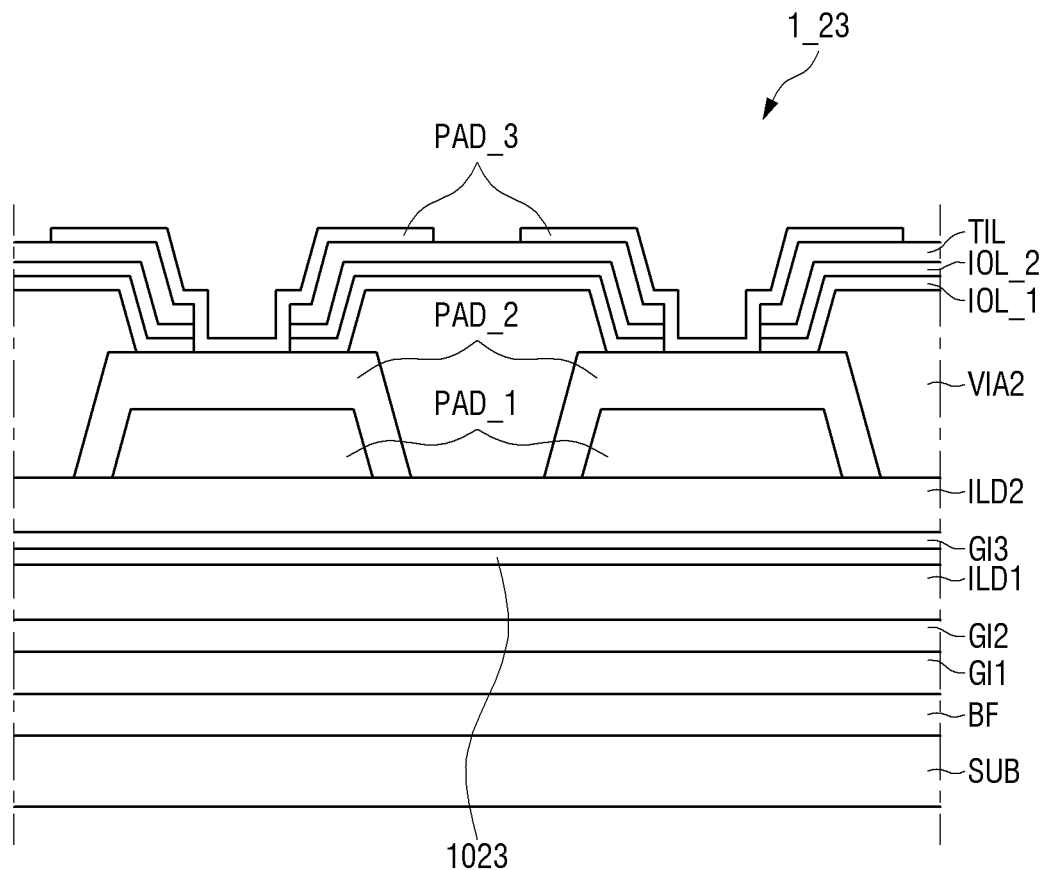
FIG. 34 is a structure diagram showing a structure in a sub-area of a display device according to still yet another embodiment.
Figure 34:
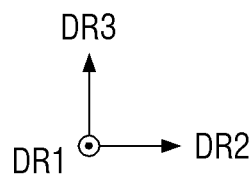

FIG. 34 is a structure diagram showing a structure in a sub-area of a display device according to still yet another embodiment.

Referring to FIG. 34, a display device 1_22 according to this embodiment is different from the display device 1_21 according to the embodiment in FIG. 33 in that a width in the first direction DR1 and a width in the second direction DR2 of a light-blocking layer 1022 may be respectively larger than the width in the first direction DR1 and the width in the second direction DR2 of the pad PAD. Specifically, the width in the first direction DR1 and the width in the second direction DR2 of the light-blocking layer 1022 may be respectively greater than the width in the first direction DR1 and the width in the second direction DR2 by which each of the first pad layer PAD_1 and the second pad layer PAD_2 contacts the second insulating layer ILD2. As shown in FIG. 34, The light-blocking layer 1022 may be disposed between the buffer layer BF and the third gate insulating layer GI3 and may be spaced apart from each other in the second direction DR2. In other embodiments, the light-blocking layer 1022 may be disposed between the buffer layer BF and the first gate insulating layer GI1 and may be spaced from each other in the second direction DR2.

In some embodiments, a width in the first direction DR1 of the light-blocking layer 1022 is equal to at least ½ of a width in the first direction DR1 of the pad PAD, that is, the light-blocking layer 1022 extends from one side end (e.g., one side or end) in the first direction DR1 of the pad PAD toward the opposite side in the first direction DR1 thereof by at least ½ of the width in the first direction DR1 of the pad PAD, and overlaps the pad PAD in the third direction DR3 by at least ½ of the width in the first direction DR1 of the pad PAD. In some embodiments, the light-blocking layer 1022 may cover or overlap at least ½ of the planar area of the pad PAD in the third direction DR3.

Figure 35:
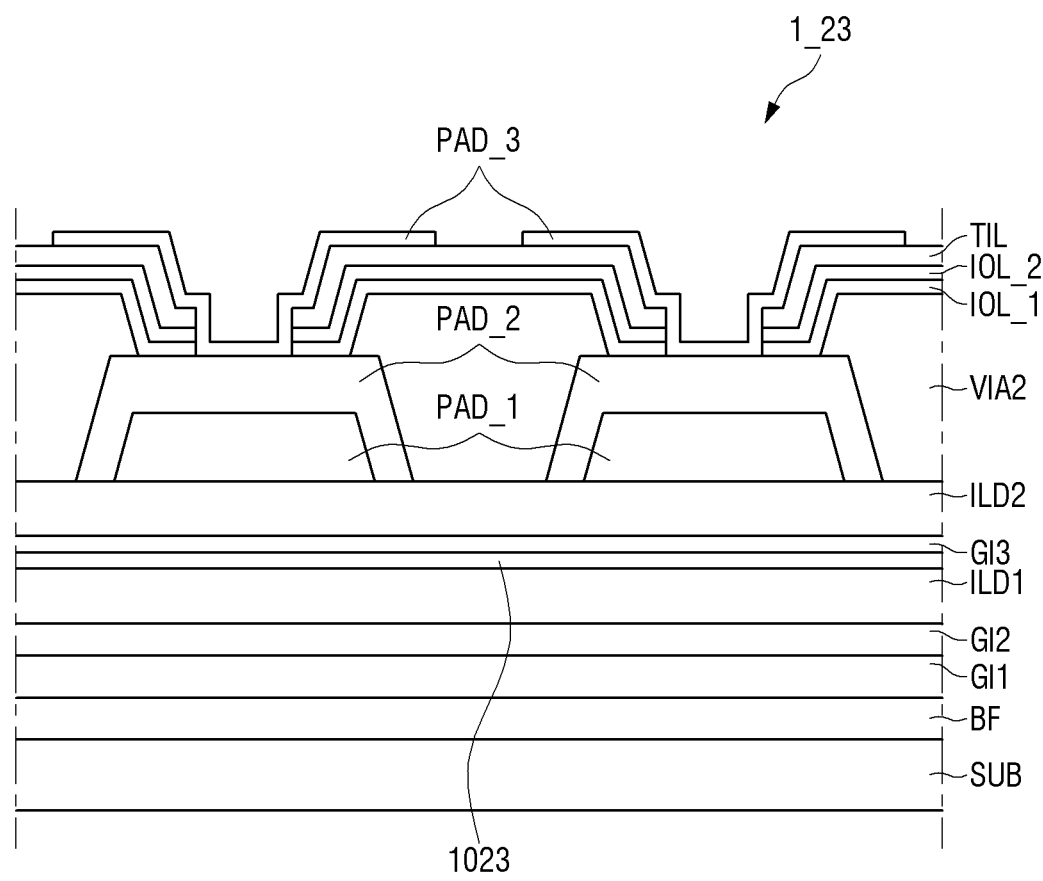
FIG. 35 is a structure diagram showing a structure in a sub-area of a display device according to still yet another embodiment.
Figure 35:
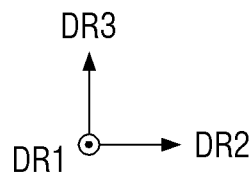

FIG. 35 is a structure diagram showing a structure in a sub-area of a display device according to still yet another embodiment.

Referring to FIG. 35, a display device 1_23 according to this embodiment is different from the display device 1_21 according to the embodiment in FIG. 33 in that a light-blocking layer 1023 may be integrally formed into a single body and thus may overlap (e.g., overlap in the third direction DR3) the plurality of pads PAD (e.g., an entirety of all of the plurality of pads PAD) arranged in the sub-area SR. As shown in FIG. 35, the light-blocking layer 1023 may continuously extend in the second direction DR2 and may be disposed between the first gate insulating layer GI1 and the third gate insulating layer GI3. In other embodiments, the light-blocking layer 1023 may continuously extend in the second direction DR2 and may be disposed between the first gate insulating layer GI1 and the second gate insulating layer GI2, and may have a rectangular planar shape when viewed in the third direction DR3. However, the present disclosure is not limited thereto.

In some embodiments, a width in the first direction DR1 of the light-blocking layer 1023 is equal to at least ½ of a width in the first direction DR1 of the pad PAD, that is, the light-blocking layer 1023 extends from one side end (e.g., one side or end) in the first direction DR1 of the pad PAD toward the opposite side in the first direction DR1 thereof by at least ½ of the width in the first direction DR1 of the pad PAD, and overlaps the pad PAD in the third direction DR3 by at least ½ of the width in the first direction DR1 of the pad PAD. In some embodiments, the light-blocking layer 1023 may cover or overlap at least ½ of the planar area of the pad PAD in the third direction DR3.

Figure 36:
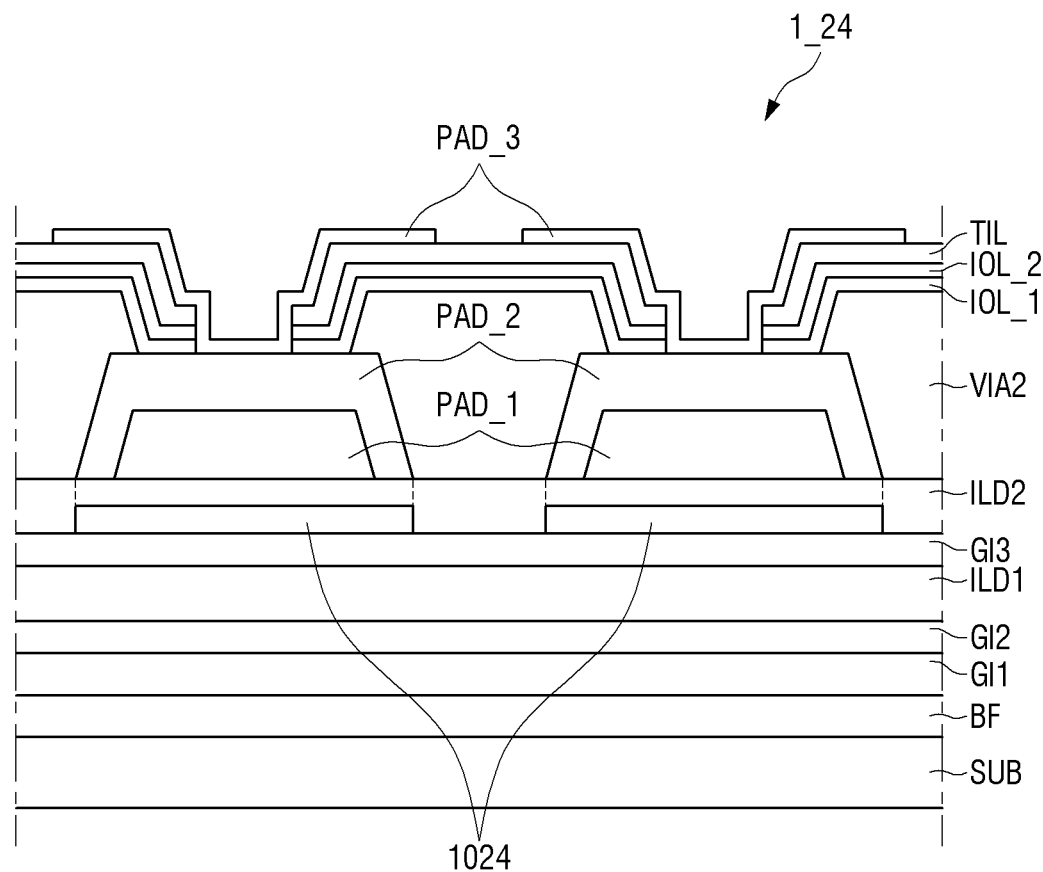
FIG. 36 is a structure diagram showing a structure in a display area of a display device according to still yet another embodiment.

FIG. 36 is a structure diagram showing a structure in a sub-area of a display device according to still yet another embodiment.

Referring to FIG. 36, a display device 1_24 according to this embodiment is different from the display device 1_12 according to the embodiment in FIG. 22 in that a light-blocking layer 1024 is received in the third gate pattern GAT3. Specifically, the light-blocking layer 1024 may include the same material as that of the first upper gate electrode UG1 of the display area DA, and may be formed concurrently (e.g., simultaneously) therewith.

The light-blocking layer 1024 according to this embodiment may be disposed between the third gate insulating layer GI3 and the second insulating layer ILD2. The light-blocking layer 1024 may include metal. For example, the light-blocking layer 1024 may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). Accordingly, the laser used in the process of cutting one side end (e.g., one side or end) of the sub-area SR may be reflected from the light-blocking layer 1024 and thus may not reach the pad PAD, such that the lift-off phenomenon of the insulating layer may be prevented or reduced.

In some embodiments, a width in the first direction DR1 of the light-blocking layer 1024 is equal to at least ½ of a width in the first direction DR1 of the pad PAD, that is, the light-blocking layer 1024 extends from one side end (e.g., one side or end) in the first direction DR1 of the pad PAD toward the opposite side in the first direction DR1 thereof by at least ½ of the width in the first direction DR1 of the pad PAD, and overlaps the pad PAD in the third direction DR3 by at least ½ of the width in the first direction DR1 of the pad PAD. In some embodiments, the light-blocking layer 1024 may cover or overlap at least ½ of the planar area of the pad PAD in the third direction DR3.

Figure 37:
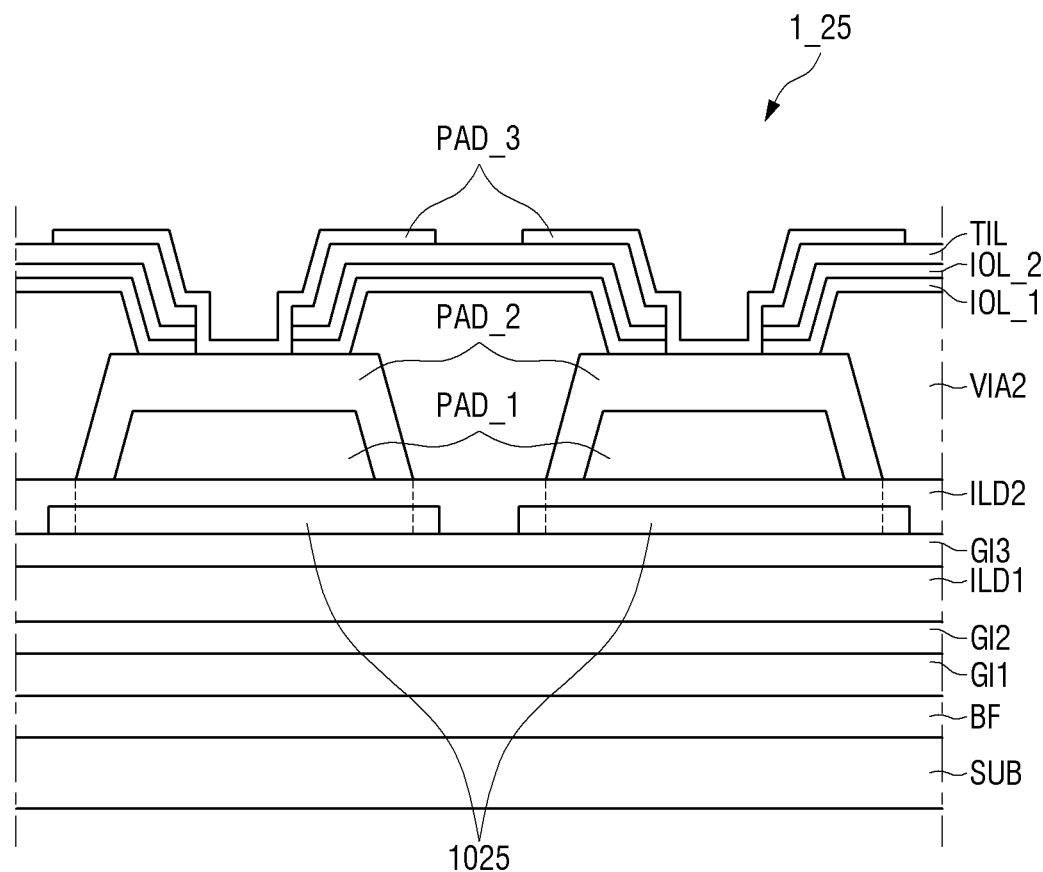
FIG. 37 is a structure diagram showing a structure in a sub-area of a display device according to still yet another embodiment.
Figure 37:
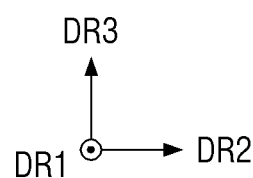

FIG. 37 is a structure diagram showing a structure in a sub-area of a display device according to still yet another embodiment.

Referring to FIG. 37, a display device 1_25 according to this embodiment is different from the display device 1_24 according to the embodiment in FIG. 36 in that a width in the first direction DR1 and a width in the second direction DR2 of the light-blocking layer 1025 may be respectively larger than the width in the first direction DR1 and the width in the second direction DR2 of the pad PAD. Specifically, the width in the first direction DR1 and the width in the second direction DR2 of the light-blocking layer 1025 may be respectively larger than the width in the first direction DR1 and the width in the second direction DR2 by which each of the first pad layer PAD_1 and the second pad layer PAD_2 contacts the second insulating layer ILD2. As shown in FIG. 37, the light-blocking layer 1025 may be disposed between the buffer layer BF and the second insulating layer ILD2 and may be spaced apart from each other in the second direction DR2. In other embodiments, the light-blocking layer 1025 may be disposed between the buffer layer BF and the first gate insulating layer GI1 and may be spaced from each other in the second direction DR2.

FIG. 38 is a structure diagram showing a structure in a sub-area of a display device according to still yet another embodiment.

Referring to FIG. 38, a display device 1_26 according to this embodiment is different from the display device 1_24 according to the embodiment in FIG. 36 in that a light-blocking layer 1026 may be integrally formed into a single body and thus may overlap (e.g., overlap in the third direction DR3) the plurality of pads PAD (e.g., an entirety of all of the plurality of pads PAD) arranged in the sub-area SR. As shown in FIG. 38, the light-blocking layer 1026 may continuously extend in the second direction DR2 and may be disposed between the first gate insulating layer GI1 and the second insulating layer ILD2, and may have a rectangular planar shape when viewed in the third direction DR3. In other embodiments, the light-blocking layer 1026 may continuously extend in the second direction DR2 and may be disposed between the first gate insulating layer GI1 and the second gate insulating layer GI2, and may have a rectangular planar shape when viewed in the third direction DR3. However, the present disclosure is not limited thereto.

In some embodiments, a width in the first direction DR1 of the light-blocking layer 1026 is equal to at least ½ of a width in the first direction DR1 of the pad PAD, that is, the light-blocking layer 1026 extends from one side end (e.g., one side or end) in the first direction DR1 of the pad PAD toward the opposite side in the first direction DR1 thereof by at least ½ of the width in the first direction DR1 of the pad PAD, and overlaps the pad PAD in the third direction DR3 by at least ½ of the width in the first direction DR1 of the pad PAD. In some embodiments, the light-blocking layer 1026 may cover or overlap at least ½ of the planar area of the pad PAD in the third direction DR3.

In some embodiments, the light-blocking layers 1012 to 1026 according to the above-described embodiments may overlap each other and may be disposed in the sub-area SR. For example, the light-blocking layer 1012 according to an embodiment of FIG. 22 and the light-blocking layer 1015 according to an embodiment of FIG. 27 may overlap each other. Alternatively, the light-blocking layer 1012 according to the embodiment in FIG. 22, the light-blocking layer 1015 according to the embodiment in FIG. 27, the light-blocking layer 1018 according to the embodiment in FIG. 30, the light-blocking layer 1021 according to the embodiment in FIG. 33, and the light-blocking layer 1024 according to the embodiment of FIG. 36 may overlap each other. However, the present disclosure is not limited thereto.

In concluding the detailed description, those skilled in the art will appreciate that many variations and modifications can be made to the embodiments without substantially departing from the spirit and scope of the present disclosure as set forth in the following claims, and their equivalents. Therefore, the disclosed embodiments of the present disclosure are used in a generic and descriptive sense only and not for purposes of limitation.

What is claimed is:

1. A display device comprising:
    a substrate including a main area and a sub-area at a side of the main area;
    a thin-film transistor on the substrate and positioned in the main area;
    a first insulating layer on a gate electrode of the thin-film transistor;
    a light-emitting element on the first insulating layer, positioned in the main area, and electrically connected to the thin-film transistor;
    a plurality of pads on the first insulating layer and positioned in the sub-area, the plurality of pads comprising a first pad and second pad spaced apart from each other along an extension direction of the substrate; and
    a light-blocking layer overlapping the plurality of pads and located between the substrate and the first insulating layer, the light-blocking layer comprising a first light-blocking layer and a second light-blocking layer spaced from each other along the extension direction.

2. The display device of claim 1, further comprising a buffer layer between the substrate and the first insulating layer, wherein the thin-film transistor comprises a first semiconductor layer overlapping the gate electrode and located between the substrate and the gate electrode, wherein the first semiconductor layer and the light-blocking layer are between the buffer layer and the first insulating layer, wherein the first semiconductor layer is directly on a face of the buffer layer in the main area, and wherein the light-blocking layer is directly on the face of the buffer layer in the sub-area.

3. The display device of claim 2, wherein each of the first semiconductor layer and the light-blocking layer is made of polysilicon.

4. The display device of claim 1, further comprising a first gate insulating layer between the substrate and the first insulating layer, wherein a first semiconductor layer of the thin-film transistor is between the substrate and the first gate insulating layer in the main area, wherein the gate electrode of the thin-film transistor is directly on a face of the first gate insulating layer in the main area, and wherein the light-blocking layer is directly on the face of the first gate insulating layer in the sub-area.

5. The display device of claim 4, wherein the gate electrode and the light-blocking layer are made of a same material.

6. The display device of claim 1, wherein each of the plurality of pads comprises:

a first pad layer directly on a face of the first insulating layer; and a second pad layer on the first pad layer, the second pad layer being electrically connected to the first pad layer.

7. The display device of claim 6, further comprising a touch layer on the light-emitting element in the main area, wherein each of the plurality of pads further comprises a third pad layer on the second pad layer in the sub-area, wherein the touch layer comprises a first touch conductive layer, a touch insulating layer on the first touch conductive layer, and a second touch conductive layer on the touch insulating layer, wherein the third pad layer is electrically connected to the second pad layer, and wherein the second touch conductive layer and the third pad layer are made of a same material.

8. A display device comprising:

a substrate including a main area and a sub-area at a side of the main area;

a thin-film transistor on the substrate and positioned in the main area;

a first insulating layer on a gate electrode of the thin-film transistor;

a light-emitting element on the first insulating layer, positioned in the main area, and electrically connected to the thin-film transistor;

a plurality of pads on the first insulating layer and positioned in the sub-area; and a light-blocking layer overlapping the plurality of pads and located between the substrate and the first insulating layer;

a first gate insulating layer between the substrate and the first insulating layer;

a second gate insulating layer between the first gate insulating layer and the first insulating layer; and a capacitor electrode between the second gate insulating layer and the first insulating layer, wherein a first semiconductor layer of the thin-film transistor is between the substrate and the first gate insulating layer in the main area, the gate electrode of the thin-film transistor is between the first gate insulating layer and the second gate insulating layer in the main area, and the capacitor electrode is directly on a face of the second gate insulating layer in the main area, and wherein the light-blocking layer is directly on the face of the second gate insulating layer in the sub-area.

9. The display device of claim 8, wherein the capacitor electrode and the light-blocking layer are made of a same material.

10. A display device comprising:

a substrate including a main area and a sub-area at a side in a first direction of the main area;

a pad on the substrate, positioned at an end in the first direction of the sub-area, and having a first width in the first direction and a second width in a second direction intersecting the first direction in a plan view; and a light-blocking layer overlapping the pad and located between the substrate and the pad, wherein the first width of the pad is greater than the second width of the pad, wherein the pad comprises at least two pads spaced from each other along the second direction, wherein the light-blocking layer comprises at least two light-blocking layers spaced from each other along the second direction.

11. The display device of claim 10, wherein at least a portion of an edge of the pad is aligned with a portion of an edge of the light-blocking layer.

12. The display device of claim 11, wherein the pad entirely overlaps the light-blocking layer in a plan view.

13. The display device of claim 12, wherein the light-blocking layer has a first width and a second width in a plan view.

14. The display device of claim 10, wherein the pad comprises a first portion overlapping the light-blocking layer and a second portion not overlapping the light-blocking layer in a plan view, and wherein the first portion of the pad is between the second portion of the pad and an edge of the substrate, the first portion extending along the first direction.

15. The display device of claim 14, wherein the light-blocking layer has a third width in the first direction in a plan view, and wherein the third width is smaller than the first width of the pad.

16. The display device of claim 10, wherein the pad comprises a plurality of pads, the plurality of pads being spaced from each other along the second direction, and wherein the light-blocking layer overlaps the plurality of pads and a portion of the display device between adjacent ones of the plurality of pads.

17. The display device of claim 16, wherein the light-blocking layer extends along the second direction.

18. The display device of claim 10, wherein each of the at least two pads entirely overlaps a corresponding one of the at least two light-blocking layers.

19. The display device of claim 18, wherein the light-blocking layer has a third width in the first direction and a fourth width in the second direction in a plan view, wherein the third width is greater than the first width of the pad, and wherein the fourth width is greater than the second width of the pad.

20. The display device of claim 10, further comprising a semiconductor layer on the substrate and in the main area;
- a first gate conductive layer on the semiconductor layer; and
- a second gate conductive layer on the first gate conductive layer,
- wherein a material of the light-blocking layer is same as a material of one of the semiconductor layer, the first gate conductive layer, and the second gate conductive layer.

* * * * *